United States Patent
Fukumoto

(10) Patent No.: US 8,513,748 B2
(45) Date of Patent: *Aug. 20, 2013

(54) MAGNETORESISTIVE DEVICE AND MAGNETIC MEMORY USING THE SAME

(75) Inventor: Yoshiyuki Fukumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 697 days.

This patent is subject to a terminal disclaimer.

(21) Appl. No.: 12/453,209

(22) Filed: May 1, 2009

(65) Prior Publication Data
US 2009/0219754 A1 Sep. 3, 2009

Related U.S. Application Data

(63) Continuation of application No. 11/436,095, filed on May 18, 2006, now Pat. No. 7,538,402.

(30) Foreign Application Priority Data

May 19, 2005 (JP) .................................. 2005/147317
Dec. 16, 2005 (JP) .................................. 2005-362793

(51) Int. Cl.
*H01L 29/82* (2006.01)
(52) U.S. Cl.
USPC ............ 257/421; 257/E29.323; 257/E43.004; 365/158
(58) Field of Classification Search
USPC .......... 257/421, E29.323, E43.004; 365/158, 365/171
See application file for complete search history.

(56) References Cited

U.S. PATENT DOCUMENTS

| | | | |
|---|---|---|---|
| 5,959,880 A * | 9/1999 | Shi et al. ...................... | 365/158 |
| 6,233,172 B1 | 5/2001 | Chen et al. | |
| 6,307,708 B1 | 10/2001 | Yoda et al. | |
| 6,466,417 B1 | 10/2002 | Gill | |
| 6,545,906 B1 | 4/2003 | Savtchenko et al. | |
| 6,703,654 B1 | 3/2004 | Horng et al. | |
| 6,714,446 B1 | 3/2004 | Engel | |
| 6,905,780 B2 | 6/2005 | Yuasa et al. | |
| 7,071,522 B2 | 7/2006 | Yuasa et al. | |
| 7,079,361 B2 | 7/2006 | Sugita et al. | |
| 7,163,755 B2 | 1/2007 | Hiramoto et al. | |
| 7,280,389 B2 | 10/2007 | Guo | |

(Continued)

FOREIGN PATENT DOCUMENTS

| CN | 1503912 A | 6/2004 |
|---|---|---|
| CN | 1603912 A | 6/2004 |

(Continued)

OTHER PUBLICATIONS

Y. K. Zheng et al., Spin Flop Switching of the Guided Synthetic Antiferromagnet MRAM, IEEE Transactions on Magnetics, Oct. 2006, pp. 2742-2744, vol. 42, No. 10.

(Continued)

*Primary Examiner* — Allison P Bernstein
(74) *Attorney, Agent, or Firm* — Foley & Lardner LLP

(57) ABSTRACT

A magnetic film stack is composed of a synthetic antiferromagnet including a plurality of ferromagnetic layers, adjacent two of which are antiferromagnetically coupled through a non-magnetic layer; and a reversal inducing layer exhibiting ferromagnetism. The reversal inducing layer is ferromagnetically coupled to the synthetic antiferromagnet, and designed to have a coercive field smaller than a magnetic field at which antiferromagnetic coupling within the synthetic antiferromagnet starts to be decoupled.

32 Claims, 36 Drawing Sheets

(56) References Cited

U.S. PATENT DOCUMENTS

| | | |
|---|---|---|
| 7,298,643 B2 | 11/2007 | Kim et al. |
| 7,379,280 B2 | 5/2008 | Fukumoto et al. |
| 7,466,526 B2 | 12/2008 | Sato et al. |
| 7,468,542 B2 | 12/2008 | Hayakawa et al. |
| 7,684,161 B2 | 3/2010 | Pietambaram et al. |
| 7,884,403 B2 | 2/2011 | Yuasa |
| 2002/0008948 A1 | 1/2002 | Sasaki et al. |
| 2002/0009616 A1 | 1/2002 | Kamiguchi et al. |
| 2002/0048128 A1* | 4/2002 | Kamiguchi et al. ....... 360/324.1 |
| 2002/0051380 A1 | 5/2002 | Kamiguchi et al. |
| 2002/0085323 A1 | 7/2002 | Smith et al. |
| 2002/0105823 A1 | 8/2002 | Redon et al. |
| 2003/0048658 A1 | 3/2003 | Chen |
| 2003/0123197 A1 | 7/2003 | Mizuguchi et al. |
| 2003/0184921 A1 | 10/2003 | Sugita et al. |
| 2004/0145850 A1* | 7/2004 | Fukumoto et al. ............ 361/143 |
| 2004/0170055 A1 | 9/2004 | Albert et al. |
| 2006/0034118 A1 | 2/2006 | Saito et al. |
| 2006/0038213 A1* | 2/2006 | Mori et al. .................... 257/295 |
| 2006/0110625 A1 | 5/2006 | Nakabayashi et al. |
| 2006/0180839 A1 | 8/2006 | Fukumoto et al. |
| 2006/0187705 A1 | 8/2006 | Nakamura et al. |
| 2008/0055792 A1 | 3/2008 | Zheng et al. |
| 2009/0096045 A1 | 4/2009 | Hayakawa et al. |
| 2010/0181632 A1 | 7/2010 | Yuasa |
| 2011/0031570 A1 | 2/2011 | Yuasa |

FOREIGN PATENT DOCUMENTS

| | | |
|---|---|---|
| JP | 2002-32903 A | 11/2002 |
| JP | 2003-283001 A | 10/2003 |
| JP | 2004-087870 A | 3/2004 |
| JP | 2004-179187 A | 6/2004 |
| JP | 2004-200245 A | 7/2004 |
| JP | 2004-253807 A | 9/2004 |
| JP | 2005-86015 A | 3/2005 |
| JP | 2005-294376 A | 10/2005 |
| JP | 2006-5278 A | 1/2006 |
| JP | 2006-40960 A | 2/2006 |
| JP | 2006-319259 A | 11/2006 |
| JP | 2007-59879 A | 3/2007 |
| WO | WO 02/088765 A1 | 11/2002 |
| WO | WO 2005/088745 A1 | 9/2005 |

OTHER PUBLICATIONS

Y. Fukumoto et al., Significant Reduction in Writing Field of Toggle MRAMs Using Novel Free Layer Structures, Journal of Magnetism and Magnetic Materials, 2007, pp. 2674-2676, 310.

Yoshiyuki Fukumoto, USPTO Office Action, U.S. Appl. No. 11/354,144, Jul. 17, 2009, 33 pages.

Yoshiyuki Fukumoto, USPTO Office Action, U.S. Appl. No. 11/354,144, Mar. 12, 2010, 18 pages.

Yoshiyuki Fukumoto, USPTO Office Action, U.S. Appl. No. 12/834,646, Aug. 22, 2011, 14 pages.

USPTO Office Action, U.S. Appl. No. 12/834,646, May 20, 2013, 15 pages.

* cited by examiner

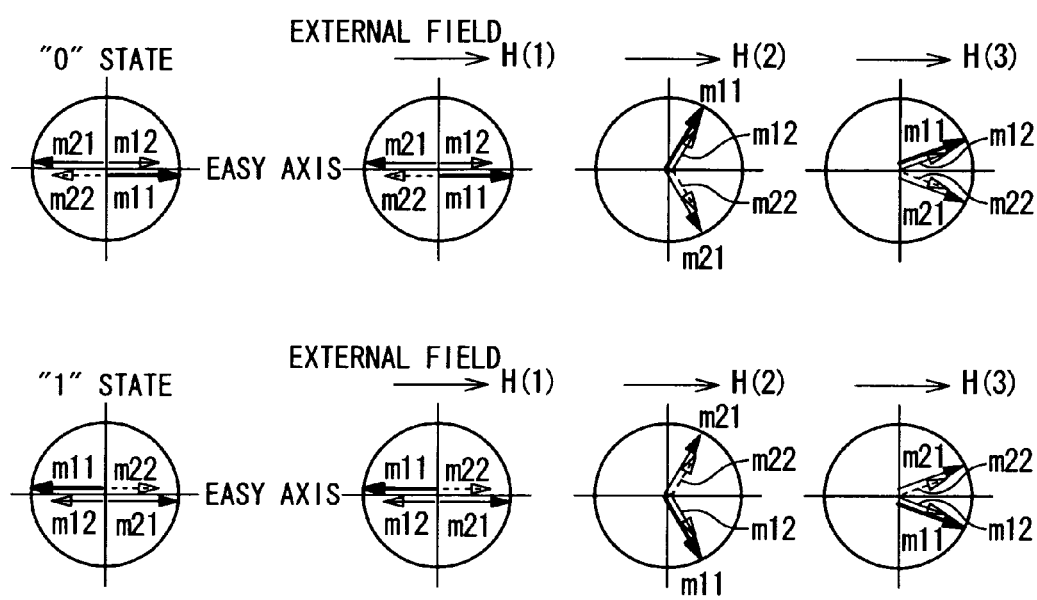

$(Ni_{81}Fe_{19})_{1-x}Ta_x$ (4nm)

$(Ni_{81}Fe_{19})_{1-x}Zr_x$ (4nm)

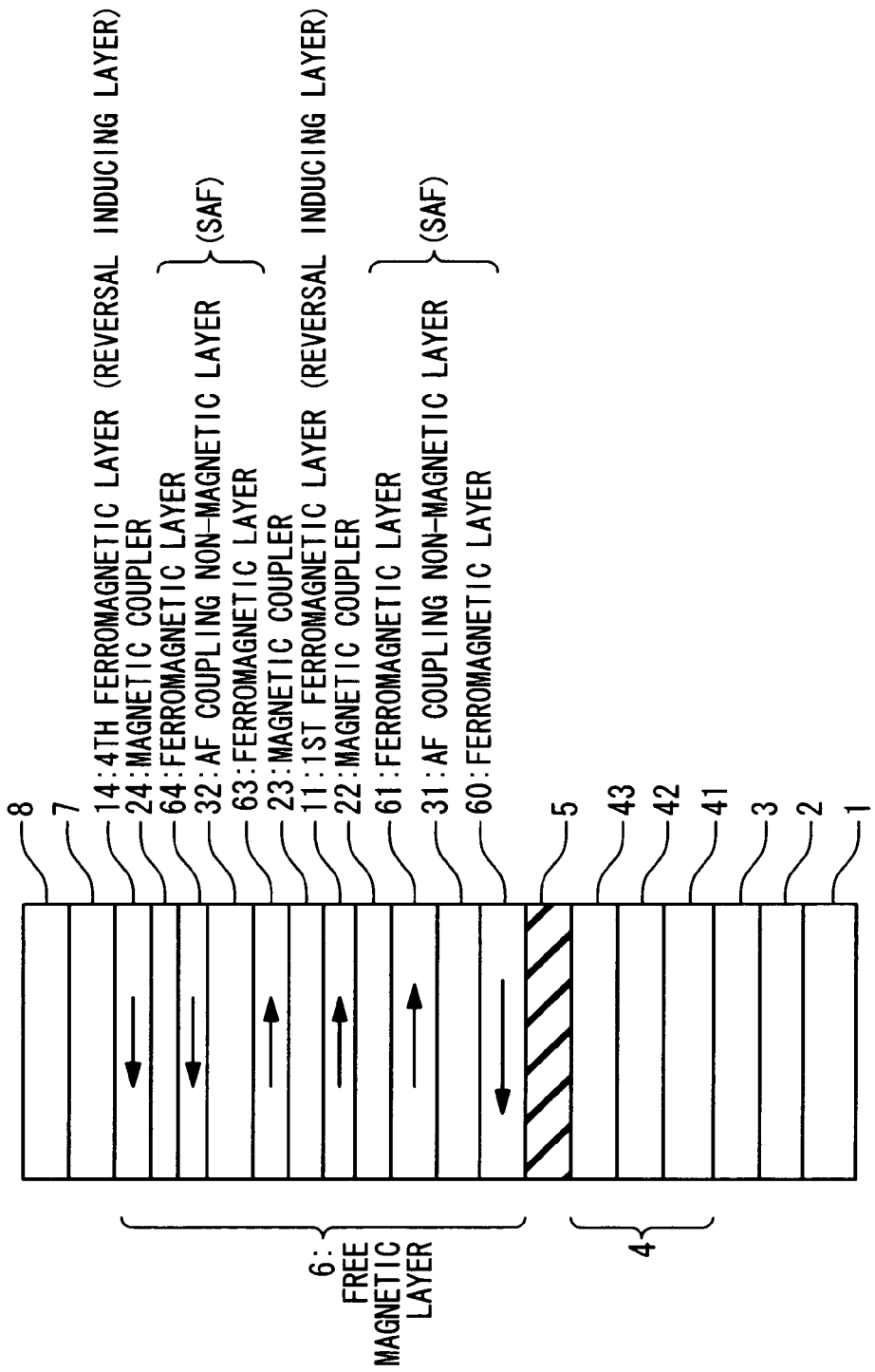

Fig. 25A

| SAMPLE | MAGNETIZATION REVERSAL CHARACTERISTICS | | | |
|---|---|---|---|---|
| | Hk (Oe) | Hs (Oe) | Hflop' (Oe) | Hflop (Oe) |
| SAMPLE 1 | 3.2 | 203 | 25.5 | 23 |
| SAMPLE 2 | 3.3 | 405 | 36.6 | 19 |
| SAMPLE 3 | 3.3 | 424 | 37.4 | 11 |
| SAMPLE 4 | 3.4 | 424 | 38.0 | 9 |
| SAMPLE 5 | 3.6 | 430 | 39.3 | 8 |
| SAMPLE 6 | 3.3 | 260 | 29.3 | 25 |
| SAMPLE 7 | 3.1 | 187 | 24.1 | 19 |
| SAMPLE 8 | 3.0 | 480 | 37.9 | 9 |
| SAMPLE 9 | 20.0 | 140 | 52.9 | 56 |
| SAMPLE 10 | 3.3 | 480 | 39.8 | 16 |
| SAMPLE 11 | 3.0 | 265 | 28.2 | 15 |
| SAMPLE 12 | 9.5 | 176 | 40.9 | 38 |
| SAMPLE 13 | 7.0 | 144 | 31.7 | 29 |
| SAMPLE 14 | 9.0 | 138 | 35.2 | 22 |
| SAMPLE 15 | 9.0 | 143 | 35.9 | 18 |

Fig. 25B

| SAMPLE | WRITE OPERATION CHARACTERISTICS | | | |
|---|---|---|---|---|
| | YIELD (%) | FLOP FIELD (Oe) | SATURATION FIELD (Oe) | Hs/Hflop |
| SAMPLE 1 | 100 | 45.8 | 103.0 | 2.2 |
| SAMPLE 2 | 100 | 48.9 | 173.0 | 3.5 |
| SAMPLE 3 | 76 | 43.2 | 192.8 | 4.5 |
| SAMPLE 4 | 0 | | | |
| SAMPLE 5 | 0 | | | |
| SAMPLE 7 | 100 | 53.8 | 141.0 | 2.6 |
| SAMPLE 8 | 0 | | | |
| SAMPLE 12 | 100 | 57.4 | 157.0 | 2.7 |
| SAMPLE 14 | 100 | 50.5 | 177.0 | 3.5 |
| SAMPLE 15 | 73 | 82.5 | 164.0 | 2.0 |

Fig. 26B

| SAMPLE | MAGNETIZATION REVERSAL CHARACTERISTICS OF FREE MAGNETIC LAYER | | |
|---|---|---|---|
| | Hs (Oe) | Hflop (Oe) | Hs/Hflop |
| SAMPLE16 | 87 | 21.5 | 4.0 |
| SAMPLE17 | 18 | 9.7 | 1.9 |
| SAMPLE18 | 30 | 9.8 | 3.1 |
| SAMPLE19 | 40 | 10.5 | 3.8 |
| SAMPLE20 | 60 | 8.6 | 7.0 |
| SAMPLE21 | 68 | 7.0 | 9.7 |

MAGNETORESISTIVE DEVICE AND MAGNETIC MEMORY USING THE SAME

CROSS-REFERENCE TO RELATED PATENT APPLICATIONS

This application is a continuation of application Ser. No. 11/436,095, filed May 18, 2006, now pending, and based on Japanese Patent Application No. 2005-147317, filed May 19, 2005, and Japanese Patent Application No. 2005-362793, filed Dec. 16, 2005, by Yoshiyuki Fukumoto, which is incorporated herein by reference in its entirety. This application claims only subject matter disclosed in the parent application and therefore presents no new matter.

BACKGROUND OF THE INVENTION

1. Field of the Invention

The present invention relates to a magnetoresistance device and a magnetic memory using the same. Particularly, the present invention relates to a magnetoresistance device provided with a free magnetic layer incorporating a plurality of ferromagnetic layers, adjacent two of which are antiparallelly coupled.

2. Description of the Related Art

In recent yeas, research and develop activity in the field of the MRAM (Magnetic Random Access Memory) has been enhanced, due to the fast write and read access. FIG. 1A illustrates an exemplary structure of a typical MRAM. The MRAM shown in FIG. 1 is composed of a substrate 1, word lines 102 and bit lines 103 (each one shown), and magnetoresistive elements (one shown) each including an antiferromagnetic layer 3, a fixed magnetic layer 4, a non-magnetic layer 5, a free magnetic layer 5. The magnetoresistive elements are arranged at respective intersections of the word lines 102 and the bit lines. The fixed magnetic layer 4 has a fixed magnetization, and the free magnetic layer 6 has a reversible magnetization. The write operation is typically achieved by generating current-induced magnetic field through feeding write currents on the selected word and bit lines 102 and 103, and thereby reversing the magnetization of the free magnetic layer 6 within the selected magnetoresistive element. Alternatively, the write operation may be achieved by directly injecting a spin-polarized current into the free magnetic layer 6 within the selected magnetoresistive element. The read operation is achieved by detecting the resistance change in the magnetoresistive elements caused by the magnetoresistance effect, such as TMR effect (tunneling magnetoresistance effect, and GMR effect (giant magnetoresistance effect).

The following is a description of the operation principle of the MRAM that achieves the write operation through generating a current-induced magnetic field. A rectangular magnetic layer with a magnetization of M, a thickness of t, and a uniaxial crystalline anisotropy energy of K exhibits a shape anisotropic magnetic field of cM×t/W and a crystalline anisotropy field $H_k$ of K/2M, where W is a length of the narrow sides of the rectangular magnetic layer, and c is a coefficient dependent on the shape and aspect ratio of the rectangular magnetic layer. In an assumption that the longitudinal direction of a magnetic layer is identical to the easy axis direction thereof, which is usually the case within a magnetoresistive element, the magnetic layer exhibits uniaxial magnetic anisotropy, and has a, net anisotropy field $H_{ka}$ expressed by the following formula (1):

$$H_{ka} = cM \times t/W + k/2M, \quad (1)$$
$$= cM \times t/W + H_k,$$
$$= Ka/2M,$$

where Ka is the net anisotropy energy.

As known in the art, the magnetization reversal in a magnetic layer having a uniaxial magnetic anisotropy ideally follows the Stoner-Wohlfarth model. In the Stoner-Wohlfarth approach, the magnetization is reversed at a threshold magnetic field, when the external magnetic field along the in-plane direction is increased. FIG. 3 is a diagram indicating a magnetic field region in which the magnetization reversal occurs when a magnetic field is applied to a magnetic layer; the X axis is defined along the easy axis of the magnetic layer and the Y axis is defined along the hard axis. The threshold magnetic field is represented by an asteroid curve in FIG. 3. When the external magnetic field falls in the region outside the asteroid curve, the magnetization of the magnetic layer is flipped in the direction along the easy axis.

A MRAM typically achieves selective data write operation into the selected memory cell (or selected magnetoresistive element) by using this phenomenon. FIG. 2 illustrates an exemplary layout of an MRAM such designed. MTJ (magnetic tunnel junction) elements 101 (one shown) are formed at respective intersections of word lines 102 and bit lines 103. The MTJ elements 101 are each formed on a lower electrode pattern 107 connected with a lower via contact 108 which provides an electric connection to the MTJ element 101. In this MRAM, a synthetic magnetic field generated by the selected bit and word lines is applied to the selected MTJ element 101, and the magnetization of the free magnetic layer within the selected MTJ element 101 is selectively reversed.

Another data writing technique is to directly inject a spin-polarized current into the free magnetic layer 6. The spin-polarized current exerts a torque on the magnetization of the free magnetic layer to achieve magnetization reversal. When a current is fed to the magnetoresistive element shown in FIG. 1A in the cross-plane direction, a spin-polarized current is generated through the non-magnetic layer 5, and a spin torque is transferred between the free magnetic layer 6 and the fixed magnetic layer 4 to achieve the magnetization reversal of the free magnetic layer 6. The direction of the magnetization is controllable by selecting the direction of the current. This may be referred to as the spin-polarized current switching. The MRAM using the spin-polarized current switching is superior in terms of the reduced write current and write data error.

A stack of multiple ferromagnetic layers separated by one or more non-magnetic layers in which adjacent two of the ferromagnetic layers are antiferromagnetically coupled is often used in a magnetoresistance device, such as memory cells in MRAMs and magnetic heads in magnetic disc drives. Such stack is often referred to as a synthetic antiferromagnet or simply "SAF". The SAF is useful for reducing and controlling the demagnetizing field generation accompanied by miniaturization in the magnetoresistive element. The SAF may be used for the fixed magnetic layer and/or the free magnetic layer within a magnetoresistive element. FIG. 1B illustrates a magnetoresistive element structure in which a SAF is used as the free magnetic layer 6. The free magnetic layer 6 is composed of two ferromagnetic layers 104 and 106 separated by a non-magnetic layer 105, and the magnetizations, denoted by numerals $m_1$ and $m_2$, of the ferromagnetic layers 104 and 106 are antiparallelly oriented, when no external field is applied to the free magnetic layer 6.

The magnetization reversal behavior of the free magnetic layer within the SAF is described in the following. For simplicity, the shape magnetic anisotropy is disregarded in the following explanation. The behavior of the SAF is different between the case when the SAF has an unignorable net magnetization and the case when the net magnetization of the SAF is ignorable.

Firstly, the behavior of the SAF is described for the case where the SAF has an unignorable net magnetization. Specifically, the following discussion is directed to the case when the SAF is composed of two ferromagnetic layers made of different materials and/or having different thicknesses, assuming that the two ferromagnetic layers have magnetizations of $M_1$ and $M_2$ and thicknesses of $t_1$ and $t_2$, respectively, and the following relation holds:

$$M_1 t_1 > M_2 t_2,$$

wherein the two ferromagnetic layers are antiferromagnetically coupled with an exchange coupling energy $J_{SAF}$. When a magnetic field applied in the direction of the easy axis is increased from the zero magnetic field, as shown in FIG. 4, the antiparallel coupling between the magnetizations $M_1$ and $M_2$ starts to be decoupled at a certain magnetic field $H_1$. When the magnetic field is further increased, the magnetizations $M_1$ and $M_2$ are oriented in parallel. The minimum magnetic field that orients the magnetizations $M_1$ and $M_2$ in parallel is referred to as the saturation magnetic field $H_S$. The above-mentioned magnetic field $H_1$ and the magnetic field $H_S$ are respectively represented by the following formulas (2), (3):

$$H_1 = J_{SAF}[1/((M_2 t_2) - 1/(M_1 t_1)], \qquad (2)$$

$$H_S = J_{SAF}[1/((M_2 t_2) + 1/(M_1 t_1)], \qquad (3)$$

The magnetic fields $H_1$ and $H_S$ depend on the exchange coupling energy, the saturation magnetizations and thicknesses of the two ferromagnetic layers within the SAF.

Next, a description is given of the case when the SAF only has an ignorable net magnetization. Specifically, the following discussion is directed to the case when the SAF is composed of two identically structured ferromagnetic layers coupled with the exchange coupling energy $J_{SAF}$. When the ferromagnetic layers have the same magnetization of M, and the same thickness of t (that is, when $M_1=M_2=M$ and $t_1=t_2=t$) and have the same crystalline anisotropy energy of K, and the crystalline anisotropy magnetic field $H_k$ of the ferromagnetic layers is expressed by K/2M. In this case, the SAF exhibits a magnetization curve shown in FIG. 5, when an external magnetic field is applied in the easy axis direction. Although exhibiting the zero net magnetization with the zero external magnetic field applied to the SAF, the SAF suddenly exhibits a non-zero net magnetization, when the external magnetic field applied in the easy axis direction is increased up to a certain magnetic field $H_{flop}$. At this time, the magnetizations of two ferromagnetic layers are magnetically coupled each other, directed at a certain angle so that the net magnetization of the SAF is oriented in the direction of the external magnetic field. Such phenomenon is often referred to as the spin flop, and the magnetic field $H_{flop}$ that causes the spin flop is referred to as the spin-flop field. Note that the spin flop occurs only when the net magnetization of the SAF with no external field applied is sufficiently small. The magnetizations of the two ferromagnetic layers are finally oriented in parallel, when the magnetic field if further increased. The magnetic field that orients the magnetizations of the two ferromagnetic layers in parallel is referred to as the saturation magnetic field $H_S$. The spin-flop field $H_{flop}$ and the saturation magnetic field $H_S$ are respectively expressed by the following formulas (4), (5):

$$H_{flop} = 2/M [K(J_{SAF}/t - K)]^{0.5} \qquad (4)$$
$$= (H_s - H_k)^{0.5},$$

and $$H_S = 2J_{SAF}/(Mt) - 2K/M \qquad (5)$$
$$= 2J_{SAF}/(Mt) - H_k.$$

As is apparent from the formula (4), the spin-flop field $H_{flop}$ is uniquely determined by the saturation magnetic field $H_S$ and the anisotropy field $H_k$. The spin-flop field $H_{flop}$ is the magnetic field where the antiparallel coupling between the two ferromagnetic layers within the SAF film starts to be decoupled, as is the case of the above-described magnetic field $H_1$.

An MRAM that uses the spin flop of the SAF for data write operations is disclosed in U.S. Pat. No. 6,545,906. FIG. 6 illustrates the structure of the disclosed MRAM. The longitudinal direction of a MTJ 201 is inclined at an angle of 45 degrees to a word line 202 and a bit line 203. FIG. 8 illustrates the write operation procedure of the MRAM shown in FIG. 6. It should be noted that the magnetizations of respective ferromagnetic layers within the free magnetic layer of the MTJ 201 is denoted by symbols "$M_1$", and "$M_2$" in FIG. 8.

The data write operation of the MRAM involves orienting the magnetizations of the ferromagnetic layers within the free magnetic layer to desired directions by rotating the in-plane direction of a magnetic field applied to the free magnetic layer of the MTJ 201. Specifically, a write current is firstly fed to the word line 202 to thereby generate a magnetic field $H_{WL}$ in the direction perpendicular to the word line 202 at Time $t_1$. This is followed by feeding another write current to the bit line 203 at Time $t_2$, with the write current continuingly fed to the word line 202. As a result, a magnetic field $H_{WL}+H_{BL}$ is generated in the oblique direction with respect to the word line 202 and the bit line 203, typically, at an angle of 45 degrees to the word line 202 and the bit line 203. This is further followed by terminating feeding the writing current to the word line 202 at Time $t_3$, while the writing current is continued to be fed to the bit line 203. This results in that the magnetic field $H_{BL}$ is generated in the direction perpendicular to the bit line 203 (that is, the direction parallel to the word line 202). The operation thus described achieves rotation of the magnetic field applied to the free magnetic layer through feeding the write currents to the word line 202 and the bit line 203 to thereby rotate the magnetizations of the ferromagnetic layers within the free magnetic layer of the SAF by 180 degrees. Hereinafter, the thus-described data write operation may be referred to as the "toggle writing".

The MRAM based on the "toggle writing" requires that the magnetic field applied to the free magnetic layer generated by the writing currents through the word line 202 and the bit line 203 be larger than above-defined spin-flop field $H_{flop}$, and be smaller than the saturation magnetic field $H_S$; otherwise, the magnetizations of the ferromagnetic layers within the free magnetic layer are not reversed to desired directions.

The MRAM write operation based on the toggle writing has various advantages. One advantage is high memory cell selectivity. FIG. 7 illustrates an exemplary operation region in which the magnetizations within the SAF are reversed by the magnetic fields generated by the write currents fed to the word line 202 and the bit line 203. In principle, the magnetizations within the SAF are not reversed in the toggle writing, when only one of the word line 202 and the bit line 203 is fed with a write current. In other words, the magnetizations within a non-selecting memory cell are not undesirably reversed. This is important in view of the reliability of the operation of the MRAM.

As shown in FIG. 7, the toggle writing-based MRAM exhibits an operation region along the toggling threshold curve on the side of the lower magnetic fields, in which the magnetizations within the SAF are directly switched to "1" or "0" state regardless of the original state of the SAF. This operation region is referred to as the direct mode reversal region. The size of the direct mode reversal region is increased as the difference $|M_1 \cdot t_1 - M_2 \cdot t_2|$ between magnetization-thickness products of the two ferromagnetic layers within the SAF is increased, and the state of the SAF after the direct mode reversal is determined depending on the dimension of the magnetization-thickness products of the two ferromagnetic films within the SAF, where the magnetization-thickness product of a ferromagnetic layer is defined as being the product of the saturation magnetization of the ferromagnetic layer and the film thickness thereof. This direct mode reversal region may be also used for write operations.

Reduction in the magnetic field for data writing in the toggle-writing-based MRAM may be achieved by reducing the spin-flop field $H_{flop}$ (which is expressed by the formula (4)), for example, through reducing the exchange coupling energy $J_{SAF}$. This is however, accompanied by a problem that the writing margin is also reduced. In the toggle writing, a successful write operation is achieved, when the synthetic magnetic field generated by the bit line and the word line ranges in a switching region between the spin-flop field $H_{flop}$ and the saturation magnetic field $H_S$. Therefore, a ratio defined by $H_S/H_{flop}$ can be considered to represent the writing margin. The writing margin $H_S/H_{flop}$ is expressed by the formula (6):

$$H_S/H_{flop} = H_{flop}/H_k. \quad (6)$$

As is apparent from the formula (6), the writing margin is reduced as the decrease in the spin-flop field $H_{flop}$, since the minimum crystalline anisotropy field $H_k$ is limited to a certain range. Therefore, the reduction in the spin-flop field $H_{flop}$ undesirably causes erroneous write operation of the toggle-writing-based MRAM. Therefore, an effort for reducing the write currents inevitably faces limit in a conventional toggle-writing-based MRAM. It would be advantageous if a toggle-writing-based MRAM is provided in which the spin-flop field $H_{flop}$ is reduced with the ratio $H_S/H_{flop}$ increased.

In other MRAMs adopting other data write techniques (such as an MRAM that achieves data writing through switching the magnetization of a free magnetic layer by a synthetic magnetic field generated by word and bit lines, and an MRAM that achieves data writing through spin-polarized current injection), it would be also advantages if an SAF has a sufficiently large saturation field with a reduced net magnetization, thereby reducing the switching field of the SAF. The enhancement of the antiferromagnetic coupling in the SAF with the net magnetization reduced effectively reduces the effective shape magnetic anisotropy of the free magnetic layer, and helps single domain formation in the free magnetic layer. This effectively reduces the magnetization switching field of the SAF, and also reduces variations in the magnetization switching field.

U.S. Pat. No. 6,714,446 discloses an SAF structure that minimizes the corresponding increase in current needed to alter the magnetization direction. The disclosed SAF structure incorporates two multi-layer structures and a space layer interposed therebetween, each of the two multi-layer structures being composed of two magnetic sublayers and a spacer layer interposed therebetween. However, the disclosed SAF structure does not address maintaining or improving the saturation field of the SAF.

SUMMARY OF THE INVENTION

Therefore, an object of the present invention is to provide a novel technique for reducing a magnetic field necessary for data writing with an increased writing margin in a toggle-writing based MRAM, and to thereby achieve the reduction in a write current and the suppression of unsuccessful data writing.

Another object of the present invention to provide a novel technique for reducing a magnetic field necessary for data writing with stable antiferromagnetic coupling in an MRAM using free magnetic layers incorporating. SAFs having reduced net magnetizations. This effectively reduces the write current of the MRAM, and avoids unsuccessful data writing.

In an aspect of the present invention, a magnetoresistive element is composed of a free magnetic layer and a fixed magnetic layer having a fixed magnetization. The free magnetic layer is composed of a first synthetic antiferromagnet including a plurality of ferromagnetic layers, and a first reversal inducing layer exhibiting ferromagnetism, two of the ferromagnetic layers within the first synthetic antiferromagnet being antiferromagnetically coupled through a non-magnetic layer. The reversal inducing layer is ferromagnetically coupled with the first synthetic antiferromagnet, and has a coercive field smaller than a magnetic field at which an antiferromagnetic coupling within the first synthetic antiferromagnet starts to be decoupled. The first synthetic antiferromagnet may be composed of two ferromagnetic layers. Alternatively, the first synthetic antiferromagnet may be composed three or more ferromagnetic layers.

In the magnetoresistive element thus structured, the first reversal inducing layer, which has the relatively reduced coercive field, effectively enhances the magnetization reversal of the ferromagnetic layers within the first synthetic antiferromagnet, and thereby reduces the magnetic field necessary for data writing.

Preferably, the free magnetic layer may additionally include a second reversal inducing layer exhibiting ferromagnetism. In this case, the second reversal inducing layer is designed to have a coercive field smaller than the magnetic field at which the antiferromagnetic coupling within the first synthetic antiferromagnet starts to be decoupled. The first reversal inducing layer is ferromagnetically coupled with one of the ferromagnetic layers within the synthetic antiferromagnet, and the second reversal inducing layer is ferromagnetically coupled with another of the ferromagnetic layers.

The free magnetic layer may additionally include a second synthetic antiferromagnet. In this case, the first reversal inducing layer is ferromagnetically coupled with both of the first and second synthetic antiferromagnet. In this case, it is preferable that the free magnetic layer additionally includes a second reversal inducing layer having a coercive field smaller than the magnetic field at which the antiferromagnetic coupling within the first synthetic antiferromagnet starts to be decoupled. The second reversal inducing layer is ferromagnetically coupled with the first antiferromagnet.

The magnetic field that completely decouples the ferromagnetic coupling between the first reversal inducing layer and the first synthetic antiferromagnet to allow the magnetization of the first reversal inducing layer to be oriented in antiparallel to the magnetization of the ferromagnetic layer which is originally ferromagnetically coupled to the first reversal inducing layer is preferably larger than the magnetic field at which the antiferromagnetic coupling within the first synthetic antiferromagnet starts to be decoupled. More preferably, the magnetic field that completely decouples the ferromagnetic coupling between the first reversal inducing layer and the first synthetic antiferromagnet is larger than the magnetic field at which the antiferromagnetic coupling within the first synthetic antiferromagnet starts to be decoupled, and smaller than the saturation field of the synthetic antiferromagnet, at which the magnetizations of the ferromagnetic layers within the synthetic antiferromagnet are oriented in parallel. Such structure effectively enhances the effect of the present invention, and reduces the magnetic field necessary for data writing with the increased writing margin. Although the effect of the present invention is not enhanced, it is preferable for improving operation stability that the magnetic field at which the ferromagnetic coupling between the first reversal inducing layer and the first synthetic antiferromagnet starts to be decoupled is preferably set to be larger than the saturation field of the first synthetic antiferromagnet, at which the magnetizations of the ferromagnetic layers within the synthetic antiferromagnet are oriented in parallel. The magnetic field at which the ferromagnetic coupling between the first reversal inducing layer and the first synthetic antiferromagnet starts to be decoupled is preferably set to be equal to or smaller that 500 times of the saturation field of the first synthetic antiferromagnet.

Specifically, the strength of the ferromagnetic coupling between the first reversal inducing layer and the first synthetic antiferromagnet is preferably equal to or larger than one fiftieth of the strength of the antiferromagnetic coupling within the synthetic antiferromagnet, and equal to or smaller than 500 times of the strength of the antiferromagnetic coupling within the synthetic antiferromagnet.

Preferably, the net magnetization of the free magnetic layer is less than 10% of the sum of the saturation magnetizations of the ferromagnetic layers within the synthetic antiferromagnet(s) and the reversal inducing layer(s). In this case, an MRAM is preferably composed of magnetoresistance elements incorporating such-designed free magnetic layers, the magnetoresistance elements being arranged at respective intersections of perpendicularly arranged word and bit lines so that the easy axes of the free magnetic layers are oriented at an angle of 45 degree to the word and bit lines.

Preferably, the first reversal inducing layer is magnetically coupled with the synthetic antiferromagnet through a magnetic coupler including non-magnetic element.

The magnetic coupler is preferably composed of alloy or compound of two or more non-magnetic elements, or of a stack of two or more films made of different non-magnetic elements. The magnetic coupler preferably has a thickness thinner than that of the thickness(es) of the non-magnetic layer(s) within the first synthetic antiferromagnet.

In a preferred embodiment, at least one element included in the magnetic coupler is selected from a group consisting of tantalum, ruthenium, manganese, barium, calcium, lithium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium. In another preferred embodiment, the magnetic coupler include oxide, nitride, or carbide of a material selected from a group consisting of tantalum, ruthenium, manganese, barium, calcium, lithium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium.

In one embodiment, the magnetic coupler is composed of a layer with pinholes that provide ferromagnetic coupling between the first reversal inducing layer and the first synthetic antiferromagnet. The magnetic coupler preferably has an average thickness ranging from 0.4 to 1.5 nm.

In order to improve thermal stability of the free magnetic layer, the magnetic coupler preferably includes oxide of element that has an oxide formation energy lower than that of magnetic element included in the ferromagnetic layers contacted with the top and bottom surface of the magnetic coupler. It is also preferable that the magnetic coupler includes nitride of element that has a nitride formation energy lower than that of magnetic element included in the ferromagnetic layers contacted with the top and bottom surface of the magnetic coupler. Instead, it is also preferable that the magnetic coupler includes carbide of element that has a carbide formation energy lower than that of magnetic element included in the ferromagnetic layers contacted with the top and bottom surface of the magnetic coupler. The magnetic coupler such-designed may include a material selected from a group consisting of magnesium, aluminum, silicon, germanium, lithium, beryllium, barium, calcium, titanium, vanadium, chromium, manganese, zirconium, hafnium, tantalum, niobium, molybdenum, cerium, yttrium, and lanthanum. In order to control magnetic characteristics and to improve thermal stability in the magnetoresistance ratio, the magnetoresistive element is preferable designed so that one face of the first reversal inducing layer is directly connected with the non-magnetic layer between the free and fixed magnetic layers, and another face is directly connected with the magnetic coupler thus designed; that the magnetic coupler being directly connected with one ferromagnetic layer within the synthetic antiferromagnet, the one ferromagnetic layer incorporating a film including non-magnetic element. The film including non-magnetic element provides control of the strength of the antiferromagnetic coupling within the first synthetic antiferromagnet.

In another embodiment, the magnetic coupler may be mainly made of material selected from a group consisting of ruthenium, chromium, rhenium, iridium, rhodium, silver, copper and yttrium, having such a thickness that the reversal inducing layer is ferromagnetically coupled with the synthetic antiferromagnet. In one embodiment, the magnetic coupler may be formed of a ruthenium film having an average thickness ranging from 1.1 to 1.7 nm, or from 2.3 to 2.9 nm.

In still another embodiment, the magnetic coupler may be made of alloy of one or more ferromagnetic elements selected from a group consisting of iron, cobalt, and nickel, and one or more non-magnetic elements selected from a group consisting of tantalum, ruthenium, manganese, barium, lithium, calcium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium. The magnetic coupler may be made of oxide, nitride, or carbide of one or more magnetic elements selected from a group consisting of iron, cobalt, and nickel.

In another aspect of the present invention, a magnetic memory is composed of a free magnetic layer, a fixed magnetic layer, and a magnetic film stack. The magnetic film stack is composed of: a synthetic antiferromagnet incorporating multiple ferromagnetic layers, adjacent two of which are antiferromagnetically coupled through a non-magnetic layer; and a first reversal inducing layer exhibiting ferromagnetism that is ferromagnetically coupled with the synthetic antiferromagnet. The first reversal inducing layer has a coercive field smaller than the magnetic field at which the antiparallel coupling within the synthetic antiferromagnet starts to be decoupled. It is preferable for enhancing the effect of the present invention that the magnetic film stack additionally includes a second reversal inducing layer exhibiting ferromagnetism. In this case, the second reversal inducing layer has a coercive field smaller than the magnetic field at which the antiparallel coupling within the synthetic antiferromagnet starts to be decoupled. The first reversal inducing layer is ferromagnetically coupled with one of the ferromagnetic layers within the synthetic antiferromagnet, and the second reversal inducing layer is ferromagnetically coupled with another of the ferromagnetic layers.

The magnetic field that completely decouples the ferromagnetic coupling between the reversal inducing layer and the synthetic antiferromagnet to allow the magnetization of the reversal inducing layer to be oriented in antiparallel to the magnetization of the ferromagnetic layer which is originally ferromagnetically coupled to the reversal inducing layer is preferably larger than the magnetic field at which the antiferromagnetic coupling within the first synthetic antiferromagnet starts to be decoupled. More preferably, the magnetic field that completely decouples the ferromagnetic coupling between the first reversal inducing layer and the first synthetic antiferromagnet is larger than the magnetic field at which the antiferromagnetic coupling within the first synthetic antiferromagnet starts to be decoupled, and smaller than the saturation field of the synthetic antiferromagnet, at which the magnetizations of the ferromagnetic layers within the synthetic antiferromagnet are oriented in parallel. The magnetic film stack thus structured is easy to be switched. It is preferable for improving operation stability that the magnetic field at which the ferromagnetic coupling between the reversal inducing layer and the synthetic antiferromagnet starts to be decoupled is preferably set to be larger than the saturation field of the first synthetic antiferromagnet, at which the magnetizations of the ferromagnetic layers within the synthetic antiferromagnet are oriented in parallel. The magnetic field at which the ferromagnetic coupling between the reversal inducing layer and the synthetic antiferromagnet start to be decoupled is preferably set to be equal to or smaller that 500 times of the saturation field of the synthetic antiferromagnet. Specifically, the strength of the ferromagnetic coupling between the reversal inducing layer and the synthetic antiferromagnet is preferably equal to or larger than one fiftieth of the strength of the antiferromagnetic coupling within the synthetic antiferromagnet, and equal to or smaller than 500 times of the strength of the antiferromagnetic coupling within the synthetic antiferromagnet. Preferably, the net magnetization of the magnetic film stack is less than 10% of the sum of the saturation magnetizations of the ferromagnetic layers within the synthetic antiferromagnet and the reversal inducing layer.

BRIEF DESCRIPTION OF THE DRAWINGS

FIG. 10A illustrates a behavior of magnetizations in a free magnetic layer in which an SAF is ferromagnetically coupled to soft magnetic layers (reversal inducing layers);

FIG. 18B is a sectional view illustrating another exemplary structure of an MRAM in the third embodiment;

FIG. 25A is a table illustrating crystalline anisotropy fields $H_k$, saturation fields $H_S$, spin-flop fields $H_{flop}$' estimated from the crystalline anisotropy fields $H_k$, and the saturation fields $H_S$, and actually measured spin-flop fields $H_{flop}$ of Samples 1 to 15;

FIG. 25B is a table illustrating toggle writing characteristics of MTJ elements for Samples 1 to 5, 7, 8, 12, 14, and 15;

FIG. 26B is a table illustrating saturation fields $H_S$, spin-flop fields $H_{flop}$, and operation margins of Samples 1 to 15.

DETAILED DESCRIPTION OF THE PREFERRED EMBODIMENTS

1. Principle of Magnetoresistive Element

The present invention is based on a discovery that a laminated free magnetic layer incorporating an SAF and a soft magnetic film which are coupled by moderate ferromagnetic coupling exhibits desired magnetization reversal characteristics featured by moderate combination of the magnetization reversal characteristics of the SAF and the soft magnetic film. The magnetization reversal behavior of the laminated free magnetic layer thus constituted is described in the following.

Figure 9A:
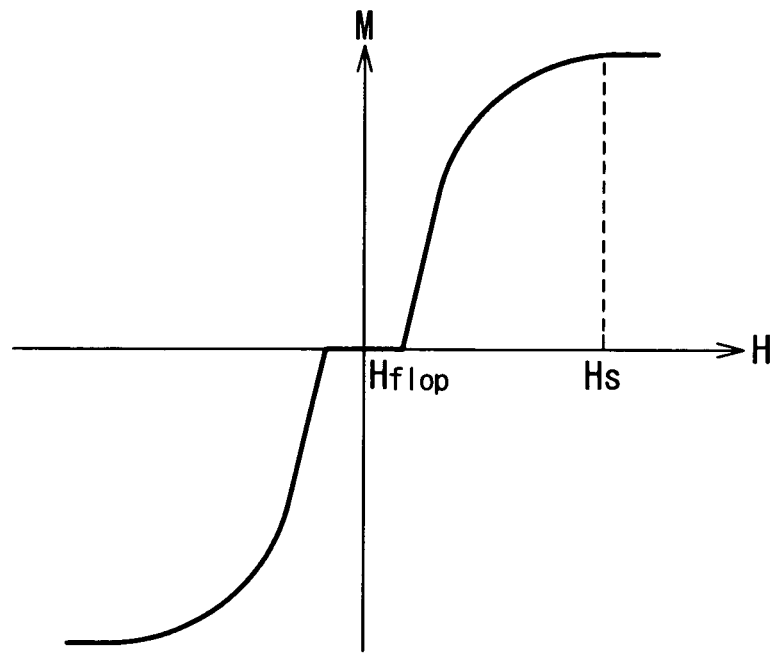
FIG. 9A is a graph illustrating a magnetization curve of a free magnetic free layer in which an SAF is ferromagnetically coupled to soft magnetic layers (reversal inducing layers)
Figure 9B:
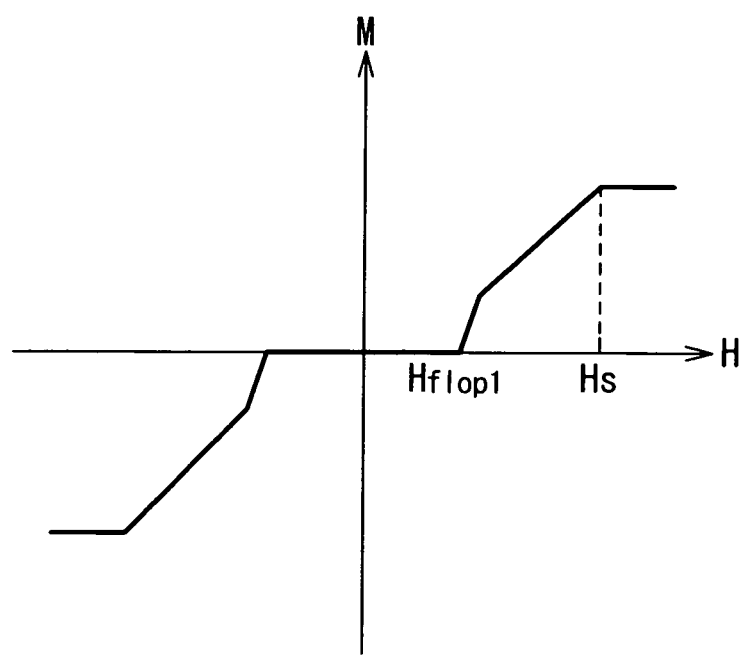
FIG. 9B is a graph illustrating a magnetization curve of an SAF.
Figure 9C:
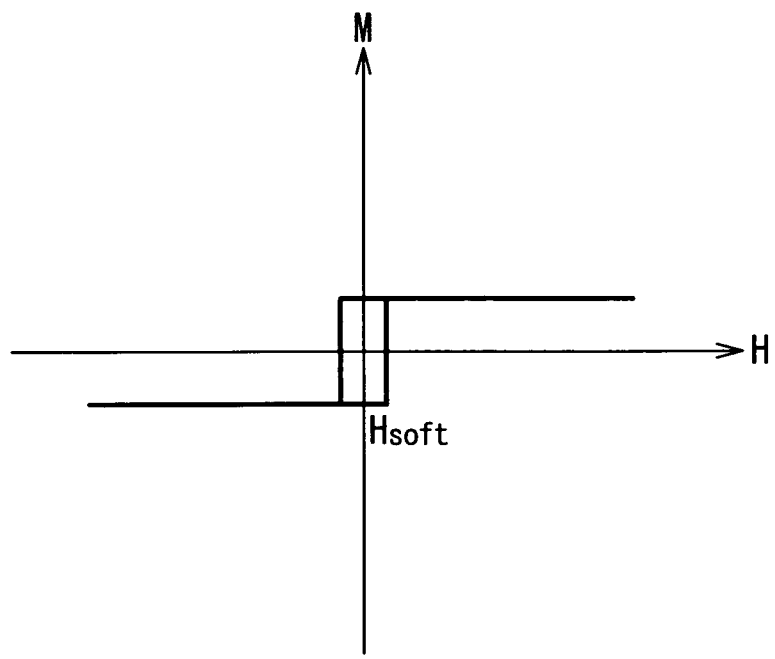
FIG. 9C is a graph illustrating the magnetization curve of a soft magnetization layer.
Figure 10B:
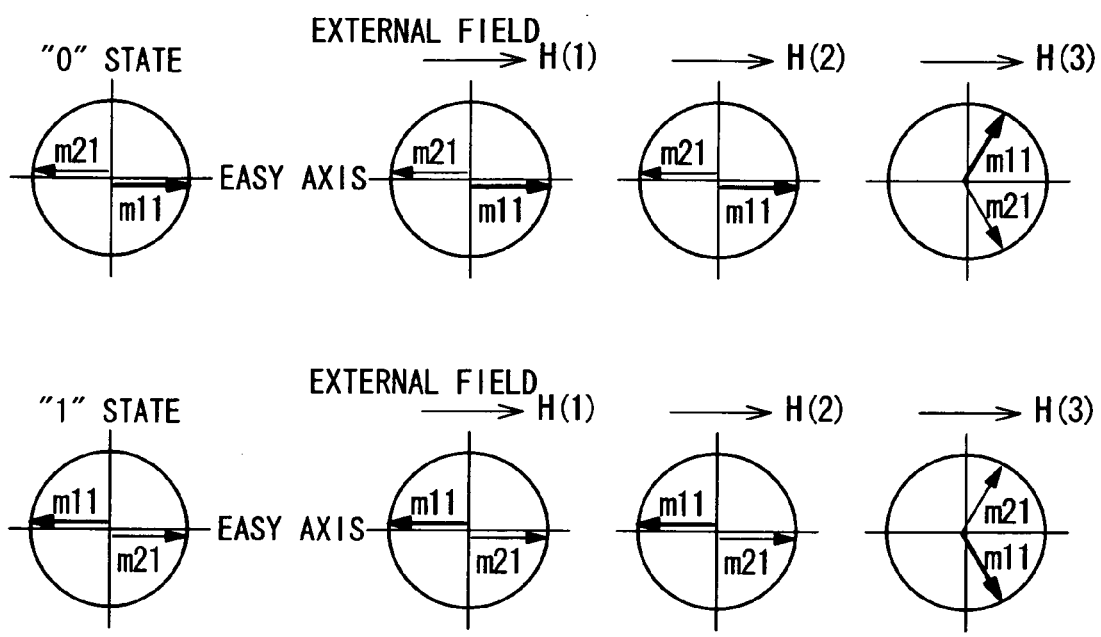
FIG. 10B illustrates a behavior of magnetizations within an SAF.
Figure 10C:
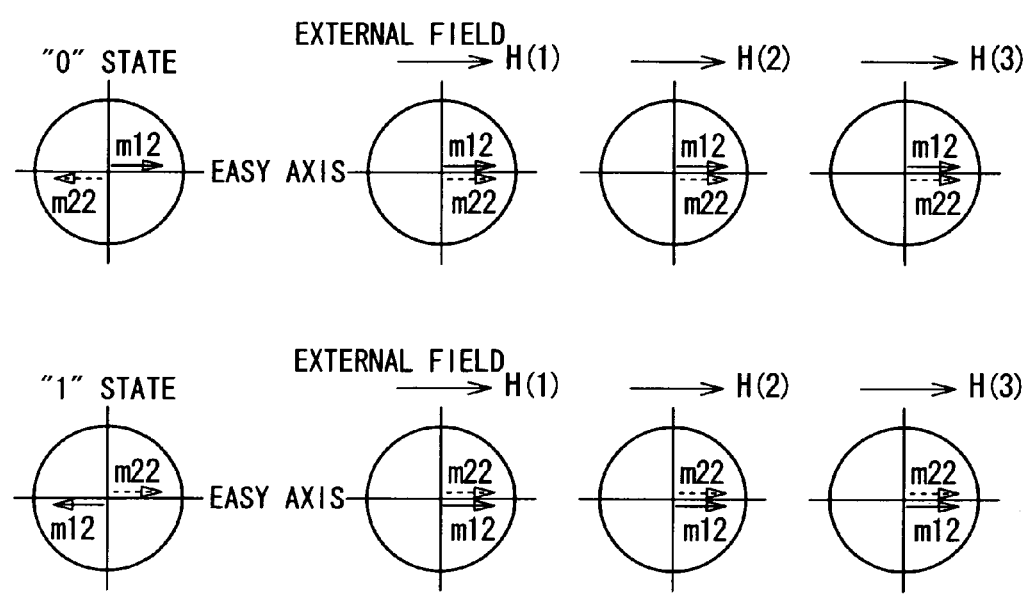
FIG. 10C illustrates a behavior of magnetizations of soft magnetic layers.

FIGS. 9A to 9C are graphs for illustrating magnetization curves of a laminated free magnetic layer of the present invention, an SAF composed of two ferromagnetic layers, and a structure composed of two magnetically independent soft magnetic films, respectively, for the case when an external field is applied in the easy axis direction. FIGS. 10A to 10C illustrate arrangements of the magnetizations of the respective ferromagnetic layers when an external magnetic field is applied in the easy axis direction of the fixed magnetic layer. It should be noted that that the distribution of local magnetic moments may exist in the respective ferromagnetic layers. Symbols H(1), H(2) and H(3) in FIGS. 10A to 10C denote the external magnetic fields of different strengths. The external magnetic fields H(1), H(2) and H(3) increase in this order. It is assumed that the state in which the magnetizations of the fixed and free magnetic layers are arranged in parallel is defined as the "0" state, while the state in antiparallel is defined as the "1" state. In FIGS. 10A to 10C, m11 and m21 denote the magnetizations of the ferromagnetic layers within the SAF, and m12 and m22 denote the magnetizations of the soft magnetic films. It should be also noted that FIGS. 9A to 10A illustrates the characteristics of the laminated free magnetic layer in which the soft magnetic films are provided at both of upper and lower sides of the SAF.

As shown in FIGS. 9C and 10C, the magnetizations within the laminated free magnetic layer only composed of the soft magnetic layers are reversed at a small magnetic field identical to the coercive field $H_{soft}$ of the soft magnetic layers. The coercive field $H_{soft}$ is equivalent to the net anisotropy field represented by the formula (1).

On the other hand, the SAF exhibits the spin flop at a spin-flop field $H_{flop1}$ as shown in FIGS. 9B and 10B, when the external magnetic field is applied to the SAF.

When the soft magnetic layers are magnetically coupled to the ferromagnetic layers of the SAF with an appropriate strength, the soft magnetic layers enhance the rotation of magnetizations of the ferromagnetic layers within the SAF through the magnetic coupling, since the magnetizations of the soft magnetic layers are reversed in the direction of the external magnetic field when the external magnetic field exceeds the coercive field $H_{soft}$. This enhances the spin-flop of the SAF at a magnetic field lower than the original spin-flop field $H_{flop1}$ as shown in FIGS. 9A and 10A. In other words, the spin-flop of the SAF is induced by the torque produced by the magnetization reversal of the soft magnetic layers. Since the soft magnetic layers provide such effect, the soft magnetic layers may be referred to as the reversal inducing layers.

Figure 11A:
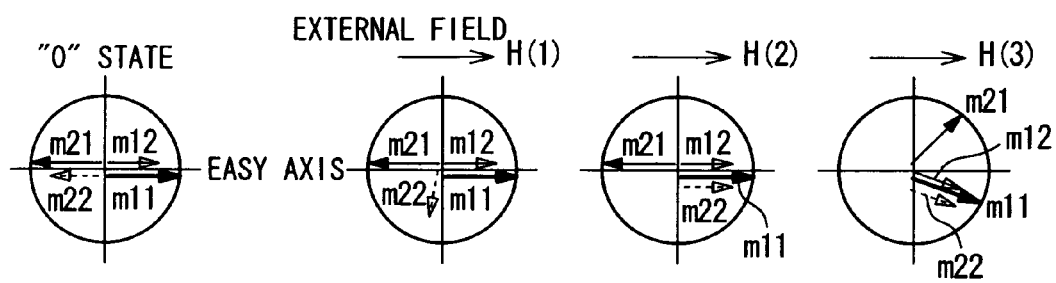
FIG. 11A illustrates the behavior of magnetizations within a free magnetic layer in which the strength of the ferromagnetic coupling between the SAF and the reversal inducing layers is unsuitably small.
Figure 11A:
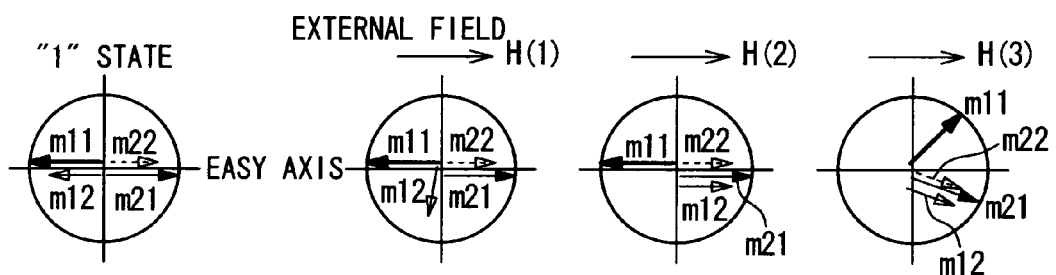

When the coercive field $H_{soft}$ of the reversal inducing layer is not smaller than the spin-flop field of the SAF, such effect is not obtained. The strength of the coupling between the reversal inducing layer and the SAF is also important. When the reversal inducing layer and the SAF are completely magnetically isolated due to the weak ferromagnetic coupling between the reversal inducing layer and the SAF before the SAF exhibits the spin flop, as shown in FIG. 11A, only the magnetizations of the reversal inducing layers are reversed in the direction of the external magnetic field, and the ferromagnetic layers within the SAF are left non-reversed. This prohibits the induction of the spin flop of the SAF with a low external magnetic field. Therefore, it is desirable that the magnetic field at which the ferromagnetic coupling between the reversal inducing layers and the SAF are completely decoupled to allow the magnetizations of the reversal inducing layers to be oriented in antiparallel to the adjacent ferromagnetic layers within the SAF is larger than the magnetic field where the antiparallel coupling of the SAF starts to be decoupled, or the spin-flop field.

It is preferable that the ferromagnetic coupling between the reversal inducing layers and the SAF does not start to be separated in the magnetic field range used in the toggle writing. In addition, it is preferable that the ferromagnetic coupling between the SAF and the reversal inducing layers is maintained up to the saturation field at which the magnetizations of the ferromagnetic layers within the SAF are oriented in parallel, because the magnetic coupling is not completely decoupled in the operation magnetic field range of the toggle writing. In that case, the magnetic field at which the magnetic coupling between the reversal inducing layers and the SAF starts to be decoupled needs only to be more than the saturation field of the SAF.

When the magnetic coupling between the reversal inducing layers and the SAF is excessively-enhanced, however, the reversal inducing layers only insufficiently reduce the spin-flop field of the SAF. Furthermore, when the SAF is ferromagnetically coupled to the reversal inducing layers too firmly, the reversal inducing layers and the adjacent ferromagnetic layers within the SAF behave as a single ferromagnetic layer. This undesirably causes the free magnetic layer to exhibit the same magnetization reversal behavior as a commonly-known SAF that has thick ferromagnetic layers. Therefore, the free ferromagnetic layer is desirably designed so that the magnetic coupling between the reversal inducing layers and the SAF is moderately enhanced to the extent where the reversal inducing layers and the SAF are not magnetically isolated, so as not to cause undesired operation. In order to avoid the SAF exhibiting the same magnetization reversal behavior as a commonly-known SAF incorporating thick magnetic films, the free magnetic layer is desirably designed so that the magnetic field at which the magnetic coupling between the reversal inducing layer and the SAF starts to be decoupled is set to 500 times or less of the saturation field of the SAF.

Figure 11B:
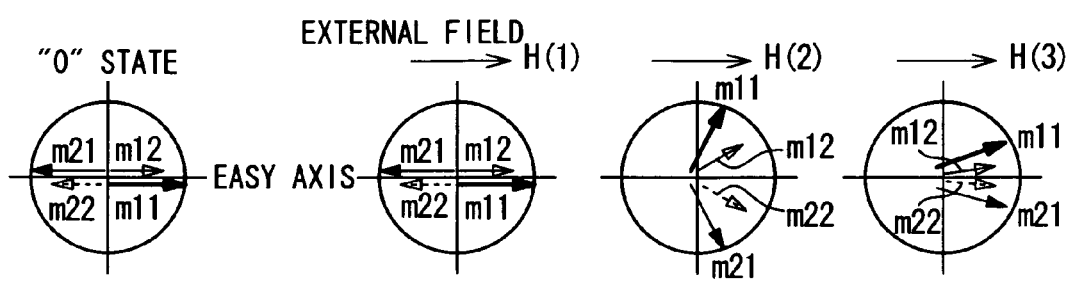
FIG. 11B illustrates the behavior of magnetizations within a free magnetic layer in which the strength of the ferromagnetic coupling between the SAF and reversal inducing layers is adjusted to achieve the toggle writing.
Figure 11B:
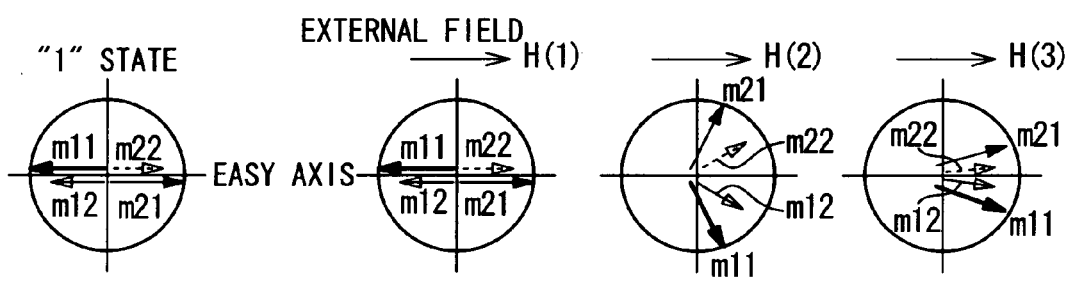

As described above, it is important that the reversal inducing layers and the SAF are not magnetically separated. When the magnetic coupling of the reversal inducing layers and the SAF layer is moderately enhanced, the reversal inducing layers effectively enhance the magnetization reversal of the SAF, reduce the spin-flop field thereof, and increase the saturation field thereof. FIG. 11B illustrates an example of desired magnetization reversal behaviors of the respective ferromagnetic layers within the free magnetic layers. First, the magnetizations of the reversal inducing layers start to rotate to the direction of the magnetic field, and then magnetizations of the ferromagnetic layers within the SAF are rotated to the direction of the magnetic field. The magnetizations of the reversal inducing layers are oriented near the direction of the magnetic field as compared with the magnetizations of the ferromagnetic layers within the SAF. In such state, the ferromagnetic layers within the SAF exhibit the spin flop, since the magnetizations of the ferromagnetic layers within the SAF follow the reversal of the reversal inducing layers. As shown in FIG. 11A, the magnetic coupling between the reversal inducing layers and the SAF must not be weaken to the extent that the reversal inducing layers and the SAF are magnetically isolated to prohibit the magnetizations of the ferromagnetic layers within the SAF from following the reversal of the magnetizations of the reversal inducing layers.

The inventor additionally has examined the association of the ratio of the strength of the magnetic coupling between the reversal inducing layers and the SAF to the strength of the antiferromagnetic coupling between the ferromagnetic layers within the SAF with the yield and magnetic characteristics of the free magnetic layer, for the case that the reversal inducing layers and the ferromagnetic layers within the SAF have approximately the same thickness. The inventor's examination result has revealed that the strength of the magnetic coupling between the reversal inducing layers and the SAF is desirably equal to or larger than one-fiftieth of the strength of the antiferromagnetic coupling between adjacent two of the ferromagnetic layers within the SAF, in order to avoid the complete magnetic isolation between the reversal inducing layers and the SAF. Additionally, the strength of the magnetic coupling between the reversal inducing layers and the SAF is desirably equal to or larger than 500 times of the strength of the antiferromagnetic coupling between the ferromagnetic layers within the SAF, in order to exhibit the advantageous effect of the present invention. In this case, the strength of the magnetic coupling between the reversal inducing layers and the SAF is preferably adjusted so that the magnetic field at which the magnetic coupling between the reversal inducing layers and the SAF starts to be decoupled is larger than the magnetic field at which the ferromagnetic layers within the SAF starts to be placed out of the antiparallel arrangement, and is smaller than the saturation field of the SAF, which is the magnetic field at which the magnetizations of the ferromagnetic layers within the SAF are finally oriented in parallel.

Although the free magnetic layer may include one or multiple reversal inducing layers, it is preferable that the number of the reversal inducing layers within the free magnetic layer is multiple. When the free magnetic layer includes two reversal inducing layers having magnetizations oriented in antiparallel to each other with no external magnetic field applied, the magnetization reversal of the SAF is largely induced compared with the case that the free magnetic layer includes only one reversal inducing layer. When the free magnetic layer includes only one reversal inducing layers, the reversal inducing effect is obtained in only one of the two allowed states of the free magnetic layer, in which the magnetization of the single reversal inducing layer is antiparallel to the external magnetic field. As shown in FIG. 10A, when the free magnetic layer includes two reversal inducing layers having magnetizations oriented in antiparallel to each other with no external magnetic field applied, the desired reversal inducing effect is always obtained to reduce the spin-flop field of the SAF, since the reversal inducing effect is obtained by one of the two reversal inducing layers, regardless of which of the two allowed state the free magnetic layer is placed in.

Figure 12:
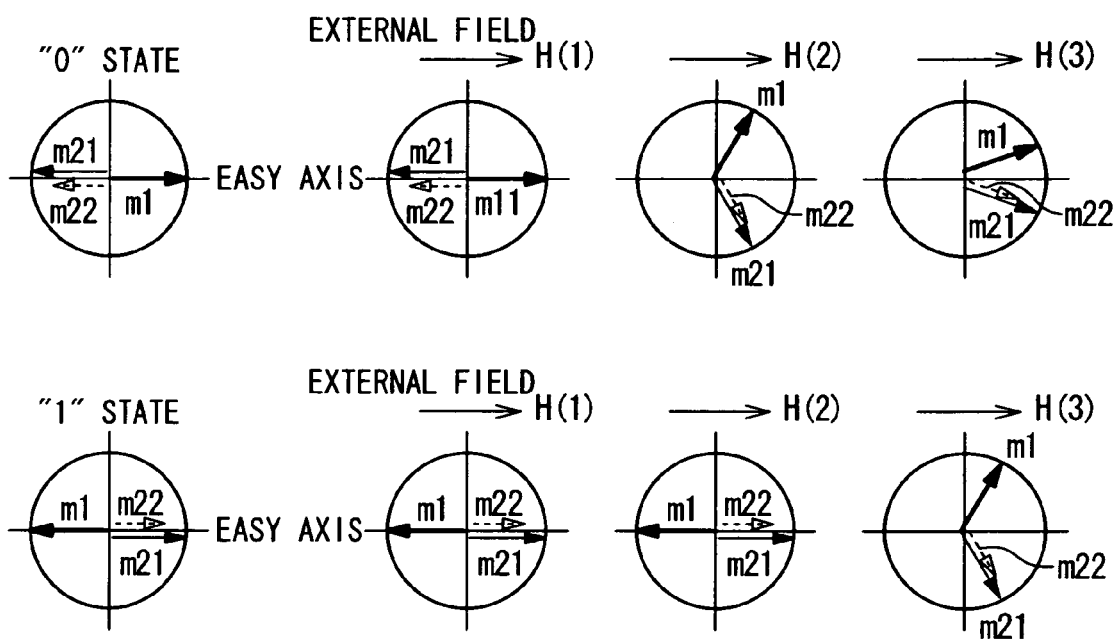
FIG. 12 illustrates the behavior of magnetizations in the free magnetic layer in which only one reversal inducing layer is ferromagnetically coupled to an SAF.

The free magnetic layer with a single reversal inducing layer enjoys the reversal inducing effect of reducing the spin-flop field, only when the free magnetic layer is placed in a certain one of the two allowed states. In this case, as shown in FIG. 12, the data writing into the free magnetic layer is desirably achieved using the toggle writing when the free magnetic layer is placed in the certain one of the two allowed states, and using the direct mode writing, which allows data writing with a reduced magnetic field, when the free magnetic layer is placed in the other state. As shown in FIG. 12, such data writing scheme effectively achieves data writing with a reduced magnetic field regardless of the state of the free magnetic layer. In that case, the SAF within the free magnetic layer is designed to exhibit the direct mode reversal region. In one embodiment, the SAF may incorporate two ferromagnetic layers with different thicknesses to allow the direct mode writing.

It should be noted that the technique for reducing the spin-flop field by the reversal inducing layers is also applicable to a multilayer SAF composed of three or more ferromagnetic layers separated by two or more non-magnetic layers, and to a laminated free magnetic layer composed of two or more SAFs.

When the switchings of the free magnetic layer to the "0" and "1" states are both achieved by the toggle writing, the net magnetization of the free magnetic layer is preferably close to zero. Preferably, the net magnetization of the free magnetic layer is less than 10% of the sum of magnetizations of the respective ferromagnetic layers within the SAF and the magnetizations of the reversal inducing layers; otherwise, the SAF within the free magnetic layer does not cause the spin flop, which is required for the toggle writing, so that the net magnetization of the free magnetic layer is directly reversed in the direction of the magnetic field.

As for the layout of the memory cell of the MRAM, it is preferable that the magnetoresistance elements are positioned at the respective intersections of the word and bit lines perpendicularly intersecting one another, and that the easy axis of the free magnetic layer of each magnetoresistance element is preferably oriented at an angle of approximately 45 degrees to the directions of the word and bit lines.

One preferred approach for achieving desired magnetic coupling between the reversal inducing layers and the SAF is to interpose magnetic couplers containing non-magnetic element between the reversal inducing layers and the SAF. The magnetic couplers may be variously constituted, exhibiting various kinds of magnetic coupling.

In one embodiment, the magnetic couplers may be composed of a non-magnetic member that partially separates the reversal inducing layers from the SAF.

Although the direct contact between the reversal inducing layers and the SAF causes strong ferromagnetic exchange coupling, the non-magnetic member moderately weakens the ferromagnetic exchange coupling. Such designed magnetic couplers achieve the control of the strength of the ferromagnetic magnetic coupling between the reversal inducing layers and the SAF. The strength of the ferromagnetic coupling is widely controllable with the areas of faces of the reversal inducing layers and the SAF separated by the non-magnetic member. Only the requirement imposed on the non-magnetic member is to separate the ferromagnetic coupling between the reversal inducing layers and the SAF. Therefore, the non-magnetic member may be made of almost any non-magnetic element. Specifically, the non-magnetic member may be made of material selected from a group consisting of tantalum, ruthenium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium. In practical use, the use of the oxide, nitride or carbide of the above-listed non-magnetic elements is more preferable for stably weakening the ferromagnetic coupling due to the thermal stability; the use of the oxide, nitride or carbide effectively avoids thermal diffusion with the ferromagnetic layers adjacent to the magnetic couplers.

In one embodiment, the magnetic couplers may be composed of non-magnetic layers with pinholes that provide ferromagnetic coupling with desired strength. The Neel coupling and/or exchange interaction through the non-magnetic layers may also contribute to provide the desired ferromagnetic coupling with strength in addition to the pinholes, depending on the material of the non-magnetic layers. The average thicknesses of the magnetic couplers preferably range from 0.4 to 1.5 nm, and more preferably from 0.4 nm to 1.0 nm.

The use of such thin non-magnetic layers as the magnetic couplers has various influences, such as changes in the crystal orientations of the layers formed thereon or thereover and in the magnetoresistance ratio of the magnetoresistive element, while achieving the control of the strength of the ferromagnetic coupling. The use of multiple non-magnetic elements within the magnetic couplers helps desired control of the characteristics of the magnetoresistive element. In this case, the magnetic couplers may be composed of two or more films made of different non-magnetic elements, or of a film made of alloy of two or more non-magnetic elements. The latter is more preferable for reducing the cost.

In order to improve the thermal stability of the free magnetic layer, the magnetic couplers are preferably made of thermally stable material. One preferred example is non-metal material. Many non-metal materials have high melting point and fineness, and are hardly solid-dissolved in metal material. Therefore, the use of the non-metal materials is preferable for avoiding the interdiffusion between the magnetic couplers and the ferromagnetic layers within the free magnetic layer. In order to stabilize the magnetic couplers within the free magnetic layer, the magnetic couplers are preferably made of oxide of element having a lower oxide formation energy than that of the magnetic element(s) included in the ferromagnetic layers contacted with the top and bottom faces of the magnetic couplers. Such oxide within the magnetic couplers is stable in high temperatures with high melting point, and the oxygen is hardly diffused into the adjacent ferromagnetic layers. Instead, the magnetic couplers may be made of nitride of element having a lower nitride formation energy or carbide of element having a lower carbide formation energy, compared with the magnetic element(s) included in the ferromagnetic layers. As is the case of oxide, the nitride or carbide within the magnetic couplers is stable in high temperatures with high melting point, and the nitrogen or carbon is hardly diffused into the adjacent ferromagnetic layers. Additionally, the carbide and the nitride are often conductive; the use of conductive nitride or carbide for the magnetic couplers advantageously reduces the resistance of the magnetoresistive element. The magnetic couplers of conductive nitride or carbide do not function as series-connected resistors within the magnetoresistive element.

In view of the fact that iron, nickel, cobalt and alloys thereof are typically used as the ferromagnetic layers, the magnetic couplers are preferably made of material of element that has lower oxide, nitride, or carbide formation energy than that of iron, nickel, and cobalt (that is, element that is hard to be oxidized, nitrated, or carbonized compared to iron, nickel, and cobalt). In one embodiment, the magnetic couplers are preferably made of oxide, nitride, or carbide of magnesium, aluminum, silicon, germanium, lithium, beryllium, barium, calcium, titanium, vanadium, chromium, manganese, zirconium, hafnium, tantalum, niobium, chromium, molybdenum, cerium, yttrium, and lanthanum.

The control of the strength of antiparallel coupling within the SAF is also important for the free magnetic layer of the present invention; the insertion of a magnetic coupler may cause an undesirable effect on the crystallinity of the ferromagnetic layers within the SAF formed on the magnetic coupler, which may undesirably affect the antiferromagnetic coupling within the SAF. One approach for controlling the strength of the antiferromagnetic coupling within the SAF is to provide a layer containing non-magnetic element in the ferromagnetic layer within the SAF formed on the upper face of the magnetic coupler. For example, inserting an ultra thin layer (having a thickness of 0.4 nm or less) of non-magnetic tantalum or zirconium into the ferromagnetic layer of the SAF formed on the magnetic coupler effectively promotes the crystal orientation of the ferromagnetic layers within the SAF, enhancing the antiferromagnetic coupling within the SAF.

It should be noted that a magnetic coupler made of the above-described thermally stable material also functions as a diffusion barrier layer that suppress the diffusion of the non-magnetic element (such as tantalum and zirconium) of the ultra thin non-magnetic layer into the non-magnetic layer provided between the free and fixed magnetic layers, avoiding undesirable reduction in the magnetoresistance ratio of the magnetoresistive element. As a result, the use of thermally stable material for the magnetic coupler effectively achieves the improved thermal stability and controllability of the magnetic characteristics of the free magnetic layer, while achieving the improved thermal stability of the magnetoresistance ratio. This is significantly advantages for improving the thermal stability in the read and write operations of the MRAM.

Figure 13:
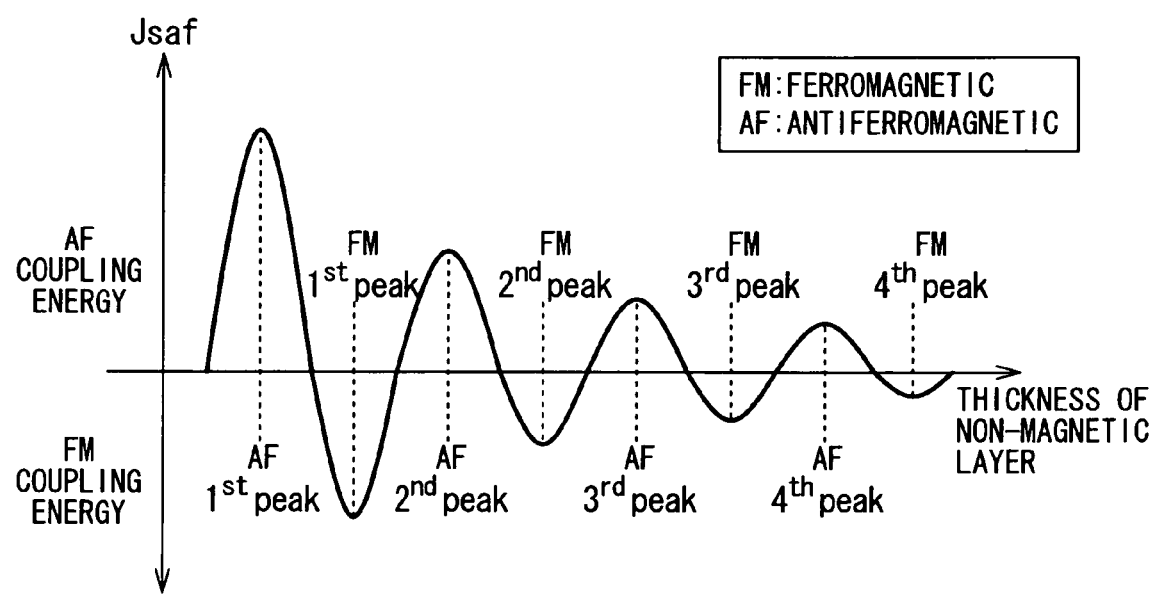
FIG. 13 is a graph illustrating the effect of the thickness of a non-magnetic layer on the strength of the RKKY interaction.

In another embodiment, the magnetic couplers may be designed so that Rudermann, Kittel, Kasuya, Yoshida (RKKY) interaction are exerted between the SAF and the reversal inducing layers; it should be noted that the RKKY interaction is an interaction caused by a phenomenon that the magnetic interaction of local magnetic moments of ferromagnetic atoms within ferromagnetic layers are transmitted by free electrons of the non-magnetic atoms within a non-magnetic layer. The RKKY interaction is the same kind of the interaction as the antiferromagnetic coupling within the SAF. As known in the art, the magnetic coupling resulting from the RKKY interaction exhibits attenuated oscillation with the increase in the thickness of the non-magnetic layer, alternately causing the antiferromagnetic coupling and the ferromagnetic coupling (refer to FIG. 13). The amplitude and cycle of the oscillation depend on the combination of materials of the non-magnetic layer and the ferromagnetic layer, and also depend on the crystal orientations of the ferromagnetic layers and the non-magnetic layer, according to the experiment of the inventor. For ferromagnetic layers made of magnetic material, such as Fe, Co, Ni, and alloys thereof, the RKKY interaction is achieved by mainly constituting the non-magnetic layer with material selected from a group consisting of ruthenium, chromium, rhenium, iridium, rhodium, silver, copper and yttrium. The thicknesses of the non-magnetic magnetic couplers are preferably adjusted to thicknesses corresponding to the peaks at which the strength of the ferromagnetic coupling is local maximum; this effectively stables the ferromagnetic coupling caused by the magnetic couplers, reducing an undesirable effect caused by film thickness variations of the magnetic couplers.

The magnetic couplers need to exhibit a strong ferromagnetic interaction to some extent. When the magnetic couplers mainly consist of ruthenium, the magnetic couplers preferably have an average thickness from 1.1 to 1.7 nm, or from 2.3 to 2.9 nm; this allows the magnetic couplers to exhibit ferromagnetic interaction corresponding to the first or second ferromagnetic peak.

In still another embodiment, the magnetic couplers may be formed of a ferromagnetic layer with a reduced magnetization; such structured magnetic couplers cause moderate ferromagnetic coupling between the reversal inducing layers and the adjacent ferromagnetic layers within the SAF. In this case, the magnetic couplers may be composed of complex ferromagnetic material made of alloy of ferromagnetic element(s) selected from a group consisting of iron, cobalt, and nickel, and non-magnetic element(s) selected from a group consisting of tantalum, ruthenium, niobium, vanadium, osmium, rhodium, iridium, titanium, zirconium, hafnium, copper, silver, gold, chromium, molybdenum, tungsten aluminum, magnesium silicon, yttrium, cerium, palladium and rhenium. Alternatively, the magnetic coupler may be composed of complex ferromagnetic material made of ferromagnetic element(s) and oxide, nitride, or carbide of non-magnetic element. A layer of such complex ferromagnetic material effectively functions as a magnetic coupler that allows control of the strength of ferromagnetic coupling with the thickness thereof and the composition of the non-magnetic and ferromagnetic elements.

Figure 14A:
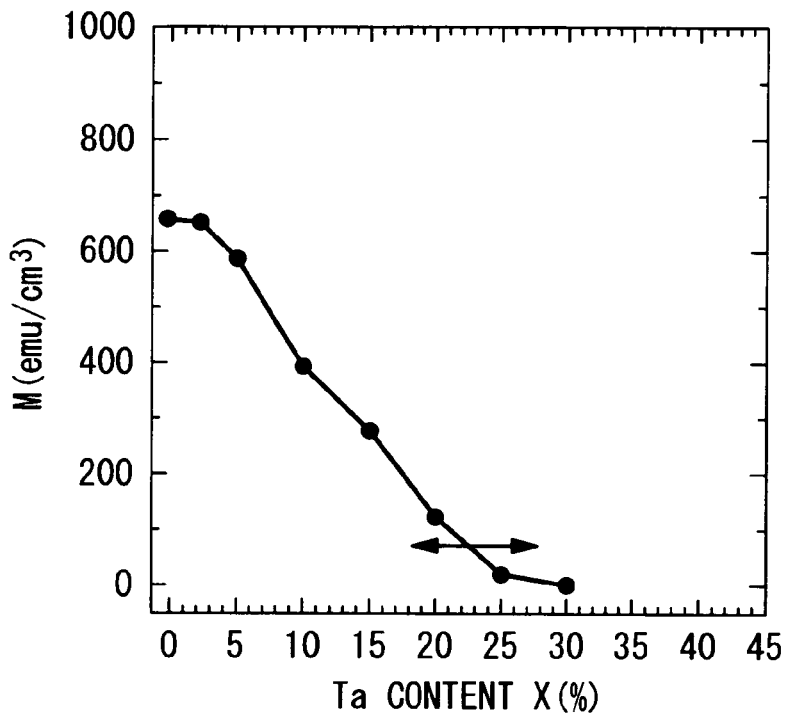
FIG. 14A is a graph illustrating the effect of the Ta content on the magnetization M of an $(Ni_{81}Fe_{19})1-_xTa_x$ film.
Figure 14B:
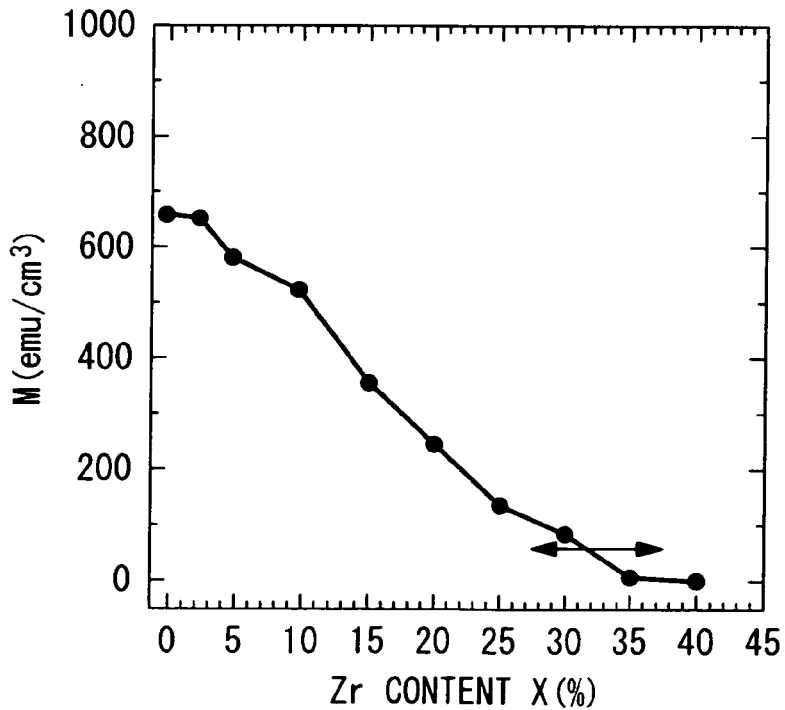
FIG. 14B is a graph illustrating the effect of the Zr content on the magnetization M of an $(Ni_{81}Fe_{19})1-_xZr_x$ film.

For example, FIGS. 14A and 14B illustrate associations of magnetizations of alloy films of Ta and NiFe, and of Zr and NiFe with the compositions thereof, for a film thickness of 4 nm. Preferred Ta and Zr contents of the magnetic couplers, which provide ferromagnetism with reduced magnetization, are indicated by the arrows in FIGS. 14A and 14B. In this case, an increase in the thickness of the magnetic couplers causes a decrease in the strength of ferromagnetic coupling caused by the magnetic couplers. The strength of the ferromagnetic coupling can be appropriately adjusted by making use of the fact that the strength of the ferromagnetic coupling between two ferromagnetic layers through an intermediate ferromagnetic layer with a reduced magnetization is weaker than that of the ferromagnetic coupling between the two ferromagnetic layers directly contacted with each other. One advantage of this embodiment is that the magnetic couplers are allowed to have increased thicknesses, which achieves superior controllability of the film thickness during manufacture.

In still another embodiment, the magnetic couplers may be composed of a thin film of oxide, nitride, or carbide of ferromagnetic element. In general, oxide, nitride, and carbide of ferromagnetic element are ferromagnetic material with a reduced magnetization or antiferromagnetic material. The magnetic couplers made of oxide, nitride, and carbide of ferromagnetic element cause ferromagnetic coupling between the reversal inducing layers and the SAF, when having a thickness of 1.0 to 2.0 nm or less. The strength of the ferromagnetic coupling is controllable with the thickness and composition of the ferromagnetic element within the magnetic couplers.

Out of the above-described four kinds of the magnetic couplers, two or more kinds of the magnetic couplers may be incorporated within a single free magnetic layer due to circumstances. Each magnetic coupler may be made of single non-magnetic element, or of two or more non-magnetic elements. As described above, a magnetic coupler made of two or more non-magnetic elements helps control and improvement of the characteristics of the magnetoresistive elements.

The material and thickness of the reversal inducing layers must be designed accordingly to the shape of the free magnetic layer, because the strength of the coupling between the reversal inducing layers and the SAF strongly depends on the shape magnetic anisotropy, especially in highly integrated MRAM cells. Especially, an increased thickness of the reversal inducing layers increases the coercive field thereof, as is understood from the formula (1), and also causes the antiferromagnetic coupling energy $J_D$ due to large magnetostatic coupling to have an unignorable effect, in addition to the coupling energy $J_C$ through the magnetic couplers. The total magnetic coupling energy $J_C'$ between a reversal inducing layer and an SAF in a highly integrated MRAM cell is expressed by the formula (7):

$$J_C' = J_C - J_D \qquad (7)$$
$$= J_C - DM_C t_C / W,$$

where D is a coefficient determined by the shape of the free magnetic layer of the magnetoresistive element, such as the aspect ratio, which increases as the aspect ratio decreases, and $M_C$ is the saturation magnetization of the reversal inducing layer; $t_C$ is the film thickness of the reversal inducing layer, and W is the width of the free magnetic layer. Highly-integrated MRAM cells require the total magnetic coupling energy $J_C'$ to be appropriately adjusted for reducing the spin-flop field of the SAF. Therefore, a preferred lamination structure of the free magnetic layer depends on the shape of the free magnetic layer.

It should be noted that the total magnetic coupling energy $J_C'$ indicates the amplitude of the total energy related to the ferromagnetic coupling between the reversal inducing layer and the SAF. When the magnetizations of the respective ferromagnetic layers within the SAF are stable, having magnetization-thickness products extremely larger than that of the reversal inducing layer, the total magnetic coupling energy $J_C'$ is approximately identical to $M_C \cdot t_C \cdot H_{C1}$, where $H_{C1}$ is the magnetic field at which the reversal inducing layer starts to be magnetically decoupled from the SAF. The free ferromagnetic layer of the present invention requires the magnetic field $H_{C1}$ to be larger than the magnetic field at which the antiferromagnetic coupling within the SAF starts to be decoupled (that is, the spin-flop field $H_{flop}$ or the magnetic field $H_1$ of the SAF).

In the following, exemplary structures of the magnetoresistive element according to the present invention will be described in detail.

2. First Embodiment

Figure 15A:
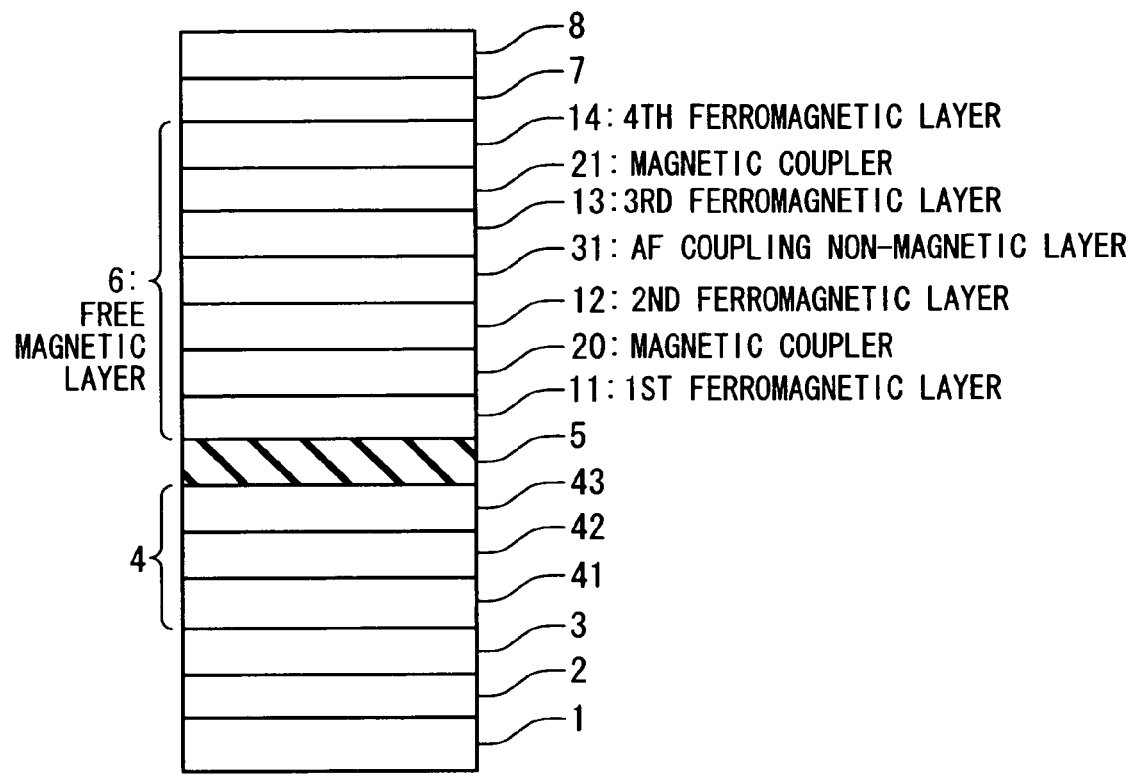
FIG. 15A is a sectional view illustrating an exemplary structure of an MRAM in a first embodiment.

FIG. 15A is a sectional view illustrating an exemplary structure of a memory cell of an MRAM in a first embodiment of the present invention. The MRAM is provided with a substrate 1, a lower electrode layer 2 formed on the substrate 1, an antiferromagnetic layer 3 formed of antiferromagnetic material, a fixed magnetic layer 4, a non-magnetic layer 5, a free magnetic layer 6, and a contact electrode layer 7. The antiferromagnetic layer 3 exerts exchange interaction on the fixed magnetic layer 4 to fix the magnetization of the fixed magnetic layer 4. The fixed magnetic layer 4' is composed of an SAF including of a ferromagnetic layer 41, an AF (antiferromagnetically) coupling non-magnetic layer 42 and a ferromagnetic layer 43. The magnetizations of the fixed magnetic layer 4 are fixed by the antiferromagnetic layer 3. In an alternative embodiment, the fixed magnetic layer 4 may be formed of a single ferromagnetic layer.

The non-magnetic layer 5 is formed of a very thin non-magnetic insulator or a thin electric conductor. The free magnetic layer 6 is formed of a multilayer stack incorporating an SAF, and the magnetizations of the ferromagnetic layers within the free magnetic layer 6 are reversible. The directions of the magnetizations within the free magnetic layer 6 are oriented in the direction determined by data to be stored.

The magnetoresistive element comprised of the fixed magnetic layer 4, the non-magnetic layer 5 and the free magnetic layer 6 functions as a magnetic tunnel junction (MTJ) element which exhibits the magnetic tunnel effect, when the non-magnetic layer 5 is an insulator. The resistance of the MTJ element is changed due to the tunnel magnetoresistive effect in response to the directions of the magnetizations of the ferromagnetic layers within the free magnetic layer 6, that is, the data stored in the free magnetic layer 6. The data read operation of the MRAM is based on the change in the resistance of the MTJ element. The non-magnetic layer 5 may be made of an amorphous film of $Al_2O_3$, AlN, MgO, $ZrO_2$, or $HfO_2$, or a crystalline film of MgO. In one embodiment, the contact electrode layer 7 is formed of a tantalum film of 100 nm.

When the non-magnetic layer 5 is formed of a conductive layer, on the other hand, the magnetoresistive element functions as a Current Perpendicular in-Plane giant magnetoresistive element (CPP-GMR element) which exhibits the giant magnetoresistance effect. In this case, the non-magnetic layer 5 may be made of Cu, Ag, Au, Ru or other non-magnetic conductive materials.

Figure 1A:
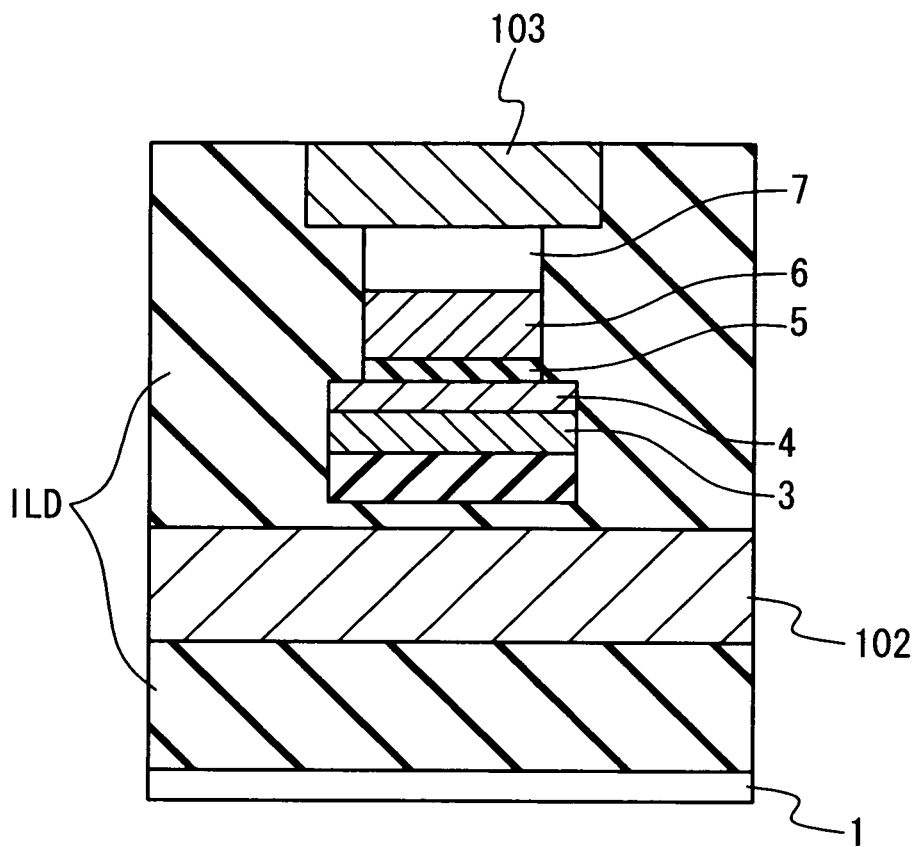
FIG. 1A is a sectional view illustrating a typical structure of an MRAM.
Figure 1B:
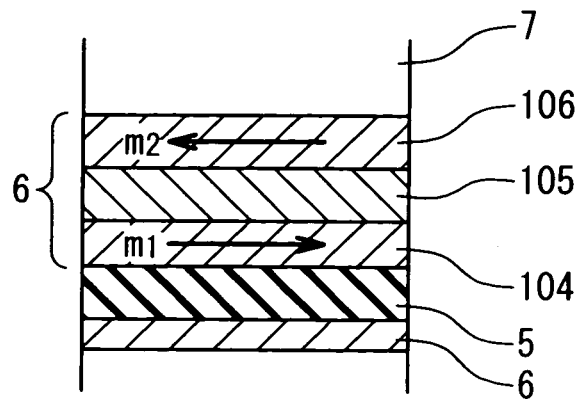
FIG. 1B is a sectional view illustrating a typical structure of a free magnetic layer incorporating an SAF.
Figure 2:
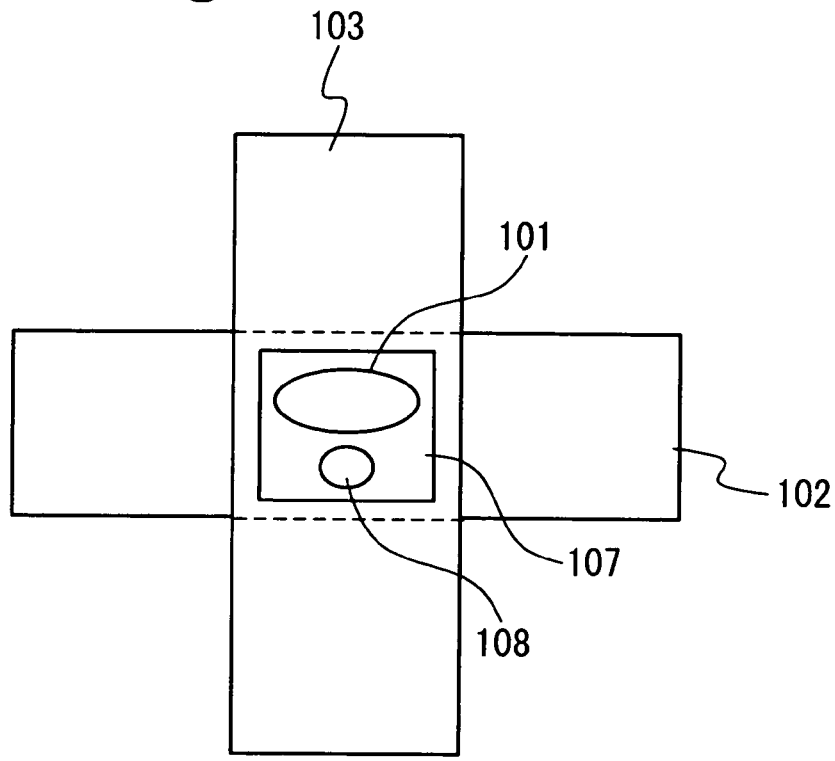
FIG. 2 is a plan view illustrating a typical structure of an MRAM which achieves selective data writing based asteroid characteristics of ferromagnetic layers.
Figure 3:
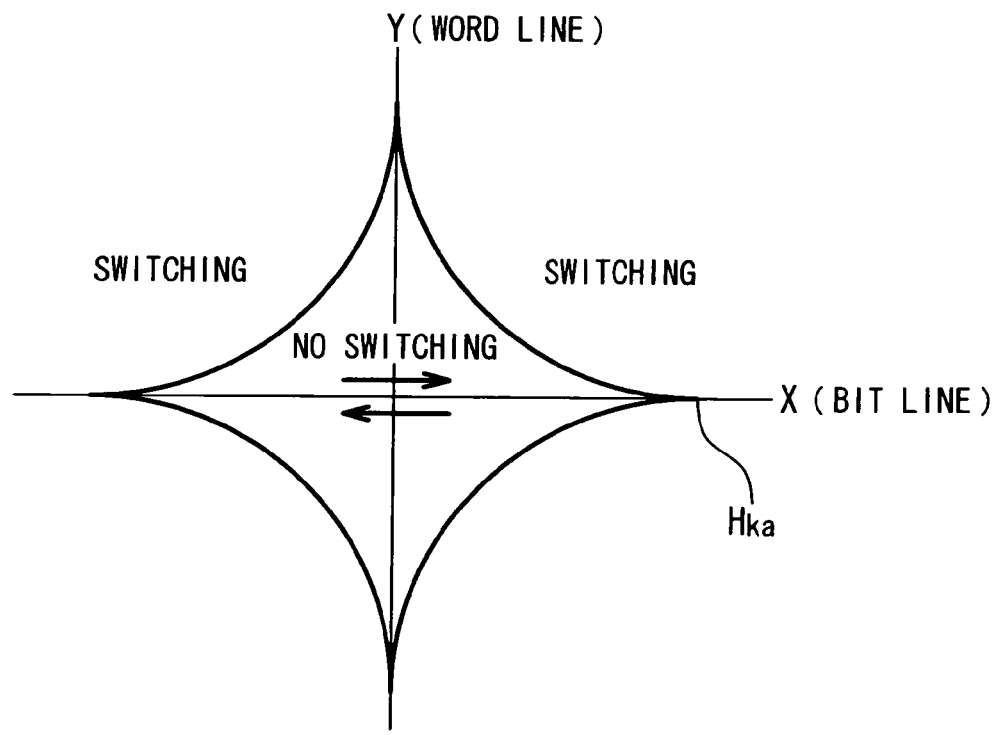
FIG. 3 is a graph for explaining asteroid characteristics of a ferromagnetic layer.
Figure 4:
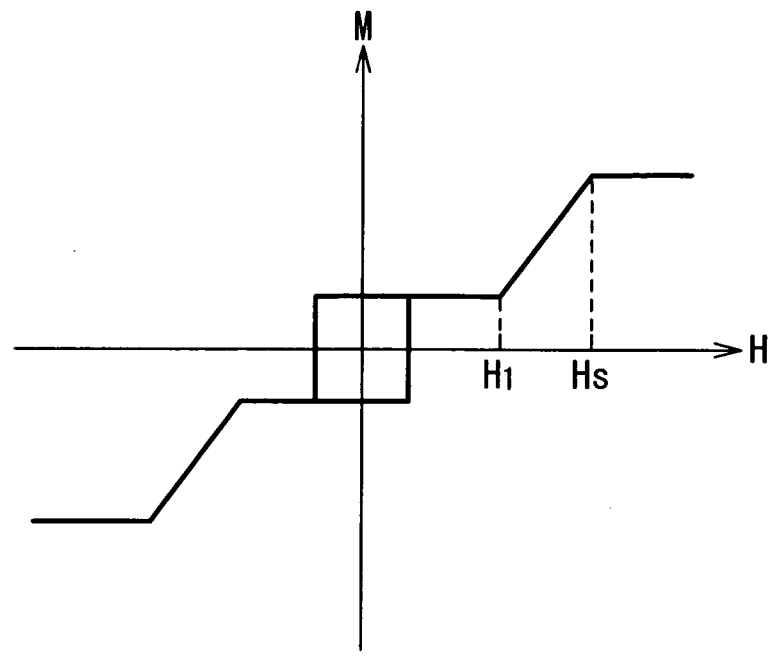
FIG. 4 is a graph illustrating a magnetization curve of an SAF having a non-zero net magnetization with the zero external magnetic field.
Figure 5:
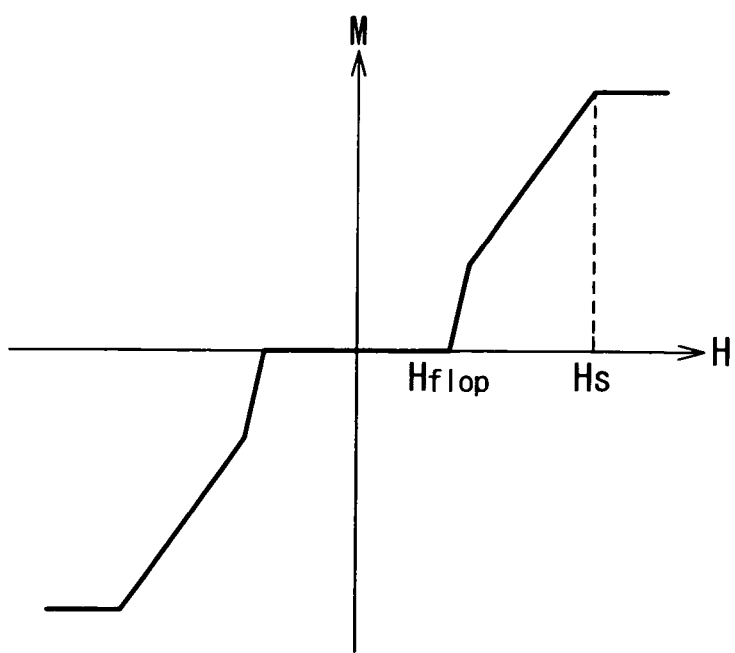
FIG. 5 is a graph illustrating a magnetization curve of an SAF having substantially zero net magnetization with no external magnetic field.
Figure 6:
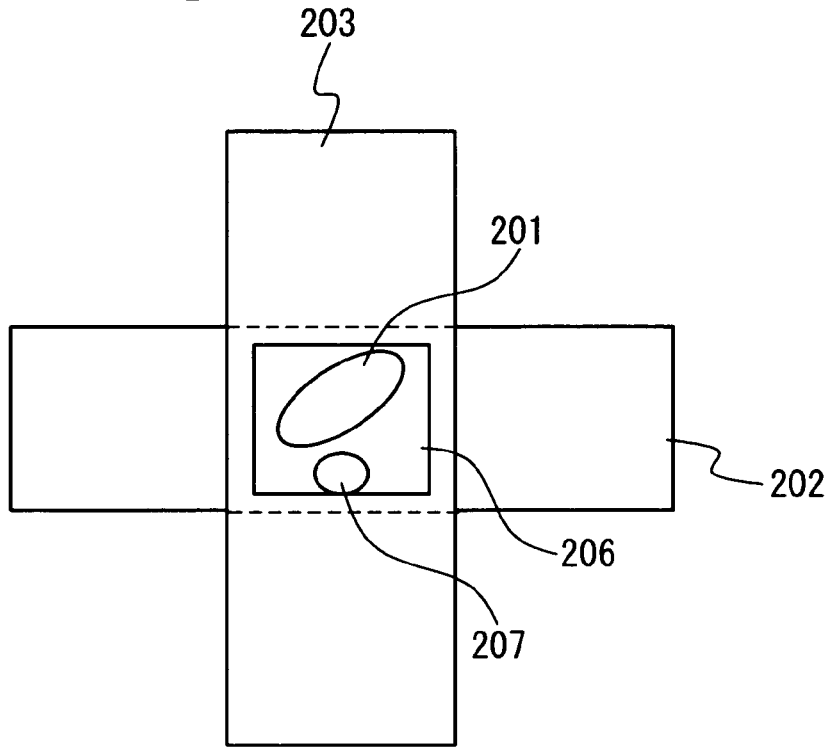
FIG. 6 is a plan view illustrating a typical structure of an MRAM adopting the toggle writing.
Figure 7:
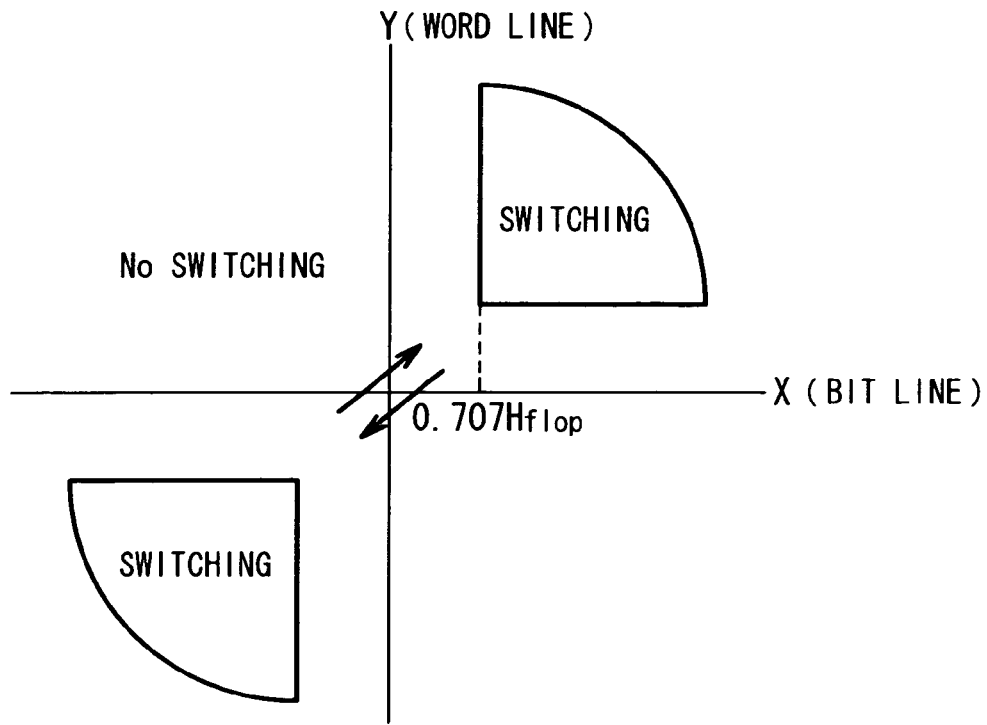
FIG. 7 is a graph for explaining an operation magnetic field region of an MRAM adopting the toggle writing.
Figure 8:
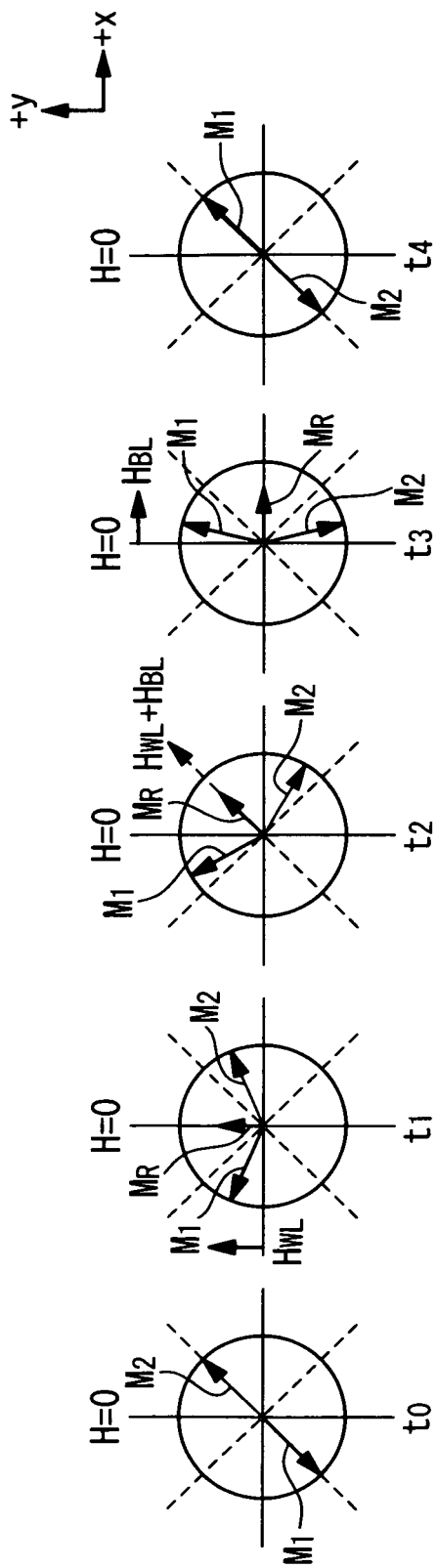
FIG. 8 is a graph for explaining a typical procedure of the toggle writing.

In one embodiment, the MRAM may be designed to implement the toggle writing. In this case, as described above with reference to FIG. 6, the magnetoresistive element, composed of the fixed magnetic layer 4, the non-magnetic layer 5 and the free magnetic layer 6, is arranged so that the longitudinal direction (that is, the direction of the easy axes of the fixed magnetic layer 4 and free magnetic layer 6) is oriented at an angle of 45 degrees to the word and bit lines. When the writing is implemented by the conventional asteroid-curve-based scheme, the magnetoresistive element is arranged so that the longitudinal direction is oriented in parallel to the word lines or the bit lines.

The free magnetic layer 6 includes a first ferromagnetic layer 11 formed on the non-magnetic layer 5, a second ferromagnetic layer 12, and a magnetic coupler 20 interposed between the first and second ferromagnetic layers 11 and 12. The free magnetic layer 6 additionally includes an AF coupling non-magnetic layer 31 formed on the second ferromagnetic layer 12, a third ferromagnetic layer 13 formed on the non-magnetic layer 31, a fourth ferromagnetic layer 14, and a magnetic coupler 21 interposed between the third and fourth ferromagnetic layers 13 and 14. A contact electrode layer 7 is formed on the fourth ferromagnetic layer 14.

The AF coupling non-magnetic layer 31 is designed to provide antiferromagnetic coupling between the second and third ferromagnetic layers 12 and 13; the stack of the second ferromagnetic layer 12, the third ferromagnetic layer 13, and the AF coupling non-magnetic layer 31 interposed therebetween functions as the SAF. The AF coupling non-magnetic layer 31 is made of material such as ruthenium, chromium, rhenium, iridium, rhodium, silver, copper and yttrium, and the film thickness thereof is adjusted so as to provide antiferromagnetic coupling. More specifically, when the AF coupling non-magnetic layer 31 is made of ruthenium, the thickness of the AF coupling non-magnetic layer 31 desirably ranges from 0.9 to 2.1 nm. When the non-magnetic layer 31 is formed of iridium, on the other hand, the thickness of the AF coupling non-magnetic layer 31 preferably ranges from 0.3 to 1.2 nm.

In this embodiment, the second and third ferromagnetic layers 12 and 13 may be composed of a single layer film made of NiFe, and CoFe. Instead, the second and third ferromagnetic layers 12, 13 may be composed of a laminated ferromagnetic film stack so as to control the strength of the antiparallel coupling. Specifically, the second and third ferromagnetic layers 12, 13 may be composed of a NiFe/CoFe film stack or a NiFe/CoFeNi film stack.

The first and fourth ferromagnetic layers 11 and 14, on the other hand, are composed of soft magnetic films that function as reversal inducing layers. The first and fourth ferromagnetic layers 11 and 14 may be made of permalloy such as $Ni_{80}Fe_{20}$, or nano-crystalline material or amorphous material of NiFeNb, NiFeB and CoFeB; these material are superior in soft magnetic property with reduced crystalline magnetic anisotropy $H_k$. Since highly-integrated MRAM cells require the shape magnetic anisotropy to be reduced for achieving magnetization reversal with a reduced magnetic field, it is desired that the thicknesses of the first and fourth ferromagnetic layers 11 and 14 are desirably reduced down to 4 nm or less. It should be noted that the coercive field $H_{soft}$ of the first and fourth ferromagnetic layers 11 and 14, which function as the reversal inducing layers, is smaller than the above-defined magnetic field $H_1$ or the spin-flop field $H_{flop}$ at which the antiferromagnetic coupling between the second and third ferromagnetic layers 12 and 13 within the SAF starts to be decoupled.

Figure 15B:
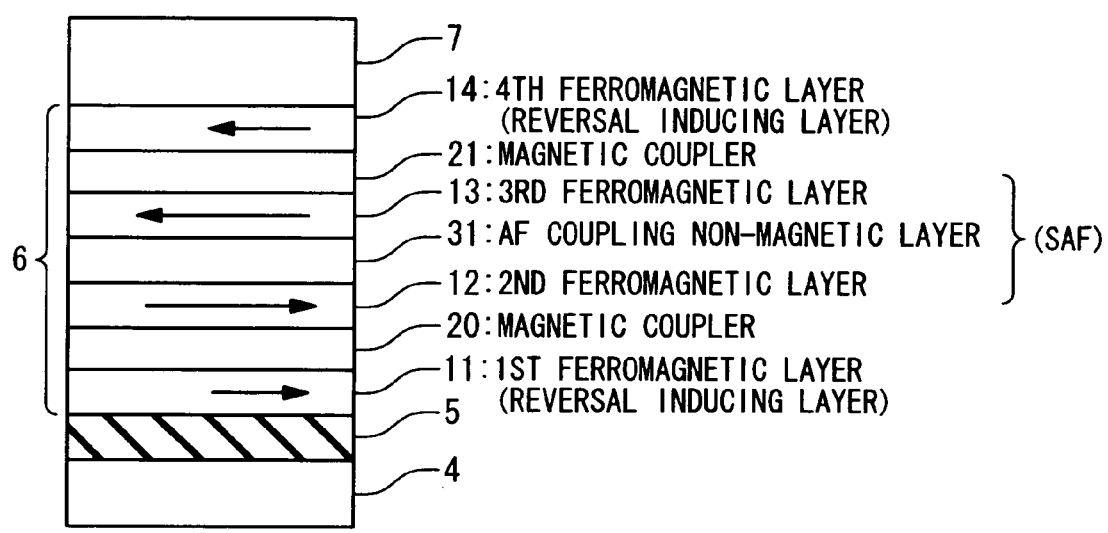
FIG. 15B is a detailed sectional view illustrating the structure of the free magnetic layer of the MRAM in the first embodiment.

In the first embodiment, as shown in FIG. 15B, the magnetizations of the first and second ferromagnetic layers 11 and 12 within the free magnetic layer 6 are kept nearly parallel over the magnetic field range used for data writing, due to the ferromagnetic coupling caused by the magnetic coupler 20. Correspondingly, the magnetizations of the third and fourth ferromagnetic layers 13 and 14 are kept nearly parallel due to the ferromagnetic coupling caused by the magnetic coupler 21.

It should be noted that the directions of the magnetizations of the first and fourth ferromagnetic layers 11 and 14, which function as the reversal inducing layers, are antiparallel for the zero external magnetic field. One of the two reversal inducing layers having magnetizations oriented in antiparallel always provides the reversal inducing effect for the SAF, regardless of which state of the two allowed state the free magnetic layer 6 is originally placed in.

It is preferable that the magnetic properties of the second and third ferromagnetic layers 12 and 13 within the SAF are identical. For example, the second and third ferromagnetic layers 12 and 13 are preferably made of the same material, having the same thickness. Correspondingly, it is preferable that the magnetic properties of the first and fourth ferromagnetic layers 11 and 14, which function as the reversal inducing layers, are identical. It should be noted, however, that slight differences may be allowed. The free magnetic layer 6 exhibits the spin-flop, when the sum of the magnetization-thickness products of the first and second ferromagnetic layers 11 and 12 is almost equal to the sum of the magnetization-thickness products of the third and fourth ferromagnetic layers 13 and 14.

Any of the above-described four kinds of the magnetic couplers may be used as the magnetic couplers 20 and 21. In any case, the magnetic couplers 20 and 21 are designed to provide moderate ferromagnetic couplings between the first and second ferromagnetic layers 11 and 12, and between the third and fourth ferromagnetic layers 13 and 14, respectively, through the exchange interaction. It should be noted that it is important to sufficiently weaken the ferromagnetic coupling to the extent that the ferromagnetic coupling between the magnetizations of the first and second ferromagnetic layers 11 and 12, and the ferromagnetic coupling between the third and fourth ferromagnetic layers 13 and 14 in the magnetic field range used for data writing.

In one embodiment, the magnetic couplers 20 and 21 may be formed of non-magnetic layers with pinholes. The pinholes of the magnetic coupler 20 provide partial direct contacts between the first and second ferromagnetic layers 11 and 12, and thereby provide ferromagnetic coupling between the first and second ferromagnetic layers 11 and 12. Correspondingly, The pinholes of the magnetic coupler 21 provides partial direct contacts between the third and fourth ferromagnetic layers 13 and 14, and thereby provide ferromagnetic coupling between the third and fourth ferromagnetic layers 13 and 14.

In this case, the magnetic couplers 20 and 21 are preferably made of material selected from a group of tantalum, ruthenium, manganese, barium, calcium, lithium, niobium, vanadium, osmium, rhodium, iridium, titanium, zirconium, hafnium, copper, silver, gold, platinum, chromium, molybdenum, tungsten, aluminum, magnesium, silicone, yttrium, cerium, palladium, rhenium, the oxides thereof, the nitrides thereof and the carbides thereof. The average thicknesses of the magnetic couplers 20 and 21 preferably range from 0.4 to 1.0 nm.

Figure 17A:
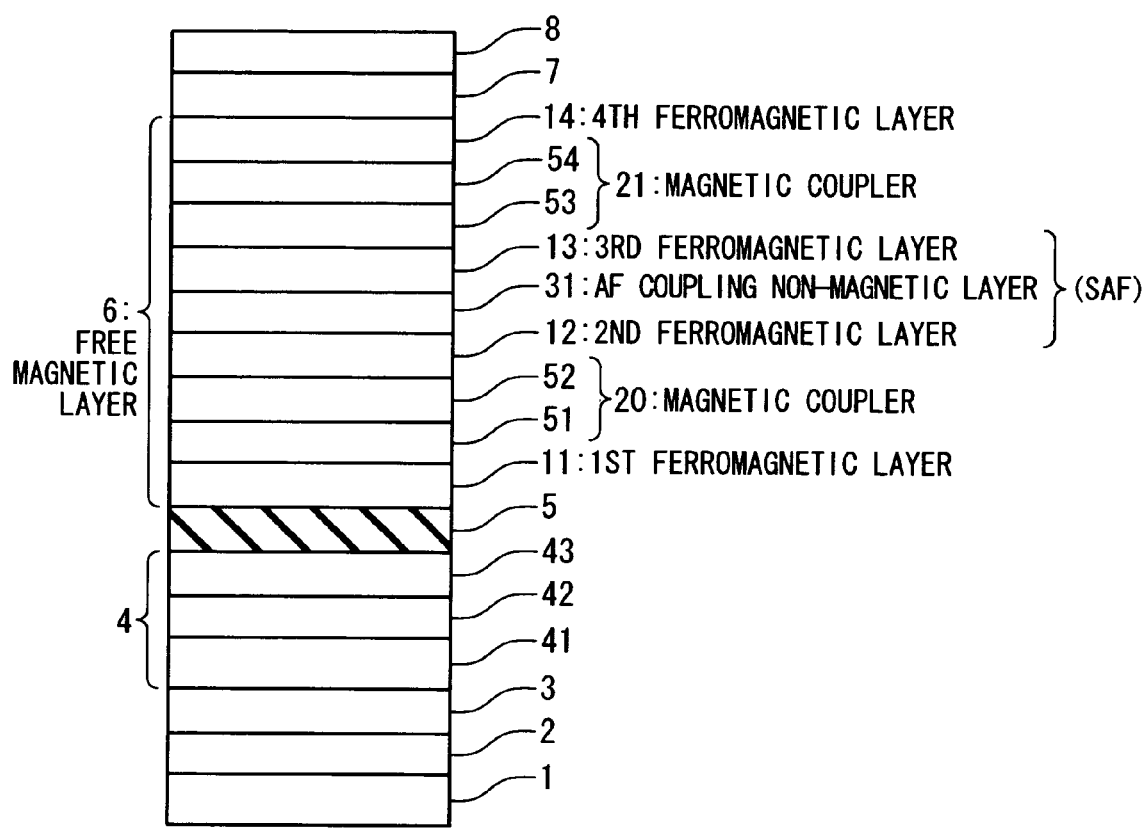
FIG. 17A is a sectional view illustrating another exemplary structure of the MRAM in the first embodiment.

The magnetic couplers 20 and 21 may be composed by complex material, alloy, or a multilayer stack of multiple non-magnetic elements for enhancing the performances of the free magnetic layer 6 and the magnetoresistive element. FIG. 17A illustrates an exemplary structure of the free magnetic layer 6 in which the magnetic coupler 20 is composed by multiple non-magnetic films 51 and 52 made of different non-magnetic elements, and the magnetic coupler 21 is composed of multiple non-magnetic films 53 and 54 made of different non-magnetic elements. The magnetic coupler 20 formed of an ultra thin non-magnetic layer has a considerable effect on the crystal growth of the layers formed thereon or thereover, particularly on the crystal growth of the non-magnetic layer 31. The inventor has discovered that the antiparallel coupling energy $J_{SAF}$ caused by the non-magnetic layer 31 depends on the crystal orientation of the non-magnetic layer 31. Therefore, the optimization of the crystal orientation of the non-magnetic layer 31 by appropriate design of the magnetic coupler 20 effectively achieves the toggle writing. From another viewpoint, the magnetoresistance ratio and the element resistance depend on the material of the magnetic coupler 20, since the magnetic coupler 20 is close to the non-magnetic layer 5.

In order to obtain improved magnetic characteristics, the magnetic couplers 20 and 21 are preferably composed of complex material, alloy or a multilayer stack of two or more non-magnetic elements selected from a group consisting of tantalum, ruthenium, manganese, barium, calcium, lithium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium and rhenium. The magnetic couplers 20 and 21 may be made of the oxide, nitride or carbide of the above-listed non-magnetic elements to improve the thermal stability. The use of the magnetic coupler including at least one thermally-stable material is preferable in view of the improvement of the thermal resistance of the MRAM cells.

Figure 17B:
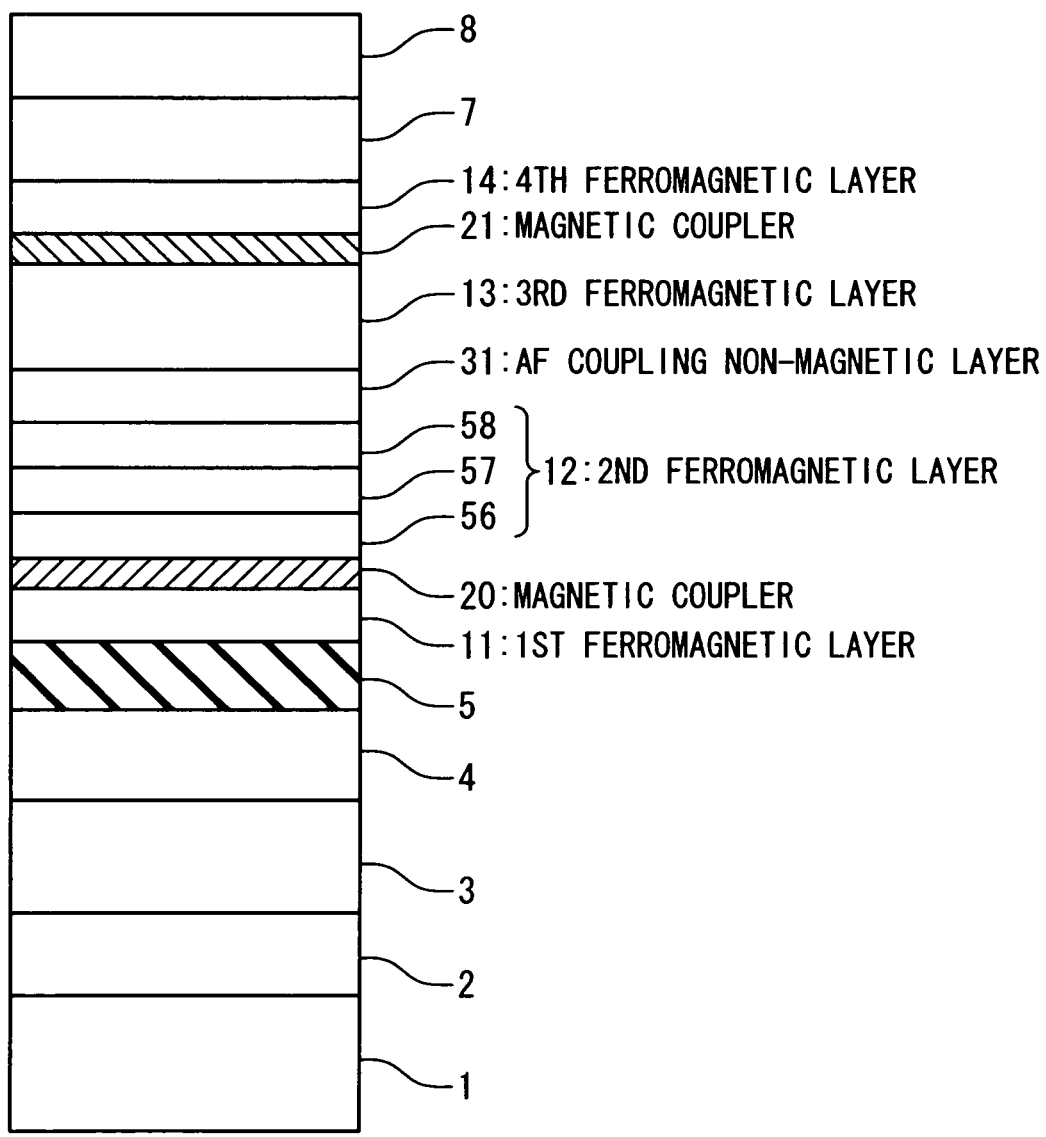
FIG. 17B is a sectional view illustrating still another exemplary structure of the MRAM in the first embodiment.

FIG. 17B illustrates an exemplary structure of the free magnetic layer 6 designed to achieve thermal stability of magnetic characteristics and the magnetoresistance ratio. The magnetic couplers 20 and 21 are made of the oxide, nitride or carbide of magnesium, aluminum, silicon, germanium, lithium, beryllium, barium, calcium, titanium, vanadium, chromium, manganese, zirconium, hafnium, tantalum, niobium, chromium, molybdenum, cerium, yttrium and lanthanum. Furthermore, the second ferromagnetic layer 12 is composed of three layers: a first ferromagnetic film 56, an antiferromagnetic coupling control film 57, and a second ferromagnetic film 58. The first and second ferromagnetic films 56 and 58 may be made of NiFe and NiFeCo, and the antiferromagnetic coupling control film 57 may be formed of an ultra thin film of Ta, Zr, Mo, Hf, Nb or W. Alternatively the antiferromagnetic coupling control film 57 may be composed by a ferromagnetic film of complex material of the above elements and ferromagnetic elements. One important feature of the antiferromagnetic coupling control film 57 is that the magnetic coupling between the first and second ferromagnetic films 56 and 58 is not completely decoupled. One function of the antiferromagnetic coupling control film 57 is to control the crystallinity of the AF coupling non-magnetic layer 31 within the SAF. The magnetic coupler 20 having high stability functions as a diffusion barrier layer that avoid the non-magnetic element contained in the antiferromagnetic coupling control film 57 being diffused into the non-magnetic layer 5, thereby preventing the degradation of the magnetoresistance ratio. In addition, the magnetic coupler 20 itself hardly suffers from interdiffusion with the adjacent magnetic films (that is, the first ferromagnetic layer 11 and the first ferromagnetic film 56), which stabilizes the ferromagnetic coupling caused by the magnetic coupler 20.

Alternatively, the magnetic couplers 20 and 21 may be designed to exhibit the RKKY ferromagnetic coupling. In this case, the magnetic couplers 20 and 21 are designed to provide appropriately-controlled ferromagnetic coupling for orienting the magnetizations of the first and second ferromagnetic layers 11 and 12 in parallel, and for orienting the magnetizations of the third and fourth ferromagnetic layers 13 and 14 in parallel. The magnetic couplers 20 and 21 may be made of ruthenium, chromium, rhenium, iridium, rhodium, silver, copper, or yttrium. When the magnetic couplers 20 and 21 are made of ruthenium, the magnetic couplers 20 and 21 preferably have a thickness from 1.4 to 2.7 nm in order to appropriately control the strength of the ferromagnetic coupling.

3. Second Embodiment

Figure 16A:
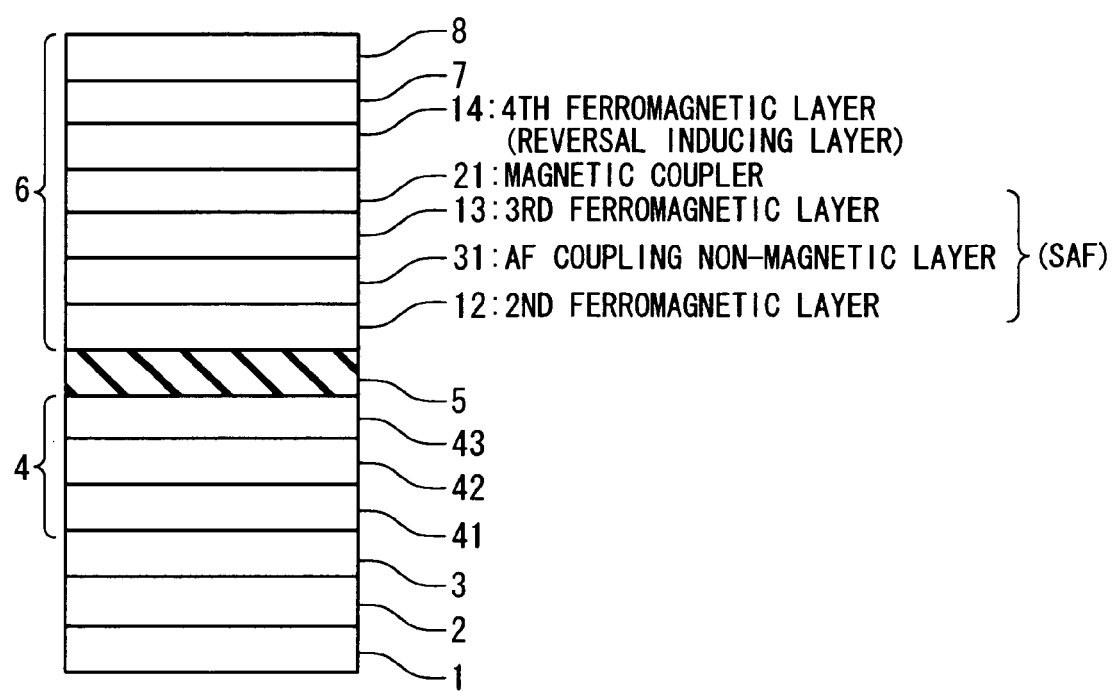
FIG. 16A is a sectional view illustrating an exemplary structure of an MRAM in a second embodiment.

FIG. 16A is a sectional view illustrating an exemplary structure of a memory cell of an MRAM in a second embodiment of the present invention. In this embodiment, the free magnetic layer 6 within the MRAM cell is designed differently from the free magnetic layer 6 presented in the first embodiment.

Differently from the MRAM in the first embodiment which includes two magnetic couplers and two reversal inducing layers, the MRAM in the second embodiment incorporates one magnetic coupler and one reversal inducing layer within the free magnetic layer 6 is provided with. More specifically, the free magnetic layer 6 is provided with a second ferromagnetic layer 12 formed on the non-magnetic layer 5, a non-magnetic layer 31 formed thereon, a third ferromagnetic layer 13 formed on the non-magnetic layer 31, a fourth ferromagnetic layer 14, and a magnetic coupler 21 interposed between the third and fourth ferromagnetic layers 13 and 14. The contact electrode layer 7 is formed on the fourth ferromagnetic layer 14. The stack of the second ferromagnetic layer 12, the non-magnetic layer 31 and the third ferromagnetic layer 13 function as an SAF, and the fourth ferromagnetic layer 14 functions as a reversal inducing layer. The magnetization-thickness product of the second ferromagnetic layer 12 is preferably adjusted to be identical to the sum of the magnetization-thickness products of the third and fourth ferromagnetic layers 13 and 14.

It should be noted that the SAF consisting of the second ferromagnetic layer 12, the non-magnetic layer 31, and the third ferromagnetic layer 13 is directly formed on the non-magnetic layer 5, and the free magnetic layer 6 shown in FIG. 16A incorporates only one reversal inducing layer. The free magnetic layer 6 with only one magnetic coupler and only one reversal inducing layer effectively allows the spin-flop with a reduced magnetic field with respect to data writing when the free magnetic layer 6 is placed in a certain one of the two allowed states.

Figure 16B:
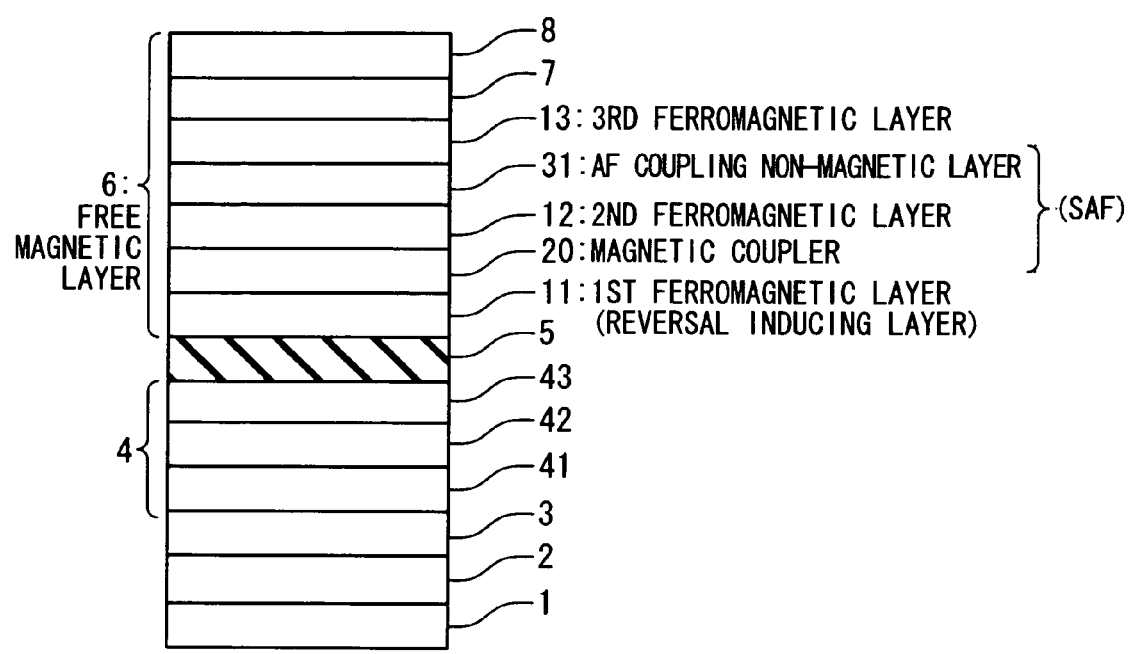
FIG. 16B is a sectional view illustrating another exemplary structure of an MRAM in the second embodiment.

FIG. 16B is another preferred structure of an MRAM cell in the second embodiment. The free magnetic layer 6 includes a first ferromagnetic layer 11 formed on the non-magnetic layer 5, a second ferromagnetic layer 12, and a magnetic coupler 20 interposed between the first and second ferromagnetic layers 11 and 12. The free magnetic layer 6 additionally includes a non-magnetic layer 31 formed on the second ferromagnetic layer 12 and a third ferromagnetic layer 13 formed on the non-magnetic layer 31. The stack of the second ferromagnetic layer 12, the non-magnetic layer 31 and the third ferromagnetic layer 13 functions as an SAF, and the first ferromagnetic layer 11 functions as a reversal inducing layer. The magnetization-thickness product of the third ferromagnetic layer 13 is adjusted to be almost identical to the sum of the magnetization-thickness products of the first and second ferromagnetic layers 11 and 12.

In the second embodiment, the magnetic couplers 20 and 21 may be structured in the same way as those in the first embodiment.

4. Third Embodiment

Figure 18A:
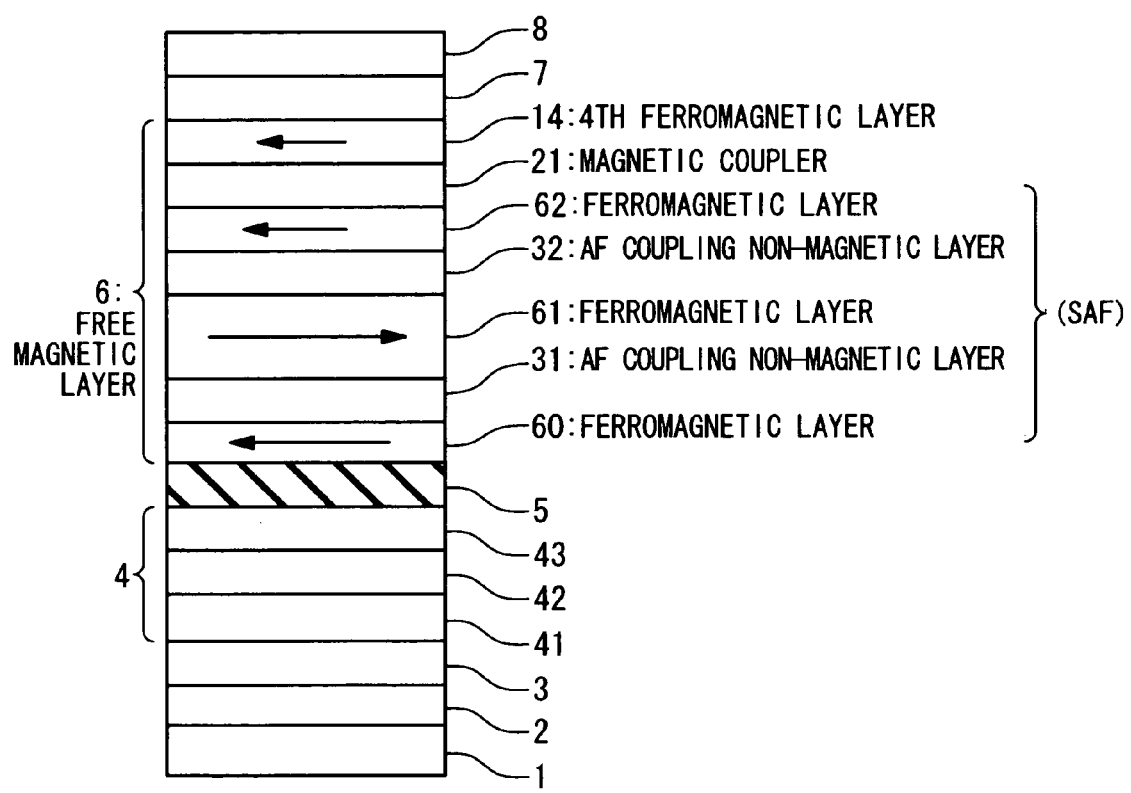
FIG. 18A is a sectional view illustrating an exemplary structure of an MRAM in a third embodiment.

In a third embodiment, the free ferromagnetic layer 6 incorporates a multilayer SAF composed of three or more ferromagnetic layers, adjacent two of which are antiferromagnetically coupled. The use of the multilayer SAF does not deteriorate the reversal inducing effect of the present invention. FIGS. 18A and 18B illustrate exemplary structures in the third embodiment.

An MRAM shown in FIG. 18A is provided with a free magnetic layer 6 incorporating an SAF composed of three ferromagnetic layers and a reversal inducing layer. The structure of the MRAM shown in FIG. 18A is identical to that described in the first embodiment, except for the structure of the free magnetic layer 6. In the MRAM shown in FIG. 18A, a ferromagnetic layer 60 is provided on the non-magnetic layer 5. Additionally, a multilayer stack composed of an AF coupling non-magnetic layer 31, a ferromagnetic layer 61, an AF coupling non-magnetic layer 32, and a ferromagnetic layer 62 is formed on the ferromagnetic layer 60. The AF coupling non-magnetic layers 31 and 32 are designed to provide antiferromagnetic coupling. In one embodiment, the AF coupling non-magnetic layers 31 and 32 are each formed of a ruthenium film having a thickness around 0.9 nm, 2.1 nm or 3.5 nm. The stack of the ferromagnetic layer 60, the non-magnetic layer 31, the ferromagnetic layer 61, the non-magnetic layer 32 and the ferromagnetic layers 62 functions as an SAF, and adjacent two of the ferromagnetic layers are antiferromagnetically coupled with the zero external magnetic field. A magnetic coupler 21 is provided on the ferromagnetic layer 62 and a fourth ferromagnetic layer 14 is formed on the magnetic coupler 21. The fourth ferromagnetic layer 14 is composed of a soft magnetic layer that functions as a reversal inducing layer. The magnetic coupler 21 provides ferromagnetic coupling between the ferromagnetic layer 62 and the fourth ferromagnetic layer 14 with desired strength.

It should be noted that the free magnetic layer 6 is not limited to incorporate the SAF composed of three ferromagnetic layers and only one reversal inducing layer ferromagnetically coupled with the SAF, as illustrated in FIG. 18A. In an alternative embodiment, the free ferromagnetic layer may include an SAF composed of four ferromagnetic layers and two reversal inducing layers that are respectively coupled by magnetic couplers on the top and bottom of the SAF. In this case, remarkable reduction in the spin-flop field is achieved by the two reversal inducing layers, which have antiparallelly-oriented magnetizations.

The free magnetic layer 6 may include multiple SAFs. FIG. 18B illustrates an exemplary structure of an MRAM in which the free magnetic layer 6 is composed of two SAFS and two reversal inducing layers. A ferromagnetic layer 60 is provided on the non-magnetic layer 5, and a non-magnetic layer 31, a ferromagnetic layer 61, a magnetic coupler 22, a first ferromagnetic layer 11, a magnetic coupler 23, a ferromagnetic layer 63, a non-magnetic layer 32, a ferromagnetic layer 64, a magnetic coupler 24 and a fourth ferromagnetic layer 14 are laminated in this order.

The stack of the ferromagnetic layer 60, the non-magnetic layer 31, and the ferromagnetic layer 61 functions as a first SAF. Correspondingly, the stack of the ferromagnetic layer 63, the non-magnetic layer 32 and the ferromagnetic layer 64 functions as a second SAF. The ferromagnetic layers within the respective SAFs are antiferromagnetically coupled by the non-magnetic layers 31 and 32. The first ferromagnetic layer 11 and the fourth ferromagnetic layer 14 are made of magnetically soft ferromagnetic material, and function as reversal inducing layers. The first ferromagnetic layer 11 is ferromagnetically coupled with both the first SAF and the second SAF by the magnetic couplers 22 and 23, respectively, and the fourth ferromagnetic layer 14 is ferromagnetically coupled with only the second SAF by the magnetic coupler 24. FIG. 18B illustrates the directions of the magnetizations of the respective ferromagnetic layers with the zero external magnetic field. It should be noted that the magnetizations of the first ferromagnetic layer 11 and the fourth ferromagnetic layer 14, which function as the reversal inducing layers, are oriented in antiparallel. The coercive field $H_{soft}$ of the reversal inducing layers (that is, the first and fourth ferromagnetic layers 11 and 14) must be adjusted to be smaller than any of the magnetic fields at which the antiferromagnetic couplings of the magnetizations within the first and second SAFs start to be decoupled.

For the MRAM shown in FIG. 18A, the sum of the magnetization-thickness products of the ferromagnetic layer 60, the ferromagnetic layer 62 and the fourth ferromagnetic layer 14 is preferably to adjusted to be identical to the magnetization-thickness products of the ferromagnetic layer 61, when all the write operations are implemented by using the toggle writing, excluding the direct mode writing. For the MRAM shown in FIG. 18, on the other hand, the sum of magnetization-thickness products of the ferromagnetic layer 60, the ferromagnetic layer 64 and the fourth ferromagnetic layer 14 is adjusted to the sum of the magnetization-thickness products of the ferromagnetic layer 61, the first ferromagnetic layer 11 and the ferromagnetic layer 63.

5. Fourth Embodiment

The reversal inducing technique for the SAF presented above is also applicable to a magnetic film stack provided separately from the free magnetic layer 6. Such magnetic film stack provides a soft ferromagnetic property, allowing magnetization reversal with a reduced magnetic field, as compared with a conventional magnetic film and a multilayer magnetic stack. From the viewpoint of the soft ferromagnetic property, a magnetic film stack to which the above-described reversal inducing technique is applied is also suitable for a bias field generating layer that generates a bias magnetic field to enhance the magnetization reversal of the SAF, and for a high permeability layer for concentrating a magnetic field generated by an interconnection, such as a word line and a bit line.

Figure 18C:
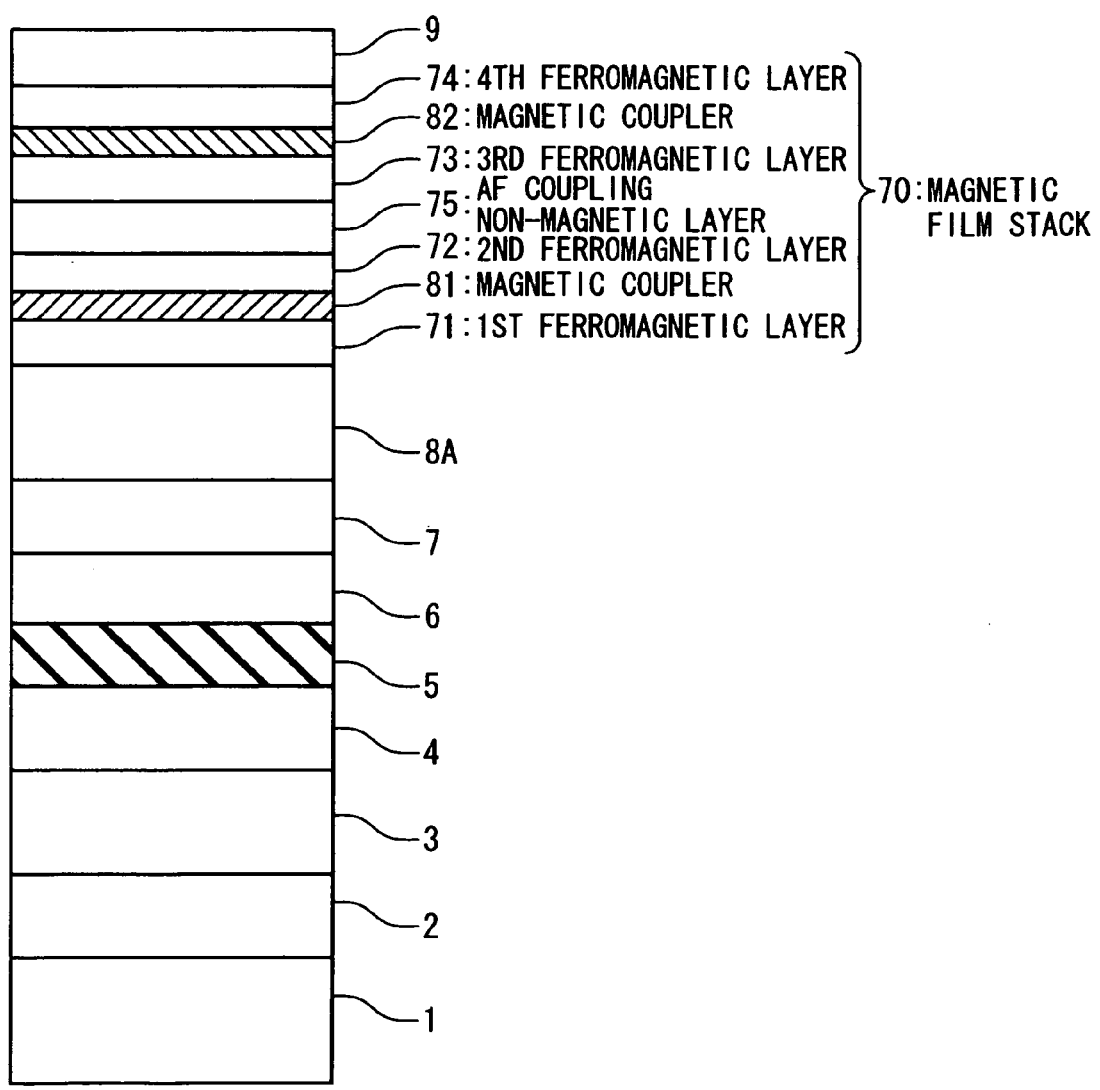
FIG. 18C is a sectional view illustrating an exemplary structure of an MRAM in a fourth embodiment.

FIG. 18C illustrates a magnetic film stack 70 that is used as a high permeability layer for concentrating a magnetic field generated by an upper interconnection 8A. The magnetic film stack 70 is provided on the upper interconnection 8A. The magnetic film stack 70 is composed of a first reversal inducing layer 71, a first magnetic coupler 81, a first ferromagnetic layer 72, an antiparallel coupling ferromagnetic layer 75, a second ferromagnetic layer 73, a second magnetic coupler 82 and a second reversal inducing layer 74. The magnetic film stack 70 is structured in the same way as the free magnetic layer 6 described in the above first embodiment.

EXPERIMENTAL RESULTS

1. First Experiment

The first experiment is directed to the reduction in the spin-flop field of the SAF with an increased saturation field in the structure of FIG. 15A, through interposing the magnetic couplers 20 and 21 between the first and second ferromagnetic layers 11 and 12, and between the third and fourth ferromagnetic layers 13 and 14 to thereby control the ferromagnetic coupling energy $J_C$ caused by the magnetic couplers 20 and 21.

In the following experiments, all samples including embodiments and comparative examples are formed thorough a magnetron sputtering technique and a radical oxidization technique that uses an oxygen and argon plasma generated by high-frequency power supply. The samples are subjected to heat treatment at 275° C. for 5 hours after the film deposition. The magnetization curves of the free magnetic layers of the respective samples are measured after the sample preparation. The samples have the following structure:

Substrate/Ta(20 nm)/Al(1 nm)O$_x$/free magnetic layer/
Al(0.7 nm)O$_x$/Ta(10 nm)

The free magnetic layers of the respective samples have the following structure:
Free Magnetic Layer Structure "1":

Ni$_{81}$Fe$_{19}$/X$_1$/Ni$_{81}$Fe$_{19}$/Ru(2.1 nm)/Ni$_{81}$Fe$_{19}$/X$_2$/
Ni$_{81}$Fe$_{19}$

In the free magnetic layer structure "1", $X_1$ and $X_2$ denote magnetic couplers, which are made of various materials and have various film thicknesses. The thickness of the Ni$_{81}$Fe$_{19}$ film is also varied in accordance with free magnetic layer structures to be evaluated. The "Al(1 nm)O$_x$" film indicates an AlO$_x$ film formed by oxidizing an Al film of 1 nm. Correspondingly, the "Al(0.7 nm)O$_x$" film indicates an AlOx film formed by oxidizing an aluminum film of 0.7 nm. The former AlOx films correspond to tunnel barrier layers, and the latter AlOx films are used as cap layers.

Additionally, samples having the following free magnetic layer structure are produced, and magnetization curves thereof are measured so as to evaluate crystalline anisotropy fields $H_k$ of the respective magnetic layers within the free magnetic layer films.
Free Magnetic Layer Structure "2":

Substrate/Ta(20 nm)/Al(1 nm)O$_x$/Ni$_{81}$Fe$_{19}$X$_1$/
Ni$_{81}$Fe$_{19}$/Ru(2.1 nm)/Ta(10 nm)

Furthermore, samples having the following free magnetic layer structure are prepared so as to measure the spin-flop fields $H_{flop}$ and the saturation fields $H_S$ of the respective SAFs in the free magnetic layers, and the magnetization curves thereof are measured:
Free Magnetic Layer Structure "3":

X$_1$/Ni$_{81}$Fe$_{19}$/Ru(2.1 nm)/Ni$_{81}$Fe$_{19}$/X$_2$

Experiment 1-1

Firstly, samples incorporating magnetic couplers $X_1$, $X_2$ each formed of a Ta film are prepared. The ferromagnetic coupling energies $J_C$ thereof are controlled by the film thicknesses of the Ta films. The spin flop characteristics of the free magnetic layers thus constructed are given in the following.

Sample 1 (Comparative Example):

$Ni_{81}Fe_{19}$(2.1 nm)/Ta(0.3 nm)/$Ni_{81}Fe_{19}$(2.1 nm)/Ru (2.1 nm)/$Ni_{81}Fe_{19}$(2.1 nm)/Ta(0.3 nm)/$Ni_{81}Fe_{19}$ (2.1 nm)

Sample 2 (Embodiment):

$Ni_{81}Fe_{19}$(2.2 nm)/Ta(0.5 nm)/$Ni_{81}Fe_{19}$(2.2 nm)/Ru (2.1 nm)/$Ni_{81}Fe_{19}$(2.2 nm)/Ta(0.5 nm)/$Ni_{81}Fe_{19}$ (2.2 nm)

Sample 3 (Embodiment):

$Ni_{81}Fe_{19}$(2.3 nm)/Ta(0.6 nm)/$Ni_{81}Fe_{19}$(2.3 nm)/Ru (2.1 nm)/$Ni_{81}Fe_{19}$(2.3 nm)/Ta(0.6 nm)/$Ni_{81}Fe_{19}$ (2.3 nm)

Sample 4 (Comparative Example):

$Ni_{81}Fe_{19}$(2.4 nm)/Ta(0.7 nm)/$Ni_{81}Fe_{19}$(2.4 nm)/Ru (2.1 nm)/$Ni_{81}Fe_{19}$(2.4 nm)/Ta(0.7 nm)/$Ni_{81}Fe_{19}$ (2.4 nm)

Sample 5 (Comparative Example):

$Ni_{81}Fe_{19}$(2.5 nm)/Ta(0.8 nm)/$Ni_{81}Fe_{19}$(2.5 nm)/Ru (2.1 nm)/$Ni_{81}Fe_{19}$(2.5 nm)/Ta (0.8 nm)/$Ni_{81}Fe_{19}$ (2.5 nm)

Sample 6 (Embodiment):

$Ni_{81}Fe_{19}$(2.2 nm)/Ta(0.5 nm)/$Ni_{81}Fe_{19}$(2.2 nm)/Ru (2.1 nm)/$Ni_{81}Fe_{19}$(3.3 nm)

The thickness of the NiFe film of the free magnetic layer within each sample is slightly adjusted according to the thickness of the intermediate Ta film, so that the magnetization-thickness products of the $Ni_{81}Fe_{19}$/Ta/$Ni_{81}Fe_{19}$ film stack is approximately 2.9 T·nm. The NiFe ferromagnetic films positioned on the top and/or bottom of the SAF functions as the reversal inducing layers, having a magnetization-thickness product of about 1.45 T·nm. The stack of the NiFe ferromagnetic films and the Ru films interposed therebetween functions as an SAF. The NiFe ferromagnetic films within the SAF have a magnetization film thickness product of about 1.45 T·nm.

Figure 19A:
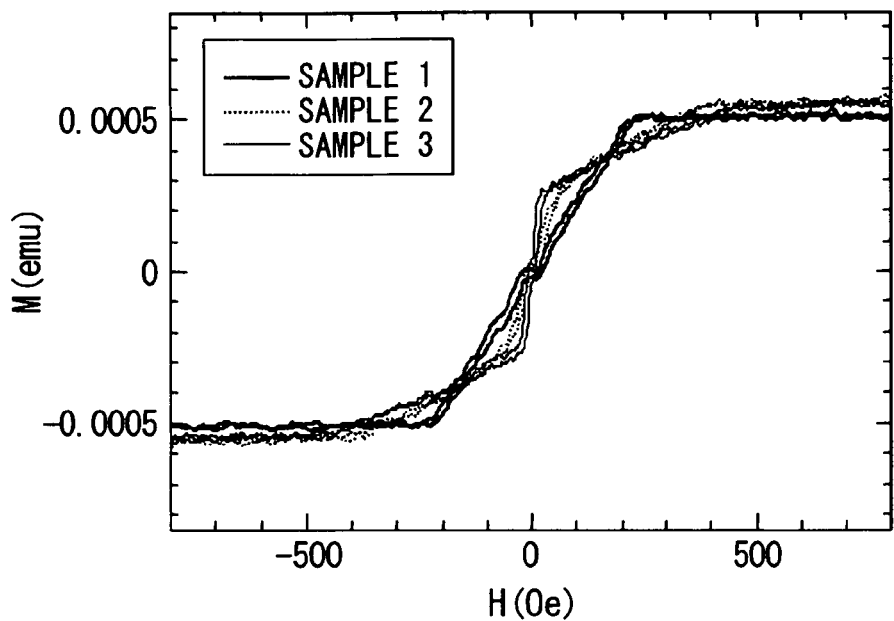
FIG. 19A is a graph illustrating magnetization curves of free magnetic layers of Sample 1 which is a comparative example, and Samples 2 and 3 which are embodiments of the present invention.
Figure 19B:
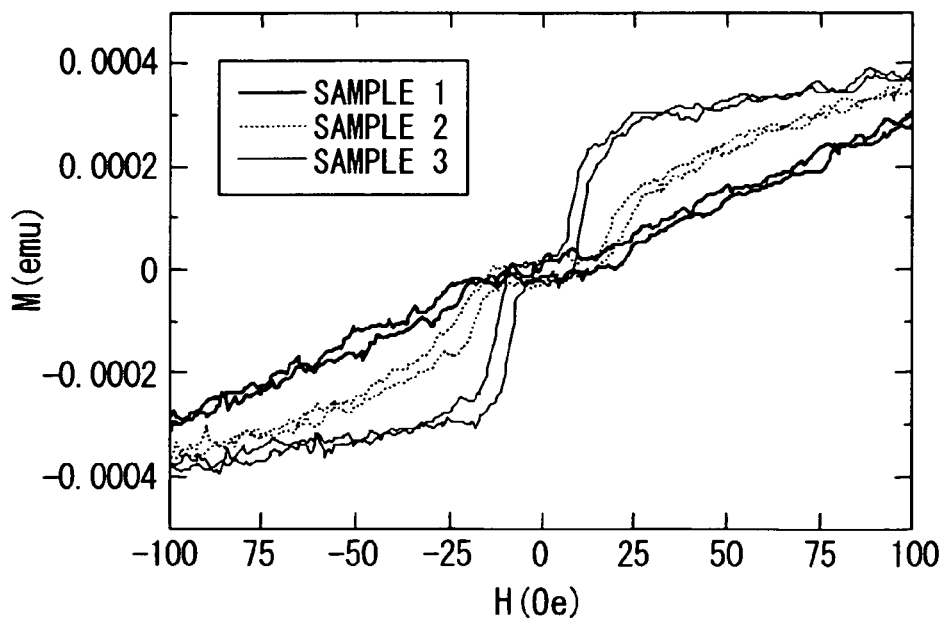
FIG. 19B is a graph illustrating enlarged magnetization curves around the zero external field of the free magnetic layers of Sample 1 to 3.
Figure 20A:
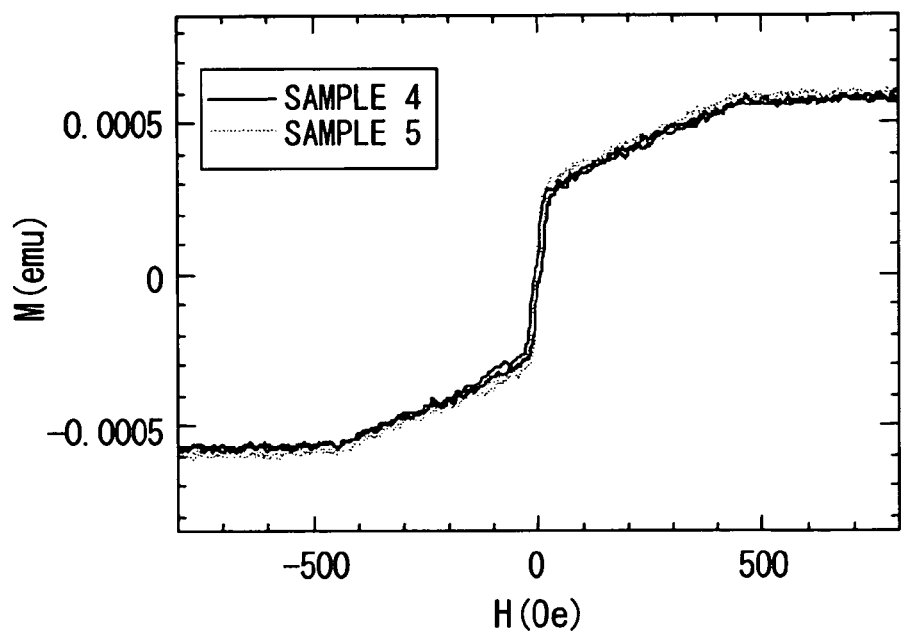
FIG. 20A is a graph illustrating magnetization curves of free magnetic layers of Samples 4 and 5 which are comparative examples.
Figure 20B:
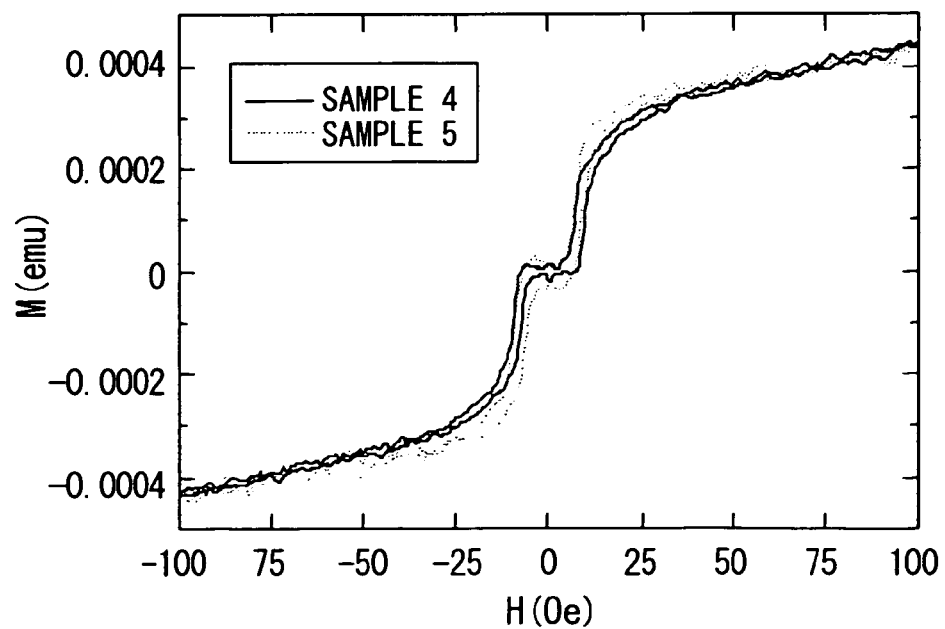
FIG. 20B is a graph illustrating enlarged magnetization curves around near the zero external field of the free magnetic layers of Samples 4 and 5.
Figure 21A:
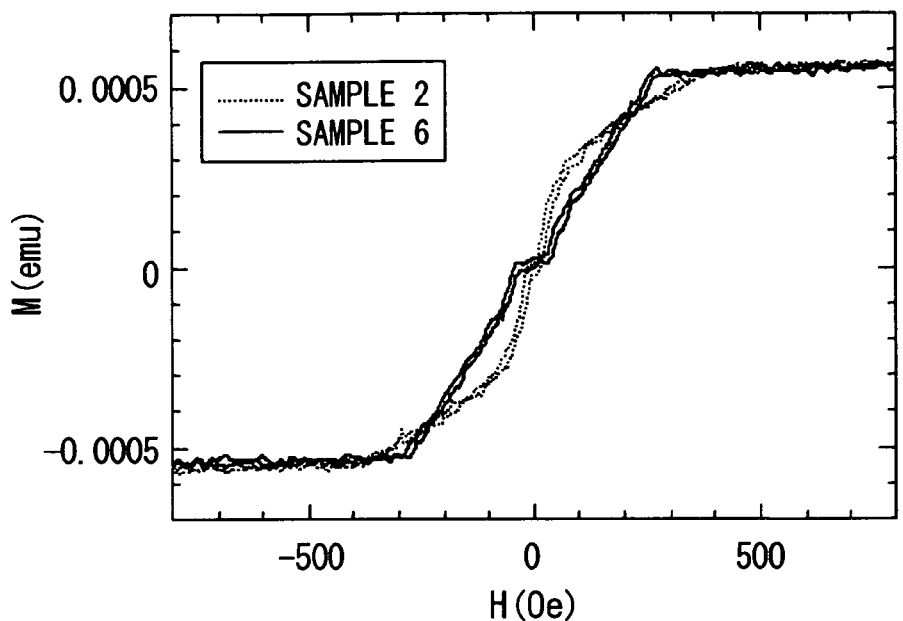
FIG. 21A is a graph illustrating magnetization curves of free magnetic layers of Samples 2 and 6 which are embodiments of the present invention.
Figure 21B:
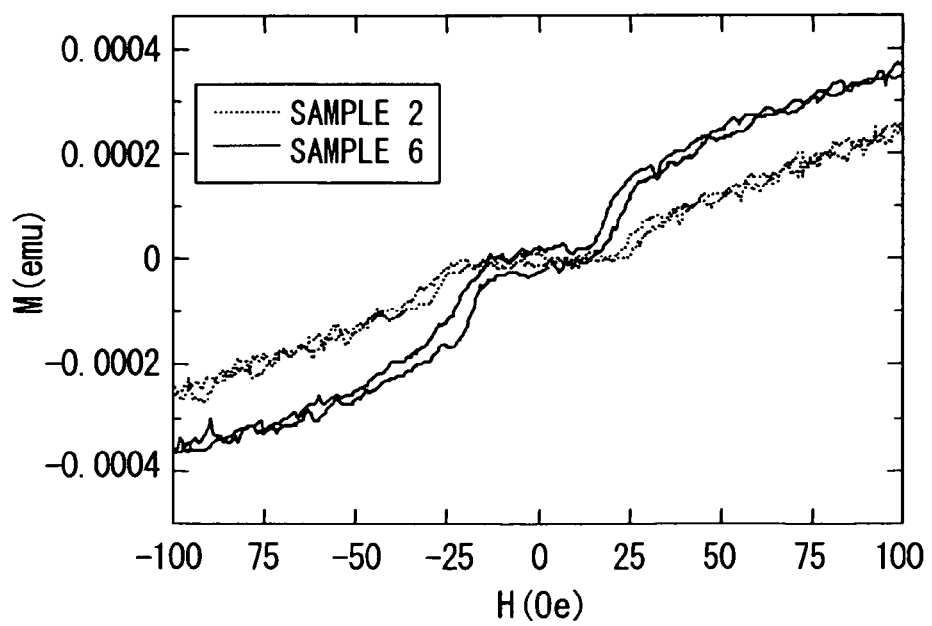
FIG. 21B is a graph illustrating enlarged magnetization curves around the zero external field of the free magnetic layers of Samples 2, 6.

FIGS. 19A, 19B illustrate magnetization curves in the direction of the easy axis for Samples 1 to 3, and FIGS. 20A and 20B illustrate magnetization curves for Samples 4 and 5. Additionally, FIGS. 21A and 21B illustrate magnetization curves of Samples 2 and 6. Finally, FIG. 25A illustrate the following obtained characteristics: the saturation fields $H_S$ of Samples 1 to 6 obtained from the magnetization curves; the crystalline anisotropy fields $H_k$ of the NiFe layers obtained by evaluating the samples of the free magnetic layer structure "2"; estimated spin-flop fields $H_{flop}'$ ($=H_S \cdot H_k)^{0.5}$ obtained from the measured saturation fields $H_S$ and crystalline anisotropy fields $H_k$; and the actually measured spin-flop fields $H_{flop}$.

As shown in FIGS. 19A, 19B, Sample 1 (comparative example) has a magnetization curve like a usual SAF that exhibits the spin-flop, and the estimated spin-flop field $H_{flop}'$ is also approximately equal to the measured spin-flop field $H_{flop}$. On the contrary, the shapes of the magnetization curves of Samples 2 and 3 (embodiments of the present invention) are different from that of Sample 1, and the spin-flop fields $H_{flop}$ of Sample 2 and 3 are smaller than that of Sample 1. The magnetization curves of Samples 2 and 3 indicate that the spin-flop fields $H_{flop}$ decreases as the thicknesses of the Ta films increase. The saturation fields $H_S$ of Sample 2 and 3 are, however, larger than that of Sample 1. Additionally, the measured spin-flop fields $H_{flop}$ of Samples 2 and 3 are clearly smaller than the estimated spin-flop fields $H_{flop}'$ thereof. This implies that the structures of Samples 2, 3, which are embodiments of the present invention, effectively reduce the spin-flop fields $H_{flop}$, and also increase the saturation fields $H_S$.

As shown in FIGS. 20A and 20B, which illustrates the magnetization curves of Samples 4 and 5, the increase in the Ta film thickness causes the magnetization curves to be stepped around the zero external field. Referring to the magnetization curves shown in FIGS. 20A and 20B, the first rapid increase in the magnetizations found upon the increase of the external magnetic field from the zero magnetic field results from the magnetization reversal of the NiFe films used as the reversal inducing layers. On the other hand, the increase of the magnetization in the higher magnetic field region results from the magnetization reversal of the NiFe films within the SAF; it should be noted that the magnetic field at which magnetization inversion occurs at in the high magnetic field region shown in FIGS. 20A and 20B is not identical to the spin-flop field of an independently prepared SAF. As is understood from this result, the excessive increase in the average thickness of the Ta films used as the magnetic couplers in the range over 0.7 nm may cause too weak ferromagnetic coupling between the reversal inducing layers and the SAF, and may cause the reversal inducing layers and the SAF to be magnetically decoupled in the operation magnetic field range.

The reversal inducing layers, composed of a NiFe film having a magnetization-thickness product of to 1.45 T·nm, have a coercive field $H_{soft}$ (See FIG. 9C) of approximately 3 (Oe). On the other hand, the SAF are composed of an NiFe/Ru/NiFe film stack in which the NiFe films have a magnetization-thickness product of 1.45 T·nm. From an evaluation of the samples of the free magnetic layer structure "3", the spin-flop field $H_{flop}$ of the SAF (See FIG. 9B) is 33 (Oe), and the saturation field $H_S$ thereof is 390 (Oe). Sample 2 and 3, in which the reversal inducing layers are moderately ferromagnetically coupled to the SAF by the magnetic couplers of the Ta films, effectively achieves both of the reduction in the spin-flop field and increase in the saturation magnetic (See FIG. 9A) at the same time.

Referring to FIGS. 21A and 21B, Sample 6 includes only one magnetic coupler $X_1$ composed of the Ta film (0.5 nm) in the free magnetic layer, corresponding to the structure shown in FIG. 16B. The spin-flop field $H_{flop}$ of Sample 6 is 25 (Oe), and the saturation magnetic field $H_S$ is 260 (Oe). On the other hand, Sample 2, which is provided with two reversal inducing layers, exhibits a reduced spin-flop field $H_{flop}$ of 19 (Oe), and an increased saturation magnetic field $H_S$ of 400 (Oe). This proves that the provision of two reversal inducing layers on the top and bottom of the SAF remarkably reduces the spin-flop field, while increasing the operation margin.

Experiment 1-2

Furthermore, effects of the structure of the reversal inducing layers and the SAF are investigated. In this investigation, Ta films of 0.5 nm are commonly used as the magnetic couplers $X_1$ and $X_2$. The following is the investigated structures of the reversal inducing layers:

Sample 7 (Embodiment):

$Ni_{81}Fe_{19}$(2.2 nm)/Ta(0.5 nm)/$Ni_{81}Fe_{19}$(4.2 nm)/Ru (2.1 nm)/$Ni_{81}Fe_{19}$(4.2 nm)/Ta(0.5 nm)/$Ni_{81}Fe_{19}$ (2.2 nm)

Sample 8 (Comparative Example):

$Ni_{81}Fe_{19}$(4.2 nm)/Ta(0.5 nm)/$Ni_{81}Fe_{19}$(2.2 nm)/Ru (2.1 nm)/$Ni_{81}Fe_{19}$(2.2 nm)/Ta(0.5 nm)/$Ni_{81}Fe_{19}$ (4.2 nm)

Sample 9 (Comparative Example):

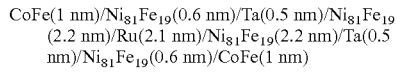

Sample 10 (Embodiment):

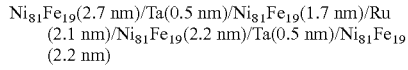

In Sample 7 and 8, the magnetization thickness products of the ferromagnetic layers within the SAF and the reversal inducing layers are respectively modified from those in Sample 2. In Sample 7, the magnetization film thickness products of the ferromagnetic layers within the SAF are adjusted to 2.9 T·nm, which is twice of those in Sample 2. In Sample 8, the magnetization film thickness products of the reversal inducing layers are set to 2.9 T·nm, which is twice of those in Sample 2.

In Sample 9, the reversal inducing layers are each composed of a two-layer stack of CoFe(1 nm)/$Ni_{81}Fe_{19}$(0.6 nm), and thereby the crystalline anisotropy field $H_k$ thereof is increased up to 35 (Oe). It should be noted that the magnetization-thickness products of the ferromagnetic layers within the SAF and the reversal inducing layers are 1.45 T·nm, which is the same as those in Sample 2.

In Sample 10, the two reversal inducing layers within the free magnetic layer have different thicknesses, and the two ferromagnetic layers within the SAF have different thicknesses.

Figure 22A:
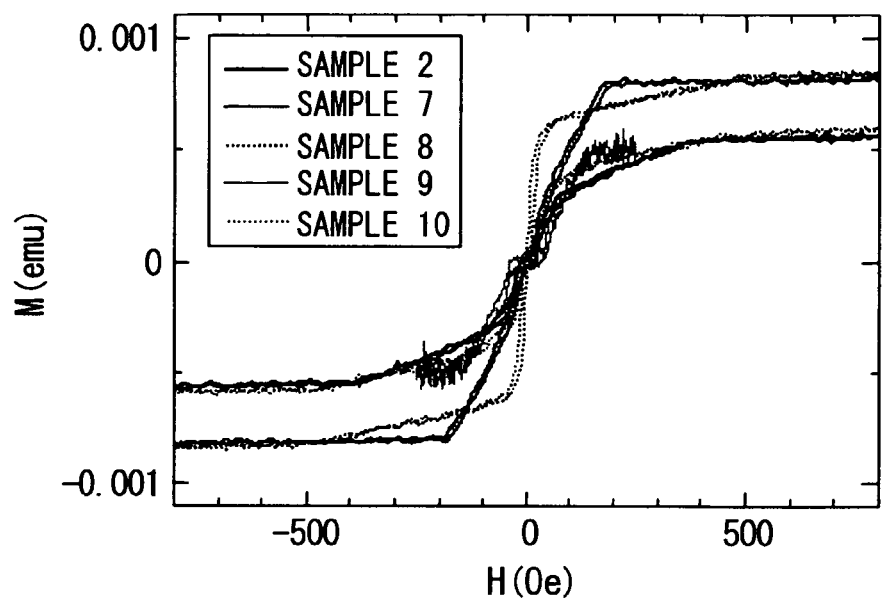
FIG. 22A is a graph illustrating magnetization curves of free magnetic layers of Samples 2, 7 and 10 which are embodiments of the present invention and Samples 8 and 9 which are comparative examples.
Figure 22B:
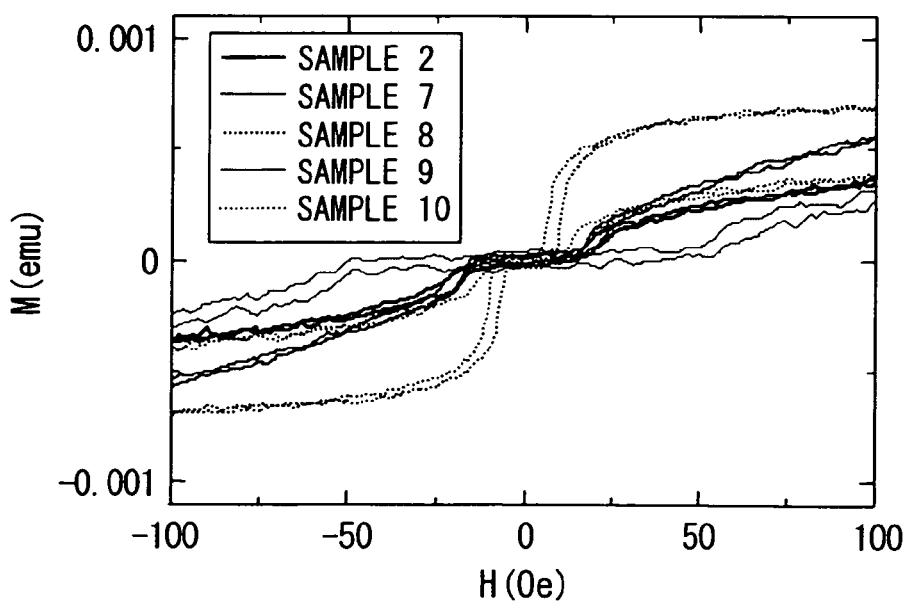
FIG. 22B is a graph illustrating enlarged magnetization curves around the zero external field of the free magnetic layers of Samples 2, 7, 8, 9, and 10.

FIGS. 22A and 22B illustrate the magnetization curves of Sample 2 and 7 to 10, and FIG. 25A depicts the saturation magnetic fields $H_S$, the crystalline anisotropy fields $H_k$ of the ferromagnetic layer constituting the SAF, the estimated spin-flop fields $H_{flop}'$ ($=(H_S \cdot H_k)^{0.5}$) and the measured spin-flop fields $H_{flop}$, for Sample 2 and 7 to 10. In the experiment with respect to unpatterned sample structures, Samples 7, 8 and 10 exhibit remarkably reduced spin-flop fields $H_{flop}$. On the contrary, only Sample 9 has an increased spin-flop field with a reduced saturation field of 140 (Oe), exhibiting undesired spin-flop characteristics. The increase in the spin-flop field of the free magnetic layer of Sample 9 may result from the fact that the reversal inducing layers of Sample 9 have a large coercive field $H_{soft}$ of 35 (Oe), and the magnetic coupling between the SAF and such reversal inducing layers having a large coercive field $H_{soft}$ undesirably increases the spin-flop field. This implies that the coercive fields $H_{soft}$ of the reversal inducing layers need to be smaller than at least the spin-flop field of the SAF; otherwise, the SAF suffers from an increased spin-flop field and a decreased saturation field. As for Sample 10, although the magnetization-thickness products of the two ferromagnetic layers within the SAF are slightly different, and the magnetization-thickness products of the two reversal inducing layers are also slightly different, Sample 10 sufficiently exhibits the advantageous effect of the present invention; the saturation field of the free magnetic layer is increased up to 480 (Oe), and the spin-flop field is decreased down to 16 (Oe).

Additionally, for the structures of Samples 1 to 6 and 7 and 8, MTJ elements structured as described below are prepared through a photolithography technique and an ion milling technique. The MTJ elements are elliptically shaped, having dimensions of 0.32×0.9 µm². The spin-flop fields, saturation fields are measured by applying an increasing external magnetic field. Additionally, the external magnetic fields are sequentially applied in the directions of 45 degrees, 0 degree and of −45 degrees to the easy axis of the MTJ elements to achieve the toggle-writing. For each of the structures of Samples 1 to 6 and 7 and 8, 30 MTJ elements are prepared and investigated.

MTJ Structure:

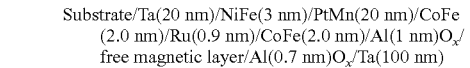

FIG. 25B illustrates yields of MTJ elements that achieve successful toggle writing (referred to as toggle-writing yield, hereinafter), the spin-flop fields, the saturation fields, and the operation margin of the toggle-writing (defined as the ratio obtained by dividing the saturation field by the spin-flop field). Compared with the MTJ elements corresponding to Sample 1, which are comparative example, the MTJ elements corresponding to the samples of the present invention are superior in toggle-writing operation margins, exhibiting the advantageous feature of the present invention.

The toggle-writing yields of the MTJ elements corresponding to Samples 1 and 2 are both 100%, which indicates that the structures of Samples 1 and 2 effectively achieve stable toggle-writing. The spin-flop field $H_{flop}$ of Sample 2 is smaller than that of Sample 1, and this implies that the structure of Sample 2 effectively exhibit the advantageous feature of the present invention within a highly-integrated MRAM.

Sample 3 suffers from a low toggle-writing yield of 76%, although exhibiting the lowest spin-flop field $H_{flop}$ of 43.2 (Oe).

The toggle-writing yields of Sample 4 and 5 are 0%. This may result from the fact that the magnetization reversal of the reversal inducing layers is completely separated from that of the ferromagnetic layers within the SAF, as is understood from the magnetization curves of Sample 4 and 5.

As is the case of Sample 2, the MTJ elements corresponding to Sample 7 exhibit superior characteristics.

On the contrary, the MTJ elements corresponding to Sample 8 suffer from unsuccessful toggle-writing. This may result from the following three reasons: Firstly, the large magnetization-thickness product of the reversal inducing layers (2.9 T·nm) enhances magnetostatic antiparallel coupling between the reversal inducing layers and the SAF, and this undesirably reduces the effective ferromagnetic coupling energy $J_C'$ through the effect expressed by the formula (7), and thereby weakens the ferromagnetic coupling between the reversal inducing layers and the SAF. Secondly, the increased magnetization-thickness products of the reversal inducing layers reduces the magnetic field at which the ferromagnetic coupling between the reversal inducing layers and the SAF starts to be decoupled, and this undesirably allows the magnetizations of the reversal inducing layers, which are composed of a NiFe film of 4.2 nm, to be reversed separately from the magnetizations of the ferromagnetic layers within the SAF, which is composed of a film stack of $Ni_{81}Fe_{19}$(2.2 nm)/Ru(2.1 nm)/$Ni_{81}Fe_{19}$(2.2 nm). Finally, the coercive fields of the reversal inducing layers are undesirably increased according to the formula (1) as described above, and this causes undesirable spin-flop characteristics, as is the case of Sample 9.

In order to improve operation characteristics of Sample 8, additional evaluation is performed for a structure modified from that of Sample 8. Specifically, the thicknesses of the magnetic couplers composed of Ta films within the free magnetic layers are modified to 0.45 nm. The modified MTJ elements are evaluated with respect to the toggle-writing yield and other magnetic characteristics. The modified MTJ elements exhibit a reduced spin-flop field $H_{flop}$ of 30 (Oe) in the direction of the bit line and the word line, an increased saturation field of 170 (Oe). Additionally, the toggle-writing yield of the modified MTJ elements is 98%. This may result from the following phenomenon. The modification of the thicknesses of the Ta magnetic couplers from 0.5 to 0.45 nm increases the effective ferromagnetic coupling energy $J_C'$, and thereby increases the magnetic field $H_{C1}$ ($\approx J_C'/M_C \cdot t_C$) at which the magnetic coupling between the reversal inducing layers and the SAF starts to be decoupled into a desired range. This allows the magnetization reversal of the ferromagnetic films within the SAF, which is composed of a film stack of $Ni_{81}Fe_{19}$(2.2 nm)/Ru(2.1 nm)/$Ni_{81}Fe_{19}$(2.2 nm) to follow the magnetization reversal of the reversal inducing layers, composed of a NiFe film of 4.2 nm to achieve stabilized toggle writing. From this result, it is concluded that the increase in the magnetization-thickness products $M_C \cdot t_C$ of the reversal inducing layers must be accompanied by increasing the ferromagnetic coupling energy $J_C'$ accordingly, so as to prevent the complete decoupling of the magnetic coupling between the reversal inducing layers and the SAF, as is understood from the following relation:

$$H_{C1} \approx J_C'/M_C \cdot t_C.$$

Experiment 1-3

Experiment 1-3 is directed to examine how the toggle-writing operation of the free magnetic layer depends on the effective ferromagnetic coupling energy $J_C'$ between the reversal inducing layers and the SAF; and the antiferromagnetic coupling energy $J_{SAF}$ within the SAF.

First, ferromagnetic coupling energies $J_C$ are roughly estimated for Samples 2, 3, 4 and 5, for unpatterned film stacks, and the effect of the ferromagnetic coupling energies $J_C$ is investigated on the toggle-writing yields obtained in Experiment 1-2. Samples having the following structures are prepared to estimate the effective ferromagnetic coupling energies $J_C'$:

Substrate/Ta(20 nm)/$Ni_{81}Fe_{19}$(2 nm)/IrMn(10 nm)/
CoFe(2.0 nm)/$Ni_{81}Fe_{19}$(3 nm)/Ta(dTa)/
$Ni_{81}Fe_{19}$(5 nm)/Ru(2.1 nm)/Ta(10 nm), where dTa is the thickness of the intermediate Ta film.

Figure 22C:
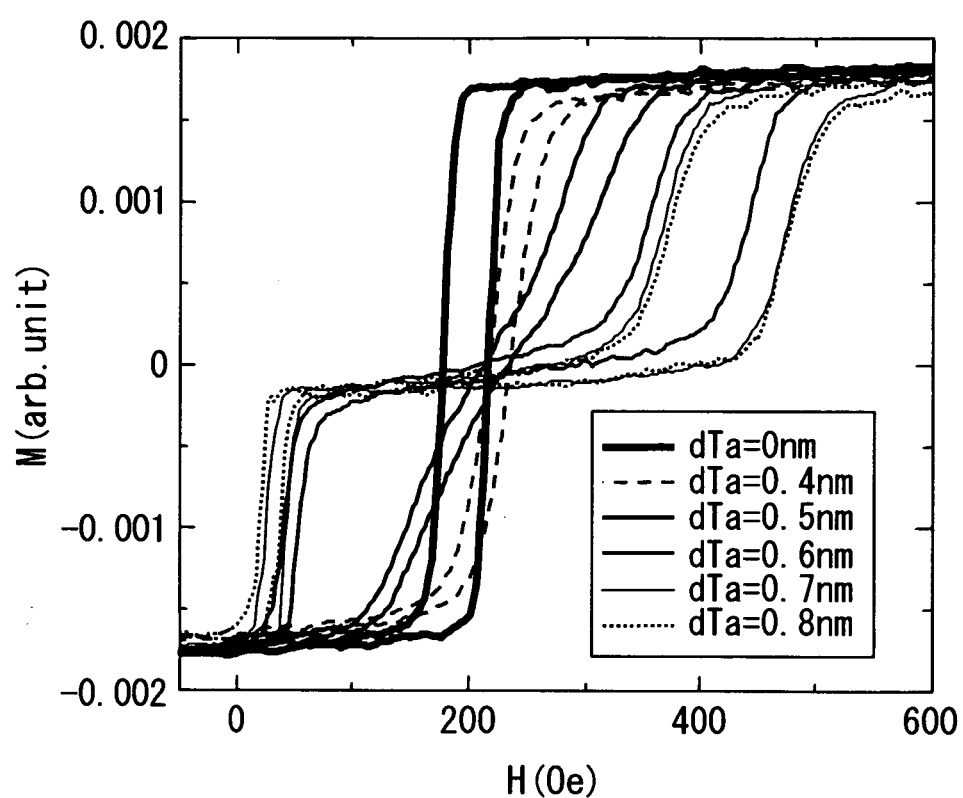
FIG. 22C is a graph illustrating magnetization curves of samples prepared for estimation of the strength of ferromagnetic coupling of magnetic couplers within Samples 2, 3, 4 and 5.

The Ta film thickness dTa within each sample is selected from 0 nm, 0.4 nm, 0.5 nm, 0.6 nm, 0.7 nm and 0.8 nm. The above-presented samples are composed of a film stack of an antiferromagnetic film, a ferromagnetic film, a magnetic coupler, and another ferromagnetic film. The Ta film having a thickness of dTa functions as the magnetic coupler. It should be noted that the Ta film having a thickness of dTa are in contact with the same ferromagnetic layers on the surfaces thereof as the magnetic couplers within Samples 2 to 5. Magnetizations curves of the prepared samples are measured, and the ferromagnetic coupling energies $J_C$ for unpatterned film stacks are obtained from a fitting based on the LLG (Landau-Lifshitz-Gilbert) simulation. FIG. 22C illustrates the magnetizations curves of the prepared samples. The increase in the Ta film thickness dTa decreases the ferromagnetic coupling energies $J_C$, causing the separation of the hysteresis loop of the film stack of CoFe (2.0 nm)/NiFe (3 nm) from that of the NiFe film of 5 nm.

First, the antiferromagnetic coupling energies $J_{SAF}$ within the SAFs with respect to the unpatterned film stacks are estimated. The saturation field $H_S$ of the SAF roughly estimated in Experiment 1-1 is 390 (Oe), and further the saturation fields $H_S$ of Samples 4, 5 (the samples in which the SAF and the reversal inducing layers are completely and magnetically separated) ranges 424 to 430 (Oe) as shown in FIG. 25A.

Since the magnetization-thickness product of the respective ferromagnetic layers is 1.45 T·nm, the antiferromagnetic coupling energies $J_{SAF}$ within the SAFs of Samples 2, 3, 4 and 5 are roughly estimated to be 0.023 to 0.025 erg/cm² from the formula (5).

On the other hand, the ferromagnetic coupling energies $J_C$ of the samples with the Ta film thicknesses dTa of 0.5 nm and 0.6 nm, which exhibit the high toggle-writing yields for the MTJ elements measuring 0.32×0.9 µm², are 0.048 and 0.016 erg/cm², respectively, while the ferromagnetic coupling energies $J_C$ of the samples with Ta film thicknesses dTa of 0.7 nm and 0.8 nm, which did not achieve the toggle writing, are 0.008 and 0.004 erg/cm², respectively.

From the fact that successful toggle writing is not achieved with the Ta film thickness dTa of 0.7 nm and 0.8 nm, it is concluded that successful toggle writing is achieved by adjusting the ferromagnetic coupling energies $J_C$ to 0.004 erg/cm² or more in the structure. This condition is equivalent to adjusting the ferromagnetic coupling energy $J_C$ of the magnetic couplers to about one-tenth or more of the antiferromagnetic coupling energy $J_{SAF}$ of the SAF.

In actual highly-integrated MRAM cells, the influence of the antiferromagnetic magnetostatic coupling between the ferromagnetic layers is large. Although the relationship between the effective ferromagnetic coupling energy $J_C'$ of finely-patterned MTJ elements and the effective antiferromagnetic coupling energy $J_{SAF}$, which is depicted by the formula (7), is important, it is difficult to correctly estimate the relationship. The present experiment is directed to the case when the ferromagnetic layers have the same magnetization-thickness product. However, the lower limit of the effective ferromagnetic coupling energy $J_C'$ may be further reduced, for example, when the magnetization-thickness products of the reversal inducing layers are reduced so as to reduce the coercive fields thereof. This is because the magnetic field $H_{C1}$($\approx J_C'/M_C \cdot t_C$), which is depicted by the formula (7), is a more dominant parameter, and maintaining the magnetic field $H_{C1}$ to a desired value with a reduced magnetization-thickness product $M_C \cdot t_C$ requires reducing the effective ferromagnetic coupling energy $J_C'$, accordingly. The magnetization-thickness product $M_C \cdot t_C$ of the reversal inducing layers can be technically reduced down to 1 T·nm or less, and in that case, the effective ferromagnetic coupling energy $J_C'$ is required to be reduced down to about half of the minimum required ferromagnetic coupling energy $J_C$ of 0.004 erg/cm², estimated by the present experiment. Therefore, it is desirable to adjust the effective ferromagnetic coupling energy $J_C'$ to one-fiftieth or more of the antiferromagnetic coupling energy $J_{SAF}$, considering the fact that the free magnetic layers may be variously structured and the values estimated in the present experiment may have a margin of error.

As for the upper limit of the effective ferromagnetic coupling energy $J_C'$, on the other hand, the toggle-writing yields do not provide any basis of limiting the ferromagnetic coupling force $J_C'$. The sample with the Ta film thickness of 0.4 nm, which slightly exhibits the advantageous effect of the present invention, has an effective ferromagnetic coupling energy $J_C'$ of 0.535 erg/cm², which is about 40 times of the antiferromagnetic coupling energy $JS_{AF}$ within the SAF. The sample with the Ta film thickness of 0.3 nm is identical to Sample 1 in the structure, exhibiting a usual behavior of an SAF, as depicted by Experiment 1-1. The ferromagnetic coupling energy through the magnetic coupler composed of a Ta film of 0.3 nm is too strong to be measured; however, the effective ferromagnetic coupling energy $J_C'$ can be estimated by extrapolation from the dependency of the effective ferromagnetic coupling energy $J_C'$ on the Ta film thickness. The effective ferromagnetic coupling energy $J_C'$ of the sample with the Ta film thickness of 0.3 nm is estimated to be about 10 erg/cm². This value is about 500 times of the antiferromagnetic coupling energy $J_{SAF}$ of the SAF. Therefore, adjusting the effective ferromagnetic coupling energy $J_C'$ to 500 times or less of the antiferromagnetic coupling energy $J_{SAF}$ effectively causes the advantageous effect of the invention. Such effective ferromagnetic coupling energy $J_C'$ of the free magnetic layer is sufficiently small as compared with the exchange interaction coupling energy between two NiFe films of approximately 80 erg/cm², which is guessed from values disclosed in prior art documents.

Experiment 1-4

Experiment 1-4 is directed to evaluation of magnetic couplers composed of two films of different non-magnetic elements. Specifically, a sample is prepared which incorporates magnetic couplers each composed of a stack of a ruthenium film and a tantalum film. Evaluated samples in this experiment are listed below:

Sample 1 (Comparative Example)

$Ni_{81}Fe_{19}$(2.1 nm)/Ta(0.3 nm)/$Ni_{81}Fe_{19}$(2.1 nm)/Ru
(2.1 nm)/$Ni_{81}Fe_{19}$(2.1 nm)/Ta(0.3 nm)/$Ni_{81}Fe_{19}$
(2.1 nm)

Sample 2 (Embodiment)

$Ni_{81}Fe_{19}$(2.2 nm)/Ta(0.5 nm)/$Ni_{81}Fe_{19}$(2.2 nm)/Ru
(2.1 nm)/$Ni_{81}Fe_{19}$(2.2 nm)/Ta(0.5 nm)/$Ni_{81}Fe_{19}$
(2.2 nm)

Sample 11 (Embodiment)

$Ni_{81}Fe_{19}$(2.2 nm)/Ru(0.2 nm)/Ta(0.3 nm)/$Ni_{81}Fe_{19}$
(2.2 nm)/Ru(2.1 nm)/$Ni_{81}Fe_{19}$ (2.2 nm)/Ta(0.3
nm)/Ru(0.2 nm)/$Ni_{81}Fe_{19}$(2.2 nm)

It should be noted that Samples 1 and 2, which incorporate magnetic couplers of Ta films of 0.3 nm and 0.5 nm, respectively, are already presented in Experiment 1-1. Samples 1 and 2 are samples to be compared with Sample 11

Figure 23A:
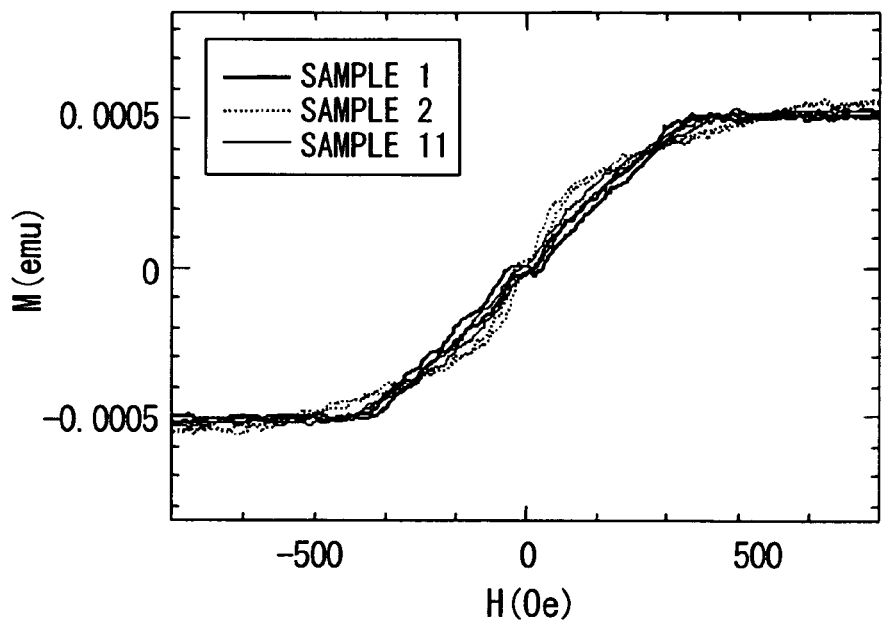
FIG. 23A is a graph illustrating magnetization curves of free magnetic layers of Sample 1 which is a comparative example, and Samples 2 and 11 which are embodiments of the present invention.
Figure 23B:
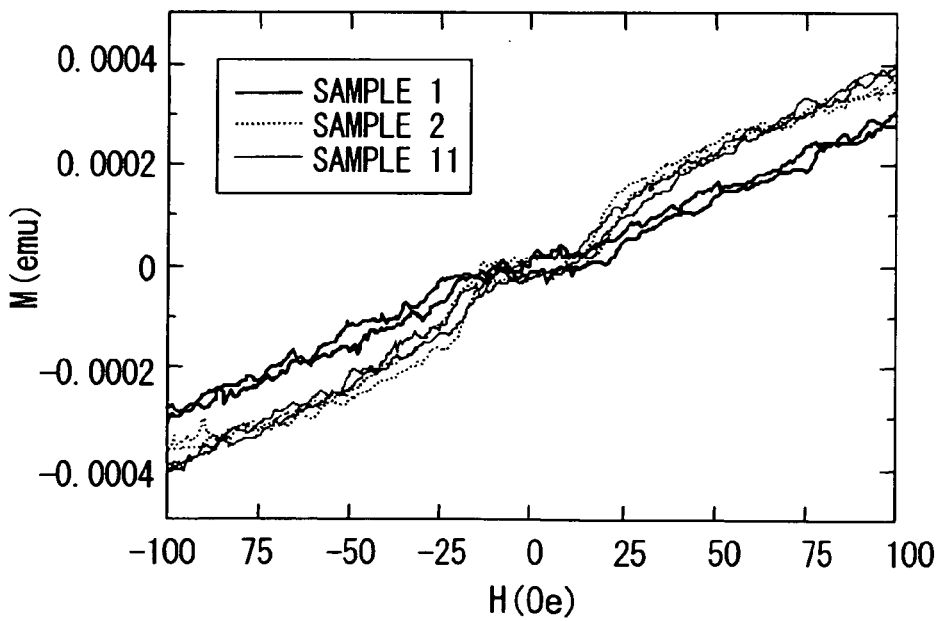
FIG. 23B is a graph illustrating magnetization curves around the zero external field of the free magnetic layers of Sample 1, 2 and 11.

On the other hand, Sample 11 incorporates magnetic couplers composed of a film stack of Ru(0.2 nm)/Ta(0.3 nm). The magnetic couplers within Sample 11 have a thicker thickness than those of Sample 1, exhibiting a relatively weak ferromagnetic coupling energy $J_C$. FIGS. 23A and 23B illustrate magnetization curves of the free magnetic layers of Samples 1, 2 and 11.

FIG. 25A illustrate the saturation fields $H_S$, the crystalline anisotropy fields $H_k$, estimated spin-flop fields $H_{flop}'$ (=$(H_S \cdot H_k)0.5$), and measured spin-flop fields $H_{flop}$ of the free magnetic layers of Samples 1, 2 and 11. Compared with Sample 1, Sample 11 has a relatively larger saturation magnetic field and a relatively smaller spin-flop field. Sample 1 brings a normal spin flop behavior, exhibiting the measured spin-flop field $H_{flop}$ almost the same as the estimated $H_{flop}'$. On the contrary, Sample 11 clearly exhibits a measured spin-flop field $H_{flop}$ smaller than the estimated spin-flop field $H_{flop}'$, while causing the advantageous effect of the present invention.

The magnetic couplers within Samples 2 and 11 have the same thickness, exhibiting the ferromagnetic coupling of the same strength; however, Samples 2 and 11 causes different effects in enhancing the crystalline orientations of the layers formed thereon or thereover. In Sample 2, the magnetic couplers are each composed of a thickly-formed Ta film to weaken the ferromagnetic coupling caused by the magnetic couplers; however, the magnetic couplers within Sample 2 undesirably excessively enhances the antiferromagnetic coupling energy $J_{SAF}$ within the SAF, due to a strong enhancing effect of the thickly-formed Ta film to enhance the crystalline orientation of the intermediate Ru film within the SAF. On the contrary, Sample 11 controls the strength of the ferromagnetic coupling caused by the magnetic couplers through using a film stack of a thin Ta film of 0.3 nm, and a thin Ru film of 0.2 nm; the thin Ta film of 0.3 nm causes a crystalline orientation enhancing effect to a desired extent, and the thin Ru film of 0.2 nm selectively weakens the ferromagnetic coupling through the magnetic couplers, while causing relatively weak crystalline orientation enhancing effect. Therefore, the use of the stack structure of the Ta film and the Ru film in the magnetic couplers allows controlling the antiferromagnetic coupling energy $J_{SAF}$ within the SAF as desired, while reducing the spin-flop field of the SAF by using the reversal inducing layers. As thus described, the use of a magnetic coupler composed of two or more non-magnetic films is advantageous, especially when the magnetic coupler is positioned below a Ru non-magnetic layer providing antiferromagnetic coupling, having a strong effect of influencing the crystalline orientation of the Ru non-magnetic layer.

2. Second Experiment

In the second experiment, characteristics of magnetic couplers composed of a very thin AlOx film of 1 nm or less have been evaluated. Samples incorporating free magnetic layers having the following two structures are prepared through a magnetron sputtering technique and a radical oxidization technique in which oxygen and argon plasma generated with high-frequency power supply is used. The magnetization curves of the free magnetic layers of the respective samples are measured:

MTJ Structure:

Substrate/Ta(20 nm)/Al(1 nm)$O_x$/free magnetic layer/
Al(0.7 nm)$O_x$/Ta(10 nm)

The free magnetic layers of the respective samples have the following structure:

Free Magnetic Layer Structure "1":

$Ni_{81}Fe_{19}$/$X_1$/$Ni_{81}Fe_{19}$/CoFe(0.3 nm)/Ru(2.1 nm)/
CoFe(0.3 nm)/$Ni_{81}Fe_{19}$/$X_2$/$Ni_{81}Fe_{19}$

It should be noted that $X_1$ and $X_2$ denotes magnetic couplers of $AlO_x$.

In order to investigate the crystalline anisotropy field of the $Ni_{81}Fe_{19}$/CoFe film stack within the SAFs of the free magnetic layers within the respective samples, free magnetic layers having the following structure are produced and evaluated.

Free Magnetic Layer Structure 2:

$Ni_{81}Fe_{19}$/$X_1$/$Ni_{81}Fe_{19}$/CoFe(0.3 nm)/Ru(2.1 nm)

The specific structure of the produced free
Specifically, the free magnetic layers within the respective samples are structured as follows:

Sample 12 (Comparative Example):

$Ni_{81}Fe_{19}$(4 nm)/CoFe(0.3 nm)/Ru(2.1 nm)/CoFe(0.3
nm)/$Ni_{81}Fe_{19}$(4 nm)

Sample 13 (Comparative Example):

$Ni_{81}Fe_{19}$(6 nm)/CoFe(0.3 nm)/Ru(2.1 nm)/CoFe(0.3
nm)/$Ni_{81}Fe_{19}$(6 nm)

Sample 14 (Embodiment):

$Ni_{81}Fe_{19}$(2 nm)/Al(0.5 nm)$O_x$/$Ni_{81}Fe_{19}$(4 nm)/CoFe
(0.3 nm)/Ru(2.1 nm)/CoFe(0.3 nm)/$Ni_{81}Fe_{19}$(4
nm)/Al(0.5 nm)$O_x$/$Ni_{81}Fe_{19}$(2 nm)

Sample 15 (Embodiment)

Ni$_{81}$Fe$_{19}$(2 nm)/Al(0.6 nm)O$_x$/Ni$_{81}$Fe$_{19}$(4 nm)/CoFe
(0.3 nm)/Ru(2.1 nm)/CoFe(0.3 nm)/Ni$_{81}$Fe$_{19}$(4
nm)/Al(0.6 nm)O$_x$/Ni$_{81}$Fe$_{19}$(2 nm)

Sample 12 is composed of a free magnetic layer incorporating a usual SAF film stack of Ni$_{81}$Fe$_{19}$(4 nm)/CoFe(0.3 nm)/Ru(2.1 nm)/CoFe(0.3 nm)/Ni$_{81}$Fe$_{19}$(4 nm).

Samples 14 and 15 are, on the other hand, composed of a free magnetic layer in which an Ni$_{81}$Fe$_{19}$ films of 2 nm are used as reversal inducing layers used to enhance the spin-flop of an SAF structured identically to Sample 12. The reversal inducing layers within Sample 14 and 15 are ferromagnetically coupled to the SAFs by the magnetic couplers of Al(0.5 nm)O$_x$ and Al(0.6 nm)O$_x$, respectively.

Sample 13 is a sample in which no magnetic coupler of AlOx is provided, and the reversal inducing layers of Ni$_{81}$Fe$_{19}$ films of 2 nm and the ferromagnetic layers of Ni$_{81}$Fe$_{19}$(4 nm)/CoFe(0.3 nm) film stack within the SAF are directly coupled. In Sample 13, the reversal inducing layers and the ferromagnetic layers within the SAF is firmly coupled by the exchange interaction.

Figure 24A:
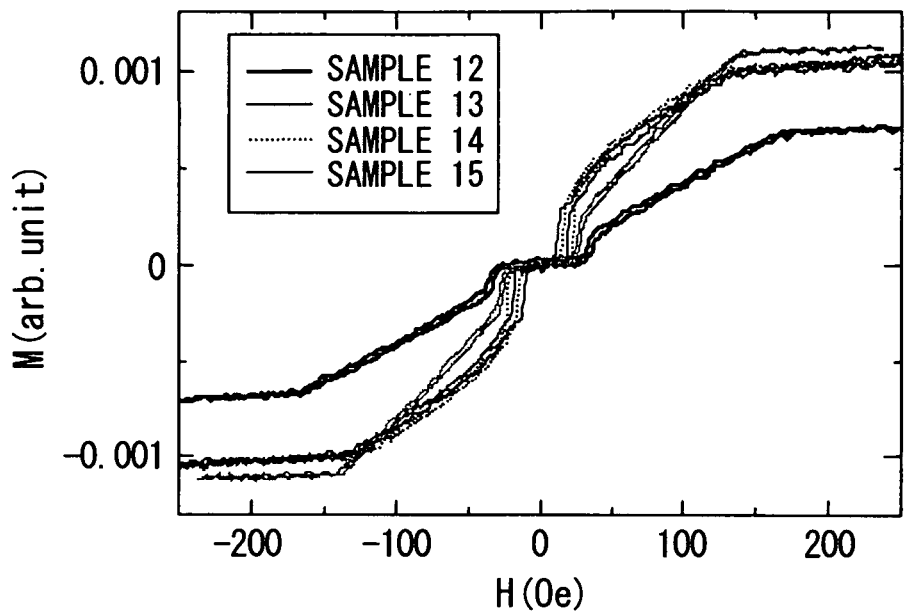
FIG. 24A is a graph illustrating magnetization curves of free magnetic layers of Samples 12 and 13 which are comparative examples, and Samples 14 and 15 which are embodiments of the present invention.
Figure 24B:
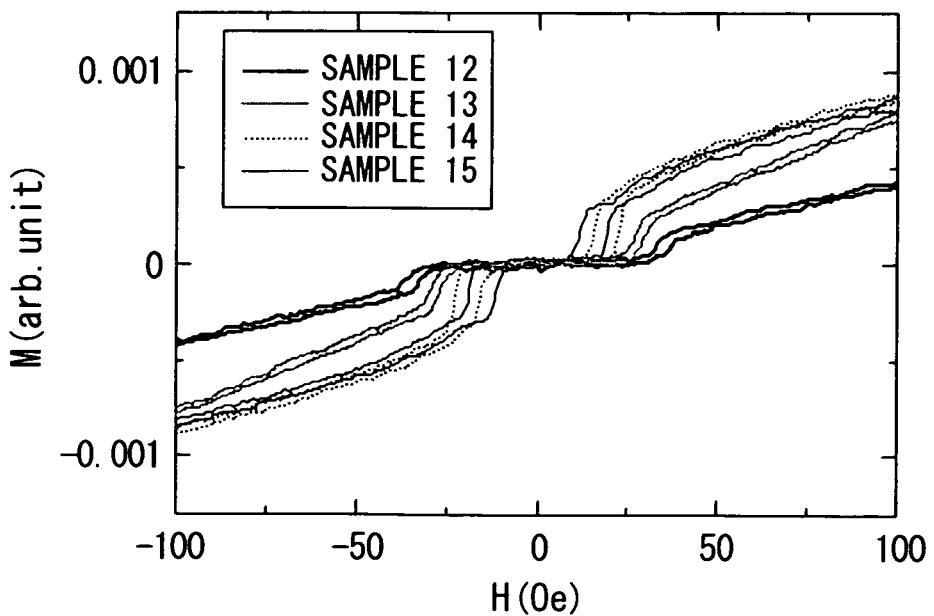
FIG. 24B is a graph illustrating enlarged magnetization curves around the zero external field of the free magnetic layers of Samples 12 to 15.

FIGS. 24A, 24B illustrate measured magnetization curves of the free magnetic layers within Sample 12 to 15, and FIG. 25A illustrates magnetization reversal characteristics obtained from the measured magnetization curves. The spin-flop fields H$_{flop}$ of Samples 14, are remarkably smaller than those of Samples 12, 13, while the saturation fields H$_S$ of Samples 14, 15 are slightly smaller than those of Samples 12, 13. Additionally, Samples 14 and 15 exhibit measured spin-flop fields H$_{flop}$ clearly smaller than the estimated spin-flop fields H$_{flop}$' obtained from the saturation fields H$_S$ and the crystalline anisotropy fields H$_k$. As for Samples 12 and 13, the estimated spin-flop fields H$_{flop}$' are almost equal to the measured spin-flop fields H$_{flop}$. This implies that the use of magnetic couplers composed of AlOx films effectively reduces the spin-flop fields of the SAF within the free magnetic layer, while increasing the operation margin in the toggle writing.

Furthermore, MTJ elements corresponding to Samples 12, 14, 15, having dimensions of 0.32×0.9 μm$^2$, are prepared through a photolithography technique and an ion milling technique. The toggle writing operations thereof are then investigated. The prepared MTJ elements are structured as below:
MTJ Structure:

Substrate/Ta(20 nm)/NiFe(3 nm)/PtMn(20 nm)/CoFe
(2.0 nm)/Ru(0.9 nm)/CoFe(2.0 nm)/Al(1 nm)O$_x$/
free magnetic layer/Al(0.7 nm)O$_x$/Ta(100 nm)

FIG. 25B illustrates toggle-writing yields (yields of the free magnetic layers that achieve successful toggle writing), spin-flop fields and saturation fields of the MTJ elements of 0.32×0.9 μm$^2$ for Samples 12, 14 and 15. The MTJ elements of Sample 14, in which the reversal inducing layers are magnetically coupled with the SAF through an Al(0.5 nm)O$_x$ film, achieve a toggle-writing yield of 100%, while exhibit a relatively reduced spin-flop field of 50.5 (Oe), compared with Sample 12. Simultaneously, the MTJ elements of Sample 14 exhibit a relatively increased saturation field H$_S$ of 177 (Oe). As a result, the MTJ elements of Sample 14 achieve an operation margin increased up to 3.5. The structure of Sample 14 effectively increases operation margin, while reducing the magnetic field necessary for achieve the toggle writing. As thus described, the MTJ elements of Sample 14 have very desirable characteristics for toggle writing in an MRAM.

On the other hand, the MTJ elements of Sample 15, in which the magnetic couplers of AlO$_x$ have a thicker thickness than those of Sample 14, suffer from a toggle writing yield reduced down to 73%, and an spin-flop increased up to 82.5 (Oe). This result suggests that toggle-writing operating characteristics of MTJ elements are drastically improved by appropriately adjust the thickness of the AlO$_x$ magnetic couplers within the free magnetic layer.

3. Third Experiment

The third experiment is directed to evaluation of free magnetic layers which incorporate magnetic couplers exhibiting the RKKY interaction. More specifically, a description is given in the following of experimental results in connection with free magnetic layers in which Ru films are used as magnetic couplers. Samples 16 to 21 which incorporate free magnetic layers structured as described below are prepared through a magnetron sputtering technique and a radical oxidization technique, and the magnetization curves thereof are measured:

Substrate/Ta(20 nm)/Ru(3 nm)/free magnetic layer/
Ru(3 nm)/Ta(110 nm)

The structures of the free magnetic layers within Samples 16 to 21 are as follows:
Sample 16 (Comparative Example)

Ni$_{81}$Fe$_{19}$(2 nm)/Ru(3.5 nm)/Ni$_{81}$Fe$_{19}$(2 nm)

Sample 17 (Comparative Example):

Ni$_{81}$Fe$_{19}$(6 nm)/Ru(3.5 nm)/Ni$_{81}$Fe$_{19}$(6 nm)

Sample 18 (Embodiment)

Ni$_{81}$Fe$_{19}$(4 nm)/Ru(1.4 nm)/Ni$_{81}$Fe$_{19}$(2 nm)/Ru(3.5
nm)/Ni$_{81}$Fe$_{19}$(2 nm)/Ru(1.4 nm)/Ni$_{81}$Fe$_{19}$(4 nm)

Sample 19 (Embodiment)

Ni$_{81}$Fe$_{19}$(4 nm)/Ru(2.7 nm)/Ni$_{81}$Fe$_{19}$(2 nm)/Ru(3.5
nm)/Ni$_{81}$Fe$_{19}$(2 nm)/Ru(2.7 nm)/Ni$_{81}$Fe$_{19}$(4 nm)

Sample 20 (Embodiment):

Ni$_{81}$Fe$_{19}$(4 nm)/Ru(4.2 nm)/Ni$_{81}$Fe$_{19}$(2 nm)/Ru(3.5
nm)/Ni$_{81}$Fe$_{19}$(2 nm)/Ru(4.2 nm)/Ni$_{81}$Fe$_{19}$(4 nm)

Sample 21 (Comparative Example):

Ni$_{81}$Fe$_{19}$(4 nm)/Ru(5.6 nm)/Ni$_{81}$Fe$_{19}$(2 nm)/Ru(3.5
nm)/Ni$_{81}$Fe$_{19}$(2 nm)/Ru(5.6 nm)/Ni$_{81}$Fe$_{19}$(4 nm)

Sample 16 is a comparative sample in which the free magnetic layer is composed of only an SAF, with no magnetic coupler. Sample 17 is another comparative sample in which respective NiFe layers within an SAF have a thickness thicker than those of Sample 16. The structure of Sample 17 is equivalent to a structure in which NiFe films of 4 nm are magnetically coupled firmly to the NiFe layers within the SAF in Sample 16. The free magnetic layers of Samples 18 to 21 incorporate reversal inducing layers composed of Ni$_{81}$Fe$_{19}$ films of 4 nm and SAFs composed of Ni$_{81}$Fe$_{19}$(2 nm)/Ru(3.5 nm)/Ni$_{81}$Fe$_{19}$(2 nm) film stacks. In Samples 18 to 21, the reversal inducing layers and the SAFs are ferromagnetically coupled by the RKKY interaction. The strengths of the RKKY interaction within Sample 18 to 21 are controlled on the thicknesses of the magnetic couplers composed of the Ru films used as. The thicknesses of the magnetic couplers of Samples 18, 19, 20 and 21 are respectively adjusted to the second ferromagnetic peak (1.4 nm), the third ferromagnetic peak (2.7 nm), the fourth magnetic peak (4.2) and the fifth ferromagnetic peak (5.6 nm), so that the ruthenium magnetic couplers cause ferromagnetic coupling (see FIG. 13). The NiFe layers within the SAF of Samples 16 to 21 have the same magnetization-thickness products.

Figure 26A:
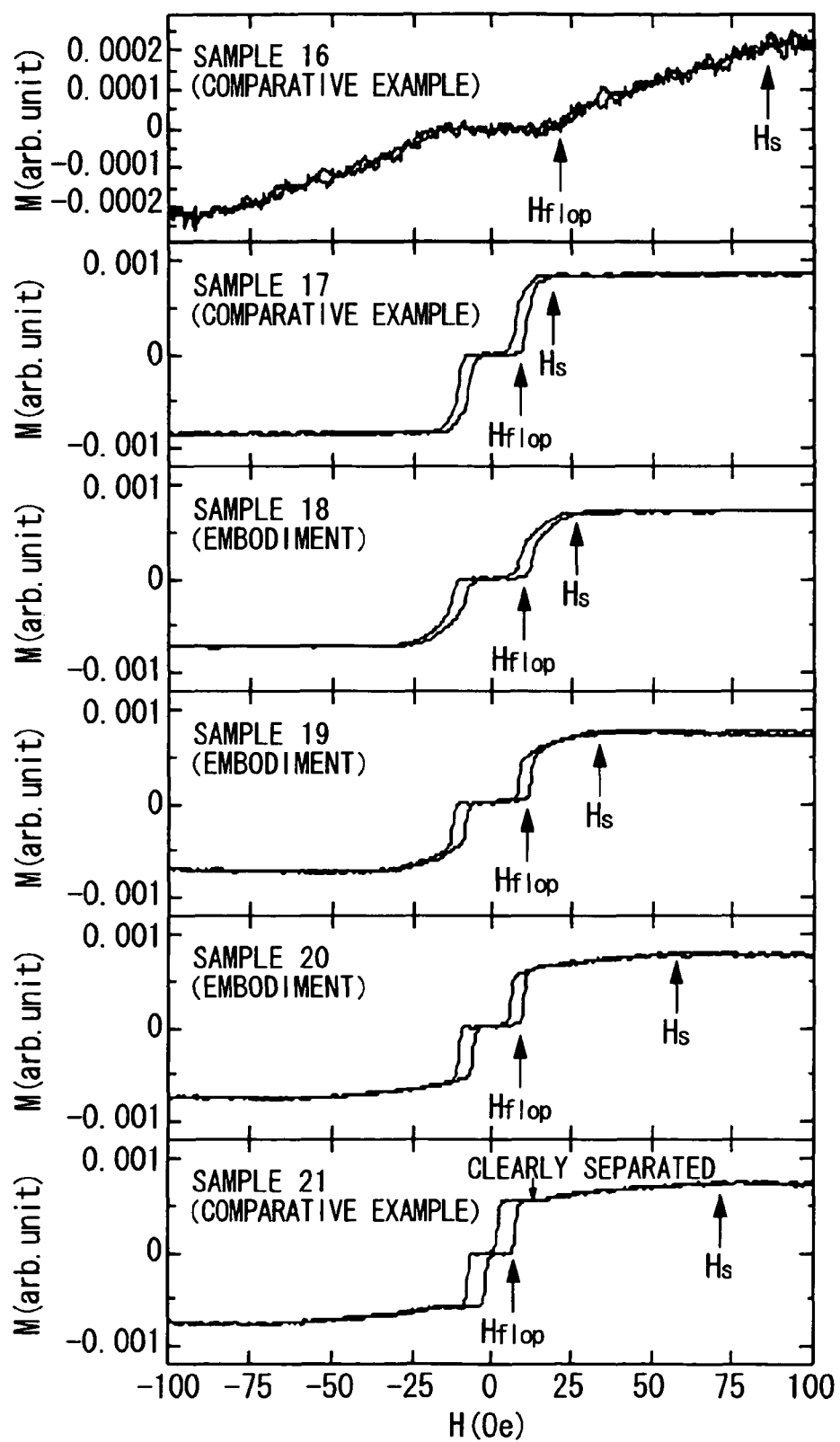
FIG. 26A is a graph illustrating magnetization curves of free magnetic layers of Samples 16, 17 and 21 which are comparative examples and Samples 18, 19, and 20 which are embodiments of the present invention.

FIG. 26A illustrates magnetization curves of the free magnetic layers of Samples 16 to 21, and FIG. 26B illustrates spin-flop fields $H_{flop}$, saturation fields $H_S$ and the operation margin $H_S/H_{flop}$. As shown in FIGS. 26A and 26B, although having the largest saturation field of 87 (Oe), Sample 16 (Comparative Example) suffers from the largest spin-flop field of 21.5 (Oe). Sample 17, in which the NiFe films of 4 nm are firmly coupled with the NiFe films of 2 nm within the free magnetic layer, has a small spin-flop field of 9.7 (Oe), due to the large magnetization-thickness product; however, Sample 17 exhibits the smallest saturation field of 18 (Oe), suffering from the smallest operation margin.

On the other hand, Samples 18 to 20, which are embodiments of the present invention, are structured so that the NiFe films of 4 nm are ferromagnetically coupled to the SAFs with desired strengths. The spin-flop fields of Samples 18, 19 and 20 effectively achieve larger operation margins than that of Sample 17, because of the same or smaller spin-flop fields and the larger saturation fields. Advantageous features of the present invention are observed in Samples 18 to 20. The experiment has proved that the increase in the thickness of the Ru magnetic couplers, that is, the decrease in the strength of the ferromagnetic coupling through the magnetic couplers, lead to the decrease in the spin-flop field and the increase in the saturation field; however, an increase in the thickness of the Ru magnetic couplers over 4.2 nm undesirably results in that the free magnetic layer exhibit a magnetization curve of two steps. Two-step magnetization reversal is clearly observed in Sample 21, in which weak ferromagnetic coupling of the 5th ferromagnetic peak is used to magnetically couple the reversal inducing layers and the SAF. This is because the magnetization reversal of the reversal inducing layers occurs separately from the magnetization reversal of the SAF, due to the weak ferromagnetic coupling. The MTJ elements of Sample 21, incorporating the magnetic couplers that cause weak ferromagnetic coupling, exhibit a magnetization reversal behavior similar to those of Samples 4 and 5, which are described in the first experiment (See FIGS. 19A and 19B). This implies that Sample 21 may suffer from a problem in the toggle writing, considering the fact that the MTJ elements of Samples 4, 5 do not achieve successful toggle writing.

The above-described experiment has proved that, when a magnetic coupler within a free magnetic layer is composed of a Ru film that cause RKKY interaction, the strength of the ferromagnetic coupling through the magnetic coupler are desirably appropriately controlled by the thickness of the Ru film or the interface structure between the Ru film within the magnetic coupler and the NiFe film within the SAF.

4. Fourth Experiment

The fourth experiment is directed to evaluation of magnetic couplers designed to improve thermal stability, made of heat-resistive material. As is the case of the first and second experiments, free magnetic layers structured as described below are prepared by a magnetron sputtering technique and a radical oxidization in which oxygen and argon plasma is generated by a high frequency power supply, and magnetization curves of the prepared free magnetic layers are measured. The structures of the samples are as follows:

Substrate/Ta(20 nm)/Al(1 nm)$O_x$/free magnetic layer/
Al(0.7 nm)$O_x$/Ta(10 nm)

The free magnetic layers within the respective samples have the following structure:

Sample 22 (Comparative Example)

$Ni_{81}Fe_{19}$(2.0 nm)/Al(0.5 nm)$O_x$/$Ni_{81}Fe_{19}$(3.5 nm)/Ru
  (2.1 nm)/$Ni_{81}Fe_{19}$(3.5 nm)/Al(0.5 nm)$O_x$/
  $Ni_{81}Fe_{19}$(2.0 nm)

Sample 23 (Embodiment):

$Ni_{81}Fe_{19}$(2.0 nm)/Al(0.5 nm)$O_x$/$Ni_{81}Fe_{19}$(1.5 nm)/Ta
  (0.35 nm)/$Ni_{81}Fe_{19}$(2 nm)/Ru(2.1 nm)/
  $Ni_{81}Fe_{19}$(2 nm)/Ta(0.35 nm)/$Ni_{81}Fe_{19}$(1.5 nm)/
  Al(0.5 nm)$O_x$/$Ni_{81}Fe_{19}$(2.0 nm)

In Sample 22 (Comparative Example), magnetic couplers are composed of Al(0.5 nm)$O_x$ films, and the ferromagnetic layers within the free magnetic layer (that is, the reversal inducing layers and the ferromagnetic layers within the SAF) are composed of NiFe films. On the other hand, Sample 23 is almost identical to Sample 22, except for that Ta films of 0.35 nm are inserted into the $Ni_{81}Fe_{19}$ films of 3.5 nm in Sample 22. The Ta films of 0.35 nm provide an effect of controlling the antiferromagnetic coupling within the SAF.

Figure 27:
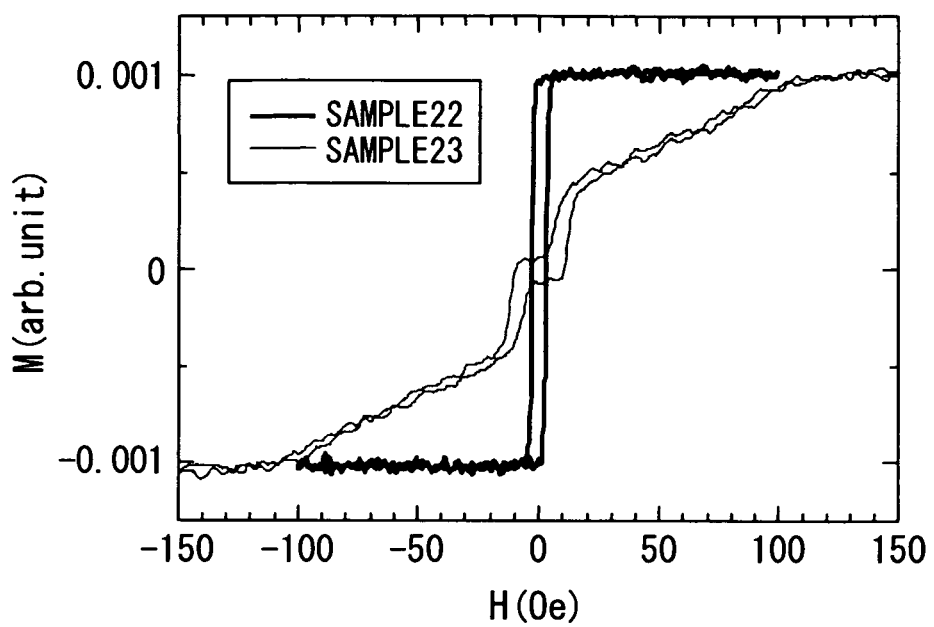
FIG. 27 is a graph illustrating magnetization curves of free magnetic layers of Samples 24, 25.

FIG. 27 illustrates magnetization curves of Samples 22 and 23. Sample 22 does not exhibit antiferromagnetic coupling in the SAF. This may result from that the crystalline orientation of the SAF of the $Ni_{81}Fe_{19}$(3.5 nm)/Ru(2.1 nm)/$Ni_{81}Fe_{19}$(3.5 nm) film stack formed on the Al(0.5 nm)Ox film is remarkably deteriorated by the insertion of the Al(0.5 nm)$O_x$ film. On the contrary, Sample 23 exhibits superior characteristics, including a decreased spin-flop field $H_{flop}$ of 11 (Oe), an increased saturation field $H_S$ of 115(Oe), and an improved operation margin $H_S/H_{flop}$ of 10.4. This may be because the magnetic couplers composed of the Al(0.5 nm)$O_x$ films effectively adjusts the strength of the ferromagnetic coupling between the reversal inducing layers (composed of the $Ni_{81}Fe_{19}$ films of 2.0 nm) and the SAF, and the Ta films of 0.35 nm within the SAF effectively improve the crystalline orientations of the layers within the SAF, which are potentially deteriorated by the Al(0.5 nm)$O_x$ films, and thereby enhance the antiferromagnetic coupling within the SAF.

In order to evaluate thermal stabilities, the magnetization curves of Samples 3 (incorporating magnetic couplers of Ta films of 0.6 nm) and Sample 23 (incorporating magnetic couplers of Al(0.5 nm)$O_x$) films) are measured, after subjecting Sample 3 and 23 to heat treatment at 350° C. for 0.5 hour. It should be noted that Samples 3 and 23 are previously subjected to heat treatment at 275° C. for 5 hours.

The spin-flop field $H_{flop}$ of Samples 3, which is originally 11 (Oe) after the heat treatment at 275° C. for 5 hours, is largely increased up to 18 (Oe) after the heat treatment at 350° C. for 0.5 hours. On the contrary, the spin-flop field $H_{flop}$ of Samples 23, which is originally 11 (Oe) after the heat treatment at 275° C. for 5 hours, is only slightly increased up to 14 (Oe) after the heat treatment at 350° C. for 0.5 hours.

The large change in the spin-flop field $H_{flop}$ of Samples 3 suggests that the magnetic couplers made of metal material such as tantalum undesirably suffer from thermal diffusion that causes a decrease in the effective thickness of the magnetic couplers, and this causes a largely-increased effective ferromagnetic coupling energy $J_C'$ after the heat treatment. The increased effective ferromagnetic coupling energy $J_C'$ may result in an ineffective magnetization reversal inducting effect and an increased spin-flop field $H_{flop}$. On the contrary, the reduced change in the spin-flop field $H_{flop}$ of Samples 23 suggests that the use of non-metal material having improved thermal stability (such as oxide, nitride or carbide of non-magnetic material having a low formation energy) for the magnetic couplers effectively suppresses thermal diffusion, stabilizes the effective ferromagnetic coupling energy $J_C'$, and thereby improves the thermal stability of the magnetic characteristics of the free magnetic layer.

Furthermore, the following samples are prepared so as to investigate thermal diffusion of material of Ta layers of 0.35 nm into tunnel barrier layers.

Sample 24 (Comparative Example):

Substrate/Ni$_{81}$Fe$_{19}$(2.0 nm)/Ru(2.1 nm)/Ni$_{81}$Fe$_{19}$(2.0 nm)/Ta(0.35 nm)/Ni$_{81}$Fe$_{19}$ (3.5 nm)/Al(1 nm)O$_x$ Sample 25 (Embodiment):

Substrate/Ni$_{81}$Fe$_{19}$(2.0 nm)/Ru(2.1 nm)/Ni$_{81}$Fe$_{19}$(2.0 nm)/Ta(0.35 mm)/Ni$_{81}$Fe$_{19}$(1.5 nm)/Al(0.5 nm)O$_x$/Ni$_{81}$Fe$_{19}$(2.0 nm)/Al(1 nm)O$_x$ Sample 25 is structured so that the tunnel barrier (the Al(1 nm)O$_x$ film), the first ferromagnetic layer (the Ni$_{81}$Fe$_{19}$(3.5 nm) film), the first magnetic coupler (the Al(0.5 nm) O$_x$), the second ferromagnetic layer (the Ni$_{81}$Fe$_{19}$ (2.0 nm)/Ta (0.35 mm)/Ni$_{81}$Fe$_{19}$ (1.5 nm) film stack), the AF coupling non-magnetic layer (the Ru (2.1 nm) film) and the third ferromagnetic layer (the Ni$_{81}$Fe$_{19}$ (2.0 nm)) are selectively extracted from Sample 23, and are laminated in the reverse order. Sample 24 is structured so that only the first magnetic coupler (the Al(0.5 nm)O$_x$ film) is removed from Sample 25. Sample 24 and 25 are subjected to a heat treatment at 380° C. for 1 hour, and element concentrations on the top surfaces of Samples 24 and 25 are analyzed by XPS (X-ray Photoelectron spectroscopy).

As the result of the XPS analysis, Ta atoms are clearly detected on the top surface of Sample 24. On the contrary, Ta atoms are not detected at all on the top surface of the sample 25. This result has clearly proved that the magnetic coupler formed of the Al(0.5 nm)O$_x$ film effectively avoids the diffusion of the tantalum into the tunnel barrier in Sample 25. This suggests that the magnetic coupler composed of the Al(0.5 nm)O$_x$ functions as a diffusion barrier layer when the free magnetic layer structure of Sample 23 is used in the MTJ elements, and effectively avoids the diffusion of tantalum into the tunnel barrier layer, suppressing the heat deterioration of the magnetoresistance ratio.

It is apparent that the present invention is not limited to the above-described embodiments, which may be modified and changed without departing from the scope of the invention.

What is claimed is:

1. A magnetic film stack comprising:
a first synthetic antiferromagnet including a plurality of ferromagnetic layers, adjacent two of which are antiferromagnetically coupled through a non-magnetic layer; and
a first reversal inducing layer exhibiting ferromagnetism;
a magnetic coupler formed between said first synthetic antiferromagnet and said first reversal inducing layer,
wherein said first reversal inducing layer is ferromagnetically coupled to said first synthetic antiferromagnet and a coercive field of said first reversal inducing layer is smaller than any of magnetic fields at which antiferromagnetic couplings of magnetizations within said first synthetic antiferromagnet start to be decoupled, and
wherein said magnetic coupler consists of non-magnetic material and provides ferromagnetic coupling between said first reversal inducing layer and said first synthetic antiferromagnet.

2. The magnetic film stack according to claim 1, wherein said magnetic coupler is made of alloy or compound of two or more non-magnetic elements.

3. The magnetic film stack according to claim 1, wherein said magnetic coupler is composed of a stack of two or more films made of different non-magnetic elements.

4. The magnetic film stack according to claim 1, wherein said magnetic coupler has a thickness thinner than that of said non-magnetic layer(s) within said first synthetic antiferromagnet.

5. The magnetic film stack according to claim 1, wherein said magnetic coupler consists of at least one material selected from the group consisting of tantalum, ruthenium, manganese, barium, lithium, calcium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium.

6. The magnetic film stack according to claim 1, wherein said magnetic coupler consists of oxide, nitride, or carbide of at least one material selected from the group consisting of tantalum, ruthenium, manganese, barium, lithium, calcium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium.

7. The magnetic film stack according to claim 1, wherein an average thickness of said magnetic coupler ranges from 0.4 to 1.5 nm.

8. The magnetic film stack according to claim 1, wherein said magnetic coupler includes oxide of an element having an oxide formation energy smaller than a magnetic element included in a ferromagnetic layer contacted thereon.

9. The magnetic film stack according to claim 8, wherein said magnetic coupler consists of oxide of at least one material selected from the group consisting of magnesium, aluminum, silicon, germanium, lithium, beryllium, barium, calcium, titanium, vanadium, chromium, manganese, zirconium, hafnium, tantalum, niobium, molybdenum, cerium, yttrium, and lanthanum.

10. The magnetic film stack according to claim 8, further comprising an intermediate non-magnetic layer between said free and fixed magnetic layers,
wherein said first reversal inducing layer is positioned between said intermediate non-magnetic layer and said magnetic coupler,
wherein said magnetic coupler is in direct contact with one of said plurality of ferromagnetic layers within said first synthetic antiferromagnet, and
wherein said one of said plurality of ferromagnetic layers include a non-magnetic element including layer containing non-magnetic element.

11. The magnetic film stack according to claim 10, wherein said non-magnetic element including layer causes an effect of controlling antiferromagnetic coupling within said first synthetic antiferromagnet.

12. The magnetic film stack according to claim 1, wherein said magnetic coupler includes nitride of an element having a nitride formation energy smaller than a magnetic element included in a ferromagnetic layer contacted thereon, or carbide of element having a carbide formation energy smaller than a magnetic element included in a ferromagnetic layer contacted thereon.

13. The magnetic film stack according to claim 1, wherein said magnetic coupler is provided with a pinhole that allows said first reversal inducing layer to be in direct contact with said first synthetic antiferromagnet.

14. The magnetic film stack according to claim 13, wherein said magnetic coupler has an average thickness of 0.4 to 1.0 nm.

15. The magnetic film stack according to claim 1, wherein said magnetic coupler consists of material selected from the group consisting of ruthenium, chromium, rhenium, iridium, rhodium, silver, copper, yttrium, and
    wherein said magnetic coupler has such a thickness that said first reversal inducing layer is ferromagnetically coupled with said first synthetic antiferromagnet.

16. The magnetic film stack according to claim 1, wherein said magnetic coupler consists of ruthenium, having an average thickness of 1.1 to 1.7 nm, or 2.3 to 2.9 nm.

17. A magnetoresistive element comprising:
    a free magnetic layer; and
    a fixed magnetic layer having a fixed magnetization,
    wherein said free magnetic layer includes:
        a first synthetic antiferromagnet comprising a plurality of ferromagnetic layers, adjacent two of which are antiferromagnetically coupled through a non-magnetic layer; and
        a first reversal inducing layer exhibiting ferromagnetism,
    wherein said first reversal inducing layer is ferromagnetically coupled to said first synthetic antiferromagnet,
    wherein said free magnetic layer further includes a magnetic coupler consisting of non-magnetic material and formed between said first synthetic antiferromagnet and said first reversal inducing layer, said magnetic coupler providing ferromagnetic coupling between said first reversal inducing layer and said first synthetic antiferromagnet, and
    a coercive field of said first reversal inducing layer is smaller than any of magnetic fields at which antiferromagnetic couplings of magnetizations within said first synthetic antiferromagnet start to be decoupled.

18. The magnetoresistive element according to claim 17, wherein said free magnetic layer further includes a second reversal inducing layer exhibiting ferromagnetism,
    wherein said first reversal inducing layer is ferromagnetically coupled to one of said plurality of ferromagnetic layers, and
    wherein said second reversal inducing layer is ferromagnetically coupled to another of said plurality of ferromagnetic layers.

19. The magnetoresistive element according to claim 18, wherein said free magnetic layer further includes another magnetic coupler consisting of non-magnetic material and providing ferromagnetic coupling between said second reversal inducing layer and said first synthetic antiferromagnet.

20. The magnetoresistive element according to claim 18, wherein magnetizations of said first and second reversal inducing layers are antiparallel.

21. The magnetoresistive element according to claim 17, wherein said free magnetic layer further includes a second synthetic antiferromagnet comprising a plurality of ferromagnetic layers, adjacent two of which are antiferromagnetically coupled through a non-magnetic layer; and
    wherein said first reversal inducing layer is ferromagnetically coupled with both of said first and second synthetic antiferromagnets.

22. The magnetoresistive element according to claim 21, wherein said free magnetic layer further includes a second reversal inducing layer, and
    wherein said second reversal inducing layer is ferromagnetically coupled with one of said first and second synthetic antiferromagnets.

23. A magnetic random access memory comprising a memory cell including:
    a free magnetic layer; and
    a fixed magnetic layer having a fixed magnetization,
    wherein said free magnetic layer comprises:
        a first synthetic antiferromagnet comprising a plurality of ferromagnetic layers, adjacent two of which are antiferromagnetically coupled through a non-magnetic layer; and
        a first reversal inducing layer exhibiting ferromagnetism, and
    wherein said first reversal inducing layer is ferromagnetically coupled to said first synthetic antiferromagnet,
    wherein said free magnetic layer further includes a magnetic coupler consisting of non-magnetic material and formed between said first synthetic antiferromagnet and said first reversal inducing layer, said magnetic coupler providing ferromagnetic coupling between said first reversal inducing layer and said first synthetic antiferromagnet, and
    wherein a coercive field of said first reversal inducing layer is smaller than any of magnetic fields at which antiferromagnetic couplings of magnetizations within said first synthetic antiferromagnet start to be decoupled.

24. A magnetic random access memory comprising:
    a word line;
    a bit line perpendicular to said word line;
    a memory cell including a magnetoresistive element positioned at an intersection of said word and bit lines, said magnetoresistive element comprising:
    a free magnetic layer; and
    a fixed magnetic layer having a fixed magnetization,
    wherein said free magnetic layer includes:
        a first synthetic antiferromagnet comprising a plurality of ferromagnetic layers, adjacent two of which are antiferromagnetically coupled through a non-magnetic layer; and
        a first reversal inducing layer exhibiting ferromagnetism,
    wherein said first reversal inducing layer is ferromagnetically coupled to said first synthetic antiferromagnet,
    wherein a net magnetization of said free magnetic layer is equal to or smaller than 10% of a sum of magnetizations of said plurality of ferromagnetic layers within said first synthetic antiferromagnet and a magnetization of said first reversal inducing layer,
    wherein an easy axis of said free magnetic layer within said magnetoresistive element is oriented at an angle of 45 degrees to said word and bit lines,
    wherein said free magnetic layer further includes a magnetic coupler consisting of non-magnetic material and formed between said first synthetic antiferromagnet and said first reversal inducing layer, said magnetic coupler providing ferromagnetic coupling between said first reversal inducing layer and said first synthetic antiferromagnet, and
    wherein a coercive field of said first reversal inducing layer is smaller than any of magnetic fields at which antiferromagnetic couplings of magnetizations within said first synthetic antiferromagnet start to be decoupled.

25. A magnetic device comprising:
    a magnetoresistive element, and
    a magnetic film stack including:
        a synthetic antiferromagnet comprising a plurality of ferromagnetic layers, adjacent two of which are antiferromagnetically coupled through a non-magnetic layer; and a first reversal inducing layer exhibiting ferromagnetism, and wherein said first reversal inducing layer is ferromagnetically coupled to said synthetic antiferromagnet, wherein said magnetic film stack further includes a magnetic coupler consisting of non-magnetic material and formed between said first synthetic antiferromagnet and said first reversal inducing layer, said magnetic coupler providing ferromagnetic coupling between said first reversal inducing layer and said synthetic antiferromagnet, and wherein a coercive field of said first reversal inducing layer is smaller than any of magnetic fields at which antiferromagnetic couplings of magnetizations within said first synthetic antiferromagnet start to be decoupled.

26. The magnetic device according to claim 25, wherein said magnetic film stack further includes a second reversal inducing layer exhibiting ferromagnetism, wherein said first reversal inducing layer is ferromagnetically coupled to one of said plurality of ferromagnetic layers, and wherein said second reversal inducing layer is ferromagnetically coupled to another of said plurality of ferromagnetic layers.

27. The magnetic device according to claim 26, wherein said magnetic film stack further includes another magnetic coupler consisting of a non-magnetic material and providing ferromagnetic coupling between said second reversal inducing layer and said first synthetic antiferromagnet.

28. The magnetic device according to claim 26, wherein magnetizations of said first and second reversal inducing layers are antiparallel.

29. The magnetic device according to claim 25, wherein a magnetic field at which ferromagnetic coupling between said first reversal inducing layer and said synthetic antiferromagnet starts to be decoupled is larger than a saturation field at which magnetizations of said plurality of ferromagnetic layers within said synthetic antiferromagnet are oriented in parallel.

30. The magnetic device according to claim 25, wherein said magnetic coupler has a thickness thinner than that of said non-magnetic layer(s) within said synthetic antiferromagnet.

31. The magnetic device according to claim 25, wherein said magnetic coupler consists of at least one material selected from the group consisting of tantalum, ruthenium, manganese, barium, lithium, calcium, niobium, vanadium, osmium, rhodium, iridium, titanium, zirconium, hafnium, copper, silver, gold, platinum, chromium, molybdenum, tungsten, aluminum, magnesium, silicon, yttrium, cerium, palladium, and rhenium.

32. The magnetic device according to claim 25, wherein an average thickness of said magnetic coupler ranges from 0.4 to 1.5 nm.

* * * * *